(12) United States Patent
Hubbard et al.

(10) Patent No.: US 6,269,316 B1
(45) Date of Patent: Jul. 31, 2001

(54) SYSTEM AND METHOD FOR DETECTING FLICKER IN AN ELECTRICAL ENERGY SUPPLY

(75) Inventors: Vick A. Hubbard, Wake Forest; Mark L. Munday, Raleigh; Rodney C. Hemminger, Raleigh; Scott T. Holdsclaw, Raleigh, all of NC (US)

(73) Assignee: ABB Power T&D Company Inc., Raleigh, NC (US)

( * ) Notice: Subject to any disclaimer, the term of this patent is extended or adjusted under 35 U.S.C. 154(b) by 0 days.

(21) Appl. No.: 09/201,294

(22) Filed: Nov. 30, 1998

Related U.S. Application Data

(63) Continuation-in-part of application No. PCT/US97/18457, filed on Oct. 16, 1997.
(60) Provisional application No. 60/028,986, filed on Oct. 22, 1996.

(51) Int. Cl.⁷ .......................... G06F 19/00; G01R 21/00; G01R 25/00
(52) U.S. Cl. ............................................... 702/61; 702/65
(58) Field of Search ................................ 702/61, 65

(56) References Cited

U.S. PATENT DOCUMENTS

| | | | |
|---|---|---|---|
| 4,200,933 | 4/1980 | Nickel et al. | 364/571 |
| 4,301,508 | 11/1981 | Anderson et al. | 364/483 |
| 4,884,021 | 11/1989 | Hammond et al. | 324/142 |
| 4,977,515 | 12/1990 | Rudden et al. | 364/492 |
| 4,979,122 | 12/1990 | Davis et al. | 364/483 |
| 5,059,896 | 10/1991 | Germer et al. | 324/142 |
| 5,302,890 | 4/1994 | McEachern et al. | 324/142 |
| 5,315,235 | 5/1994 | Atherton et al. | 324/116 |
| 5,469,049 | 11/1995 | Briese et al. | 324/76.77 |
| 5,471,137 | 11/1995 | Briese et al. | 325/158.1 |
| 5,548,527 | 8/1996 | Hemminger et al. | 364/492 |
| 5,555,508 | 9/1996 | Munday et al. | 364/492 |
| 5,631,554 | 5/1997 | Briese et al. | 324/76.77 |
| 6,094,622 * | 7/2000 | Hubbard et al. | 702/61 |
| 6,112,158 * | 8/2000 | Bond et al. | 702/62 |

* cited by examiner

Primary Examiner—John S. Hilten
Assistant Examiner—Mylinh T. Tran
(74) Attorney, Agent, or Firm—Woodcock Washburn Kurtz Mackiewicz & Norris

(57) ABSTRACT

A system and method for detecting a flicker of electrical energy provided via a service type to an energy meter. The system comprises a memory for storing a respective voltage threshold for each different service type; a digital signal processor for measuring a respective phase voltage for each meter element of the energy meter; and a microcontroller for retrieving the voltage threshold for the service type from the memory and comparing the measured phase voltage to the voltage threshold to determine an occurrence of flicker.

34 Claims, 33 Drawing Sheets

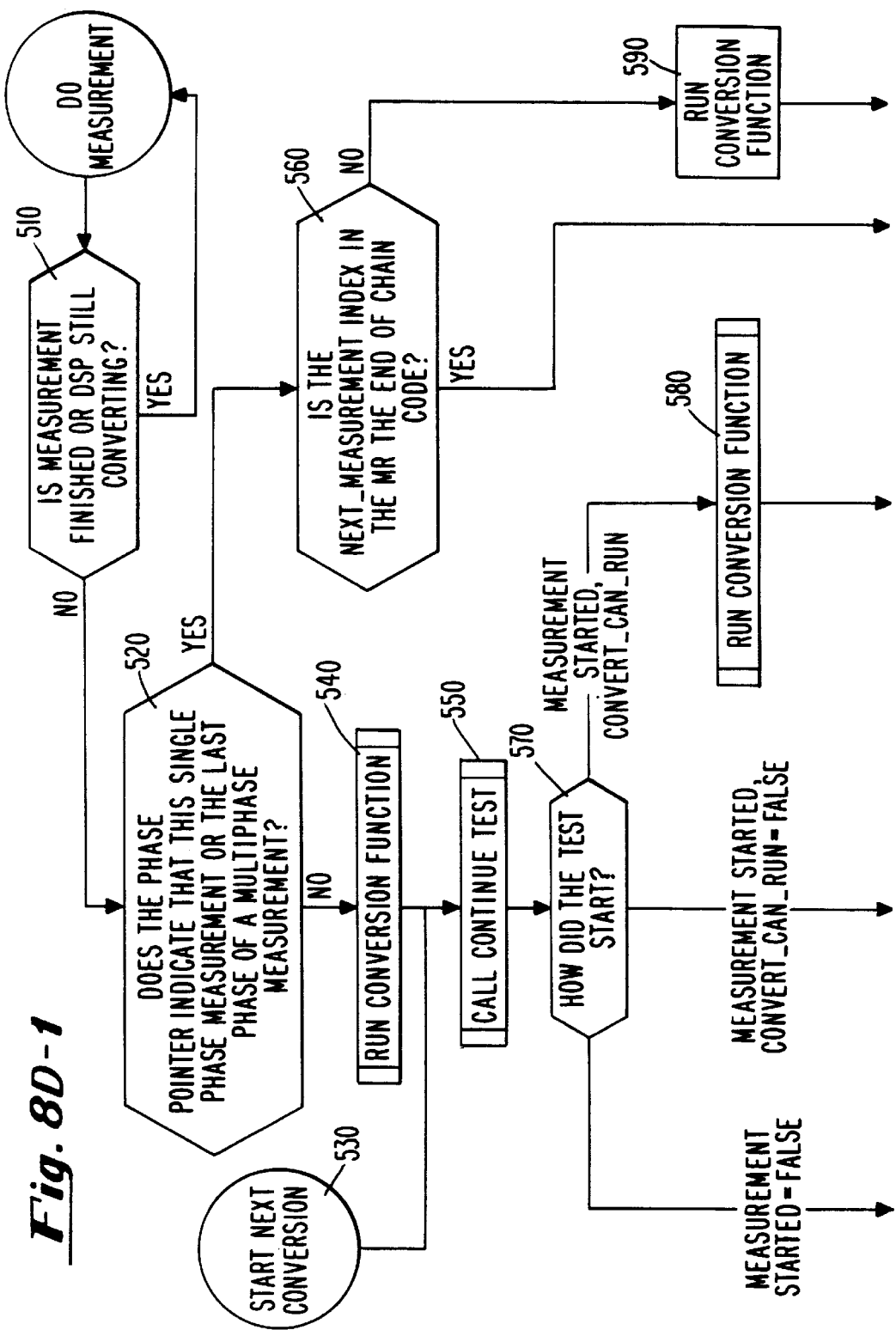

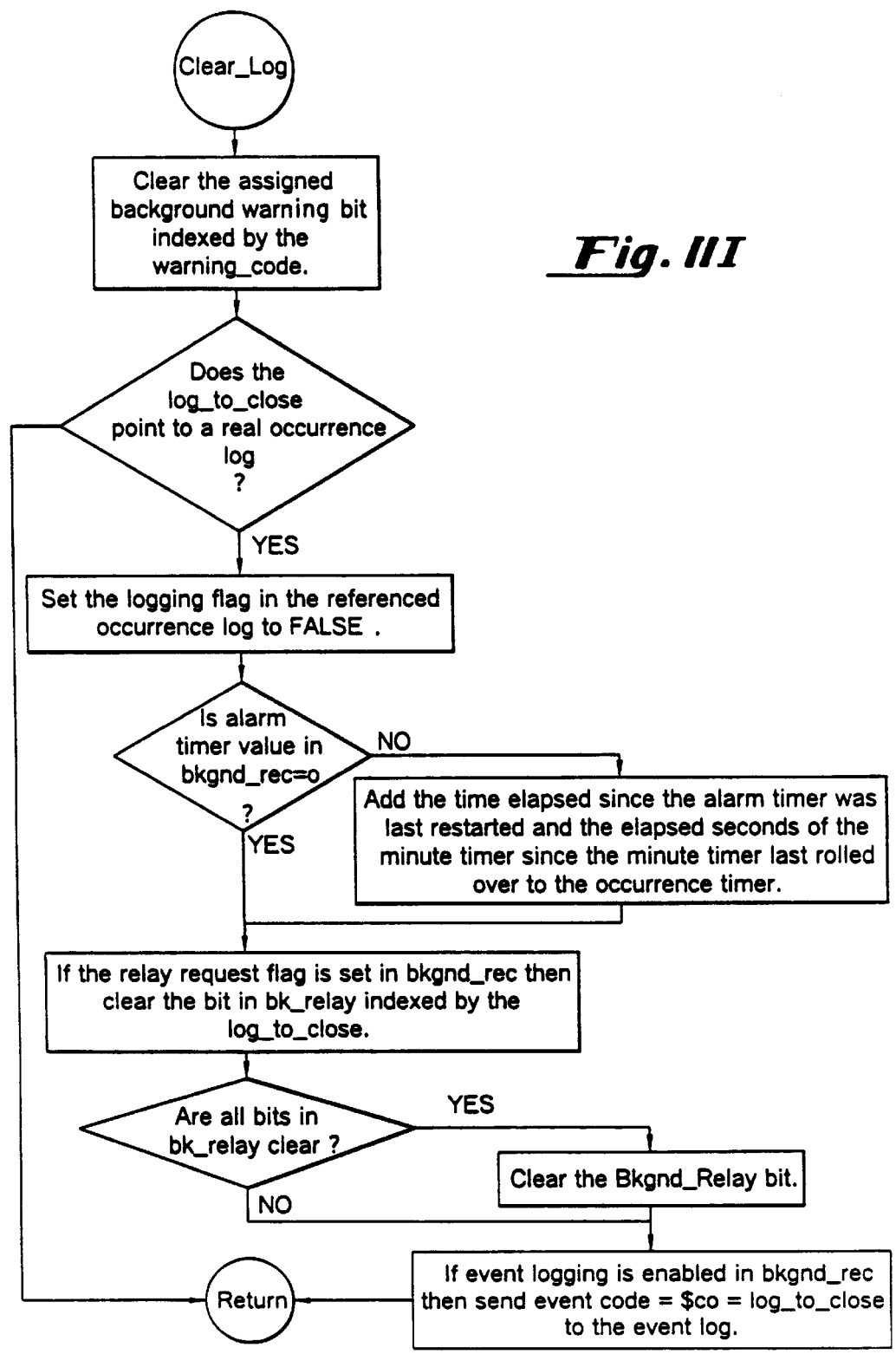
Fig. III

SYSTEM AND METHOD FOR DETECTING FLICKER IN AN ELECTRICAL ENERGY SUPPLY

RELATED APPLICATION DATA

The present application claims priority from and is a C-I-P of PCT application No. PCT/US97/18457, having an international filing date of Oct. 16, 1997, which claims priority from provisional application Ser. No. 60/028,986, filed on Oct. 22, 1996.

FIELD OF THE INVENTION

The present invention relates generally to electronic energy meters, and more particularly to highly functional programmable electronic energy meters with systems for service identification and power quality analysis.

BACKGROUND

Programmable electronic energy meters are rapidly replacing electro-mechanical meters due to the enhanced functionality achieved using programmable logic integrated into solid-state electronic meters. Some of these meters can be used to meter various different electrical services without hardware modification. For example, meters having a voltage operating range between 98 Vrms to 526 Vrms are capable of operation with either 120 V or 480 V services. U.S. Pat. No. 5,457,621, dated Oct. 10, 1995, entitled SWITCHING POWER SUPPLY HAVING VOLTAGE BLOCKING CLAMP, assigned to ABB Power T&D Company discloses examples of such meters. In addition, some meters are constructed for use with any 3-wire or any 4-wire service, also disclosed in U.S. Pat. No. 5,457,621. Unless meters having this versatility are used, utilities must be careful to install the correct meter in relation to both configuration and electrical service supplied at the installation site. Unfortunately, meter installers are not always trained to detect or note service particularities which might indicate that the meter to be installed is not configured properly for a particular installation.

For this reason, some utilities configure the meters themselves to ensure better control over which meters are installed at which installation sites. However, such configuration activity adds to the installation cost and does not always reduce the risk that a meter configured for one service might inadvertently be installed at a site supplied by a different service. Therefore, there remains a need for an electronic meter which automatically detects the service type and voltage to which the meter is installed and which either automatically configures its own programming to the detected service or provides a simple means for manual configuration at the installation site.

Further, the performance of power quality tests requires that the type of service and service voltage be known prior to installation so that the meter's programming can be locked to the appropriate service-dependent thresholds utilized in connection with particularized power quality tests. Therefore, for this additional reason, there remains a need for an electronic meter to automatically detect the service type and voltage to which the meter is installed and which automatically configures its programming to the detected service.

In addition, many new electronic energy meters have begun to take advantage of their programming capabilities by providing limited diagnostic and/or power quality testing. These capabilities are provided by programming stored in read only memory (ROM). Thus, these meters are currently limited in operation to predefined programming, such as predefined sets of tests. Significantly, such meters are also limited to the measurement of only a predetermined set of parameters that have been programmed into such meters, i.e., stored in ROM, during manufacture. Consequently, any change to the measurements or tests supported by the meter must be carried out by replacing the meter's ROM, i.e., by factory modification. Therefore, there also exists a need for a more flexible electronic energy meter that permits the addition of new measurements or testing capabilities without requiring factory modifications to effect such functionality changes.

SUMMARY OF THE INVENTION

The present invention is directed to a system for detecting a flicker of electrical energy provided via a service type to an energy meter having meter elements. The system comprises storage means for storing a respective voltage threshold for each of a plurality of different service types; means for measuring a respective phase voltage for each of the meter elements; and means for retrieving the voltage threshold for the service type from the storage means and comparing the measured phase voltage to the voltage threshold to determine an occurrence of the flicker.

According to one aspect of the present invention, the system firther comprises memory means for recording a duration of the flicker.

In accordance with further aspects of the present invention, the storage means and the memory means comprise at least one EEPROM, the means for measuring comprises a digital signal processor (DSP), and the means for retrieving and comparing comprises a microcontroller.

In accordance with a further aspect of the present invention, an indicator and means for activating the indicator responsive to the occurrence of the flicker are provided. A display means is alternatively provided for indicating the occurrence of the flicker.

In accordance with a further aspect of the present invention, the storage means is programmable to change the voltage thresholds. Each voltage threshold is responsive to the service type which provides electrical energy to the energy meter. The service type is single phase or multiphase, and the flicker is checked for each phase when the service type is multiphase. Moreover, each phase of the multiphase service type has a respective voltage threshold.

In accordance with a further aspect of the present invention, a counter is provided for counting a number of consecutive clock cycle occurrences of the flicker. When the number of consecutive clock cycle occurrences is greater than a first predetermined number and less than a second predetermined number, it is determined that the flicker has occurred, and when the number is one of not greater than the first predetermined number and not less than the second predetermined number, it is determined that the flicker has not occurred. Moreover, a glitch counter is provided that is incremented when it is determined that the flicker has occurred.

In accordance with a further aspect of the present invention, a flicker event log is provided for storing flicker information about the flicker, such as the phase, time, and date that the detected flicker has occurred.

In a further embodiment within the scope of the present invention, an electronic processor-implemented process is provided for detecting a flicker in electrical energy provided via a service type to an energy meter having meter elements.

The process comprises the steps of storing in a memory a respective voltage threshold for each of a plurality of different service types; measuring a respective phase voltage for each of the meter elements; retrieving the voltage threshold for the service type from the memory; and comparing the measured phase voltage to the voltage threshold to determine an occurrence of the flicker. In accordance with one aspect of the invention, the process further comprises the step of recording in a second memory a duration for the flicker.

According to further aspects of the invention, an alarm is activated responsive to the occurrence of the flicker and/or an indication is displayed indicating the occurrence of the flicker. Moreover, the number of consecutive clock cycle occurrences of the flicker is counted.

BRIEF DESCRIPTION OF THE DRAWINGS

The present invention will be better understood, and its numerous objects and advantages will become apparent, by reference to the following detailed description of the invention when taken in conjunction with the following drawings, in which:

FIGS. 8A, 8B, 8C, 8D-1, 8D-2, and 8E are detailed functional flow diagrams showing the steps carried out by the measurement engine in accordance with a preferred embodiment of the invention;

FIGS. 11A, 11B-1, 11B-2, 11C, 11D, 11E, 11F, 11G, 11H and 11I are detailed functional flow diagrams showing the steps carried out by the power quality test engine in accordance with a preferred embodiment of the invention;

DETAILED DESCRIPTION OF THE INVENTION

A. Operational Overview

Figure 1:
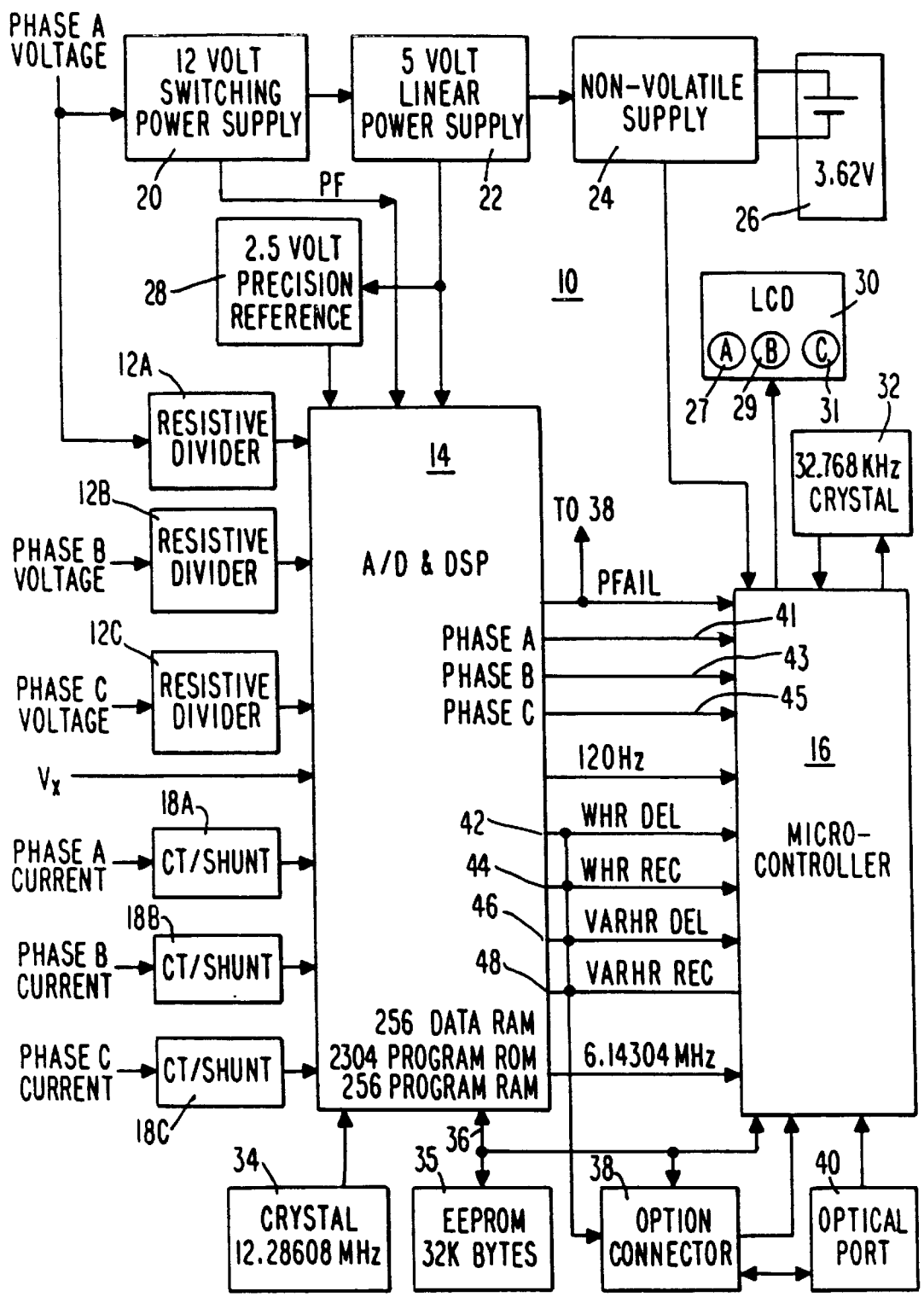
FIG. 1 is a block diagram showing the functional components of an exemplary meter and their interfaces in accordance with the present invention.

The present invention provides comprehensive power quality monitoring and diagnostic features in connection with metering single and poly-phase electrical energy. FIG. 1 is a block diagram showing the functional components of an exemplary meter and their interfaces in accordance with the present invention. As shown in FIG. 1, a meter for metering three-phase or single phase electrical energy preferably includes a digital LCD type display 30, a meter integrated circuit (IC) 14 which preferably comprises A/D converters and a programmable DSP, and a microcontroller 16.

Analog voltage and current signals propagating over power transmission lines between the power generator of the electrical service provider and the users of the electrical energy are sensed by voltage dividers 12A, 12B, 12C and current transformers or shunts 18A, 18B, 18C, respectively. The outputs of the resistive dividers 12A–12C and current transformers 18A–18C, or sensed voltage and current signals, are provided as inputs to meter IC 14. The A/D converters in the meter IC 14 convert the sensed voltage and current signals into digital representations of the analog voltage and current signals. In a preferred embodiment, the AID conversion is carried out as described in U.S. Pat. No. 5,544,089 dated Aug. 6, 1996, and entitled PROGRAMMABLE ELECTRICAL METER USING MULTIPLEXED ANALOG-TO-DIGITAL CONVERTERS, assigned to ABB Power T & D Company. The digital voltage and current signals are then input to the programmable DSP in the meter IC 14 for generating pulsed signals 42, 44, 46, 48 representing various power measurements, i.e., each pulse represents the Ke value associated with Watts, VAs, or VARS. These pulsed signals may be processed by the microcontroller 16 to perform revenue metering functions for billing purposes.

The exemplary microcontroller 16, in accordance with the present invention, performs numerous revenue metering functions, as well as instrumentation functions. Instrumentation functions, in contrast to revenue functions, are intended to assist a technician in evaluating a service based on near-instantaneous conditions at the meter. Instrumentation measurements may include system parameters such as frequency, Watts, VARs, and VAs, and per phase information such as voltage, current, phase angles, power factor, current to voltage angle, kWatts, kVARs, kVA, and harmonic distortion related parameters. Table 1 lists some examples of instrumentation parameters that may be computed by the present invention.

TABLE 1

| Parameter | Description |
|---|---|
| Frequency | Measured on A Phase voltage. |
| System kWatts | Signed sum of the kW measurement on each phase taken moments apart. |
| System kVARs (Arithmetic) | Root-mean square-difference of the System kVAs (Arithmetic) and System kWatts. |
| System kVARs (Vectorial) | Signed sum of the kVAR measurement on each phase taken moments apart. |
| System kVAs (Arithmetic) | Sum of the kVA measurements on each phase taken moments apart. |
| System kVAs (Vectorial) | Root-mean square-sum of the System kWatts and the System kVARs (Vectorial). |
| System Power Factor (Arithmetic) | System kWatts divided by the System kVAs (Arithmetic). |
| System Power Factor (Vectorial) | System kWatts divided by the System KVAs (Vectorial). |
| Phase Voltages and Amperes | Measurements are true RMS; each phase voltage and current is measured simultaneously. |
| Phase Voltage Angle related to Phase A Voltage | Each phase angle is measured relative to Phase A zero crossings, rounded to 30 degrees. |
| Phase Power Factor | Phase kWatts, divided by Phase kVAs (measured simultaneously). |
| Phase Current to Phase Voltage Angle | Inverse cosine of Phase Power Factor (prior to rounding), rounded to 0.1 degress. |
| Phase Current to Phase Voltage Angle Plus Voltage Angle Relative to Phase A Voltage | Phase Current to Phase Voltage Angle, plus the nominal Phase Voltage Angle relative to Phase A voltage for the service. |
| Phase kWatts, kVAs | Each phase kWatts and kVAs is measured simultaneously. |
| Phase kVARs | Root-mean square-difference of the Phase kVAs and Phase kWatts. |
| Total Harmonic Distortion (THD) Indication | Square root of the sum of the squares of the second through fifteenth fundamental values of the Phase Voltage or Phase Current, divided by the phase quantity's fundamental magnitude. |
| 2nd Harmonic Voltage Distortion Indication | The phase quantity's 2nd Harmonic Voltage Magnitude, divided by the phase quantity's fundamental magnitude. |
| General Nth Voltage Harmonic Magnitude | Measurements are true RMS. |
| General Nth Harmonic Magnitude | Measurements are true RMS. |

The meter IC 14 and the microcontroller 16 each preferably interface with one or more memory devices through an IIC bus 36. An EEPROM 35 is provided to store revenue data as well as programs and program data. Upon power up after installation, a power failure, or a data altering communication, for example, selected programs and program data stored in the EEPROM 35 may be downloaded to the program RAM and data RAM associated with the meter IC 14, as shown in FIG. 1. The DSP under the control of the microcontroller 16 processes the digital voltage and current signals in accordance with the downloaded programs and data stored in the respective program and data RAM.

To perform instrumentation functions, the microcontroller 16 may use voltage and current, real and apparent energy with lead/lag indication, frequency, and relative voltage or current phase angle information from the DSP. According to a preferred embodiment of the present invention, the meter IC 14 monitors the digital phase voltage signals and phase current signals over two line cycles (at about 50 or 60 Hz, two line cycle measurements are defined herein as RMS measurements even though they are "near-instantaneous") and then computes the RMS voltage and current values, real and apparent energies with lead/lag indication, average frequency, or relative voltage or current phase angle information. It should be understood that the number of line cycles is preferably programmable and a different number of line cycles, such as one line cycle for example, may be used for designated measurements. The RMS parameters are computed for a single phase at a time and stored in the data RAM in IC 14. The microcontroller 16 polls for data in these registers via the IIC bus 36 for requested instrumentation measurement. Because the instrumentation measurements are near-instantaneous, no values are stored other than the ones presently being requested.

The DSP in the meter IC 14 also drives potential indicators lines 41, 43, and 45. Microcontroller 16 echoes the line states to potential indicators 27, 29, and 31 which are preferably designated sections on the LCD 30. Potential indicators for each phase remain lit for as long as the corresponding phase potential is present.

Figure 2:
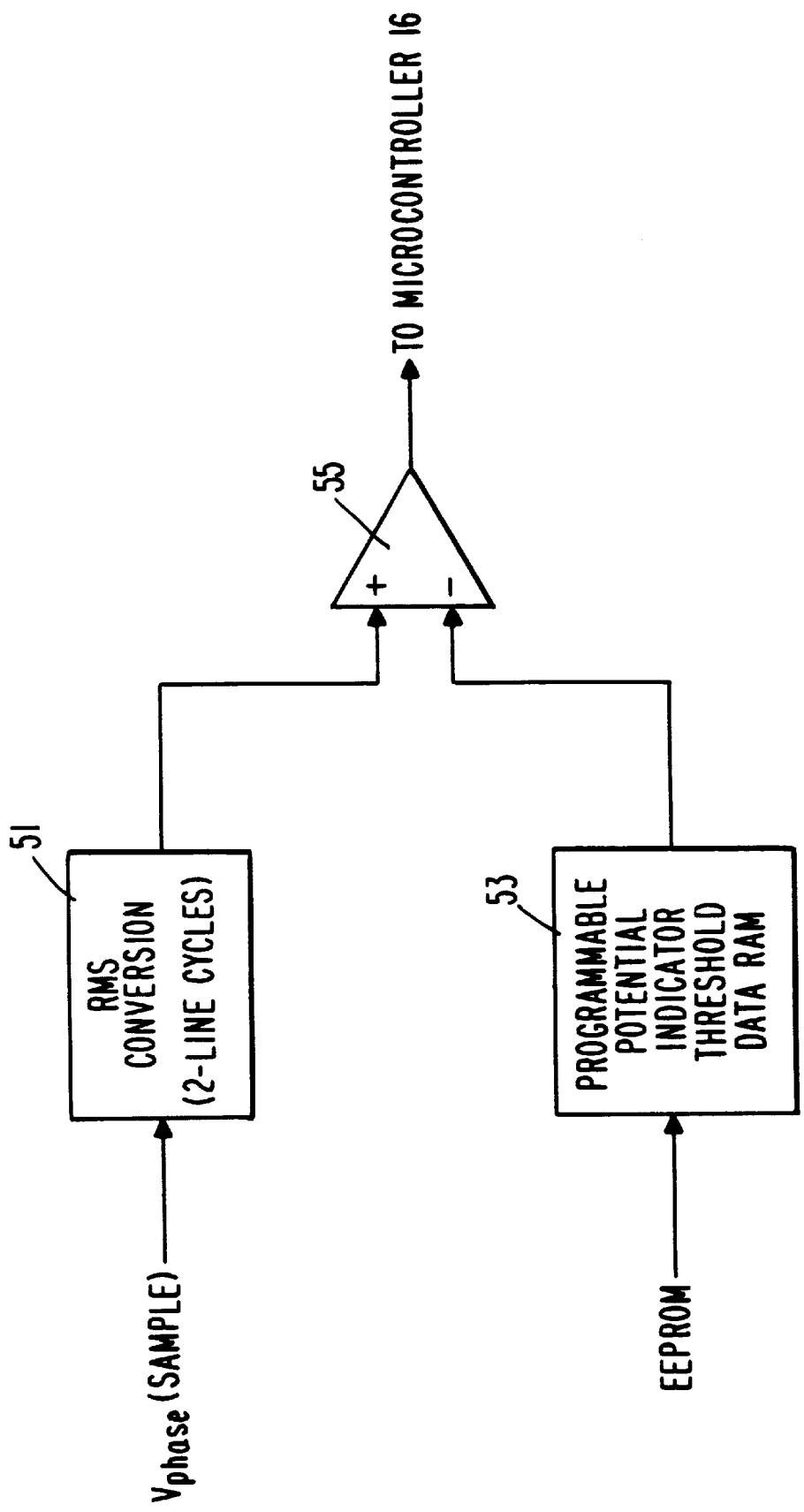
FIG. 2 is a functional block diagram showing the logic that may be employed by a digital signal processor (DSP) to drive the potential indicators in accordance with the present invention.

FIG. 2 shows a functional block diagram for exemplary logic that may be employed by the DSP in the IC 14 to drive the potential indicators 27, 29, and 31 in accordance with the present invention. While the logic for only one phase is shown, it should be understood that the logic is preferably replicated for each phase. As shown in FIG. 2, the digital samples for each phase voltage are provided to an RMS measurement generator 51. In a preferred embodiment, the RMS measurement generator computes the RMS measurements in accordance with the following formula:

$$Vrms = \sqrt{\frac{\sum_{i=1}^{i=N} V_i^2}{N}}$$

where N equals the number of samples per a selected number of line cycle intervals.

A programmable potential indicator threshold 53 is preferably downloaded from the EEPROM 35 to the data RAM in the IC 14. Although initial programmable thresholds are downloaded following power-up, it is also preferable that the potential indicator thresholds be updated following certain system tests which are described in detail below. A comparator 55 compares the RMS measurement from the RMS measurement generator 51 with the potential indicator threshold 53 and generates an output that is high whenever the RMS measurement exceeds the programmable potential indicator threshold. The output of the comparator 55 is provided to the microcontroller 16. Referring back to FIG. 1, phase A, B, and C potential signals are output from the meter IC 14 to the microcontroller 16, which in turn drives the potential indicators 27, 29, and 31 so that the potential indicator remains lit when the corresponding potential signals are high.

Display Modes

The present invention preferably utilizes three display modes for the LCD 30, namely, normal, alternate, and test modes. On power-up following installation, at a preset time, or following a data altering communication, programmably designated tests are preferably executed. Following the tests, in the normal display mode, in a preferred embodiment, the meter sequentially and continuously scrolls through display items selected for the normal display mode. The display items may include both revenue data and instrumentation parameters.

The alternate mode and test mode are manually initiated in a preferred embodiment. Different and/or additional display items may also preferably be selected for display in the alternate and test modes. The alternate mode preferably either scrolls through the selected parameters once or can be made to manually step through the displayed items. Items or parameters selected for display during test mode are continuously scrolled until the test mode is manually terminated.

Tests

The tests that are performed by the present invention may be categorized as operating error tests, system tests, power quality tests, and flicker tests.

The operating error tests are used to identify those conditions that may affect revenue data, such as power outage carryover errors, configuration errors, EEPROM errors, and the like. These errors are displayed when they are detected and are preferably locked on the display.

The system tests include a system service voltage test (hereinafter referred to as a "service test") and a system current test. Generally, the service test is used to verify that the voltage phase angles are within a predefined range for the particular service and that the phase voltages are within a predefined voltage range of the valid service nominal voltages. The system current tests may check for low current conditions, over current conditions, under current conditions, reverse power, and/or improper power factor conditions.

The power quality tests permit testing and evaluation for the following conditions: abnormal service voltage, abnormally high or low voltage, abnormally low or high current, abnormal leading or lagging power factor, and various harmonic distortions, as well as other abnormal conditions.

Flicker tests monitor the phase potentials signals for frequent temporary losses of phase potential.

The System Test: Service Test & System Current Test

Following power-up at installation, a service test is preferably performed to identify and/or check the electrical service. The present invention may be preprogrammed for use with a designated service or it may determine the service using a service test. When the service test is used to identify the electrical service, an initial determination is made of the number of active elements. To this end, each element (i.e. 1, 2 or 3 elements) is checked for voltage, for example, by monitoring the outputs of comparator 55 in FIG. 2 for each phase. Once the number of elements is identified, many of the service types can be eliminated from the list of possible service types. The voltage phase angle relative to phase A may then be calculated and compared to each phase angle for abc or cba rotations with respect to the remaining possible services, e.g., within ±15°. If a valid service is found from the phase angle comparisons, the service voltage is preferably determined by comparing the RMS voltage measurements for each phase with nominal phase voltages for the identified service. If the nominal service voltages for the identified service matches measured values within an acceptable tolerance range, a valid service is identified and the phase rotation, service voltage, and service type are preferably displayed. The service may be locked, i.e., the service information is stored in the EEPROM 35, manually or automatically.

When the service type is known in advance and locked, the service test preferably checks to ensure that each element is receiving phase potential and that the phase angles are within a predetermined percentage of the nominal phase angles for the known service. The per-phase voltages are also measured and compared to the nominal service voltages to determine whether they are within a predefined tolerance range of the nominal phase voltages. If the voltages and phase angles are within the specified ranges, the phase rotation, the service voltage, and service type are displayed on the meter display. If either a valid service is not found or the service test for a designated service fails, a system error code indicating an invalid service is displayed and locked on the display to ensure that the failure is noted and evaluated to correct the error.

The present invention may also be programmed so that immediately following the service test after installation, power-up, etc., the alternate mode is initiated. In order to avoid crowding the normal display, it is preferred that the instrumentation parameters and the system tests be included in the alternate display mode and not the normal display mode. It is also preferred that the service test and the system current test be specified as the first and second parameters of the alternate display, respectively. If the service test or system current test fail while in the alternate mode, a system error code indicating the error is displayed in the alternate scroll sequence. Examples of possible system error codes designated by an "SER XXXXXX" error message are shown in Table 2.

TABLE 2

|  | VVVIII ABCABC |
|---|---|
| Unknown Service Angles | SEr 555000 |
| Missing A Phase Current | SEr 000100 |
| Missing B Phase Current | SEr 000010 |
| Missing C Phase Current | SEr 000001 |
| Low A Phase Current | SEr 000200 |
| Low B Phase Current | SEr 000020 |
| Low C Phase Current | SEr 000002 |
| Inappropriate PF on A Phase | SEr 000400 |
| Inappropriate PF on B Phase | SEr 000040 |
| Inappropriate PF on C Phase | SEr 000004 |
| Reverse Power on A Phase | SEr 000500 |
| Reverse Power on B Phase | SEr 000050 |
| Reverse Power on C Phase | SEr 000005 |
| Excess Current on A Phase Current | SEr 000800 |
| Excess Current on B Phase Current | SEr 000080 |
| Excess Current on C Phase Current | SEr 000008 |

If multiple tested conditions fail, the associated system error codes may be added together so that a single error code is displayed in the appropriate sequence. In a preferred embodiment, the error codes are hexadecimal values so that an excess current condition "8" and an inappropriate power factor "4" would be reported as "C."

Any system test selected for the alternate mode display is preferably not carried out until the results are to be displayed. Therefore, the measurements made in connection with the system tests do not require storage in memory. Similarly, no instrumentation parameters selected for the alternate mode display are preferably calculated until they are to be displayed.

Power Quality Tests

Referring back to FIG. 1, the exemplary meter according to the present invention also provides for remote meter reading, remote power quality monitoring, and reprogramming through an optical port 40 and/or an option connector 38. Although optical communications may be used in connection with the optical port 40, the option connector 38 may be adapted for RF communications or electronic communications via modem, for example.

Revenue functions, communications, system tests, flicker testing, and instrumentation features preferably have priority in terms of processing over power quality tests. Therefore, the power quality tests are processed in the background. Although the designated power quality tests are run one-ata-time in a fixed selected sequence, they are only run when processing time is available, and accordingly, not at fixed intervals. However, it should be understood that certain power quality tests could be given higher priority such that those higher priority tests could be carried out at fixed intervals.

When an abnormal condition is detected by any of the designated power quality tests (which may include the service tests and/or system current tests), a predefined code indicative of an abnormal condition is preferably optionally injected as the first item in the normal scroll sequence. However, since the condition is not necessarily related to one specific error, it is considered a warning or a flag condition and display of the predefined code preferably does not affect the operation of the meter. Whether or not particular abnormal conditions drive a warning on the display may be selected through programmable options.

The warnings may be time and date stamped and logged in an event log and the number of events and cumulative time of the conditions may be separately logged in an occurrence log. The logs are preferably stored in the EEPROM 35 shown in FIG. 1. The information stored in these logs may be accessed through software for further diagnostic processing and evaluation external to the meter itself.

Figure 3:
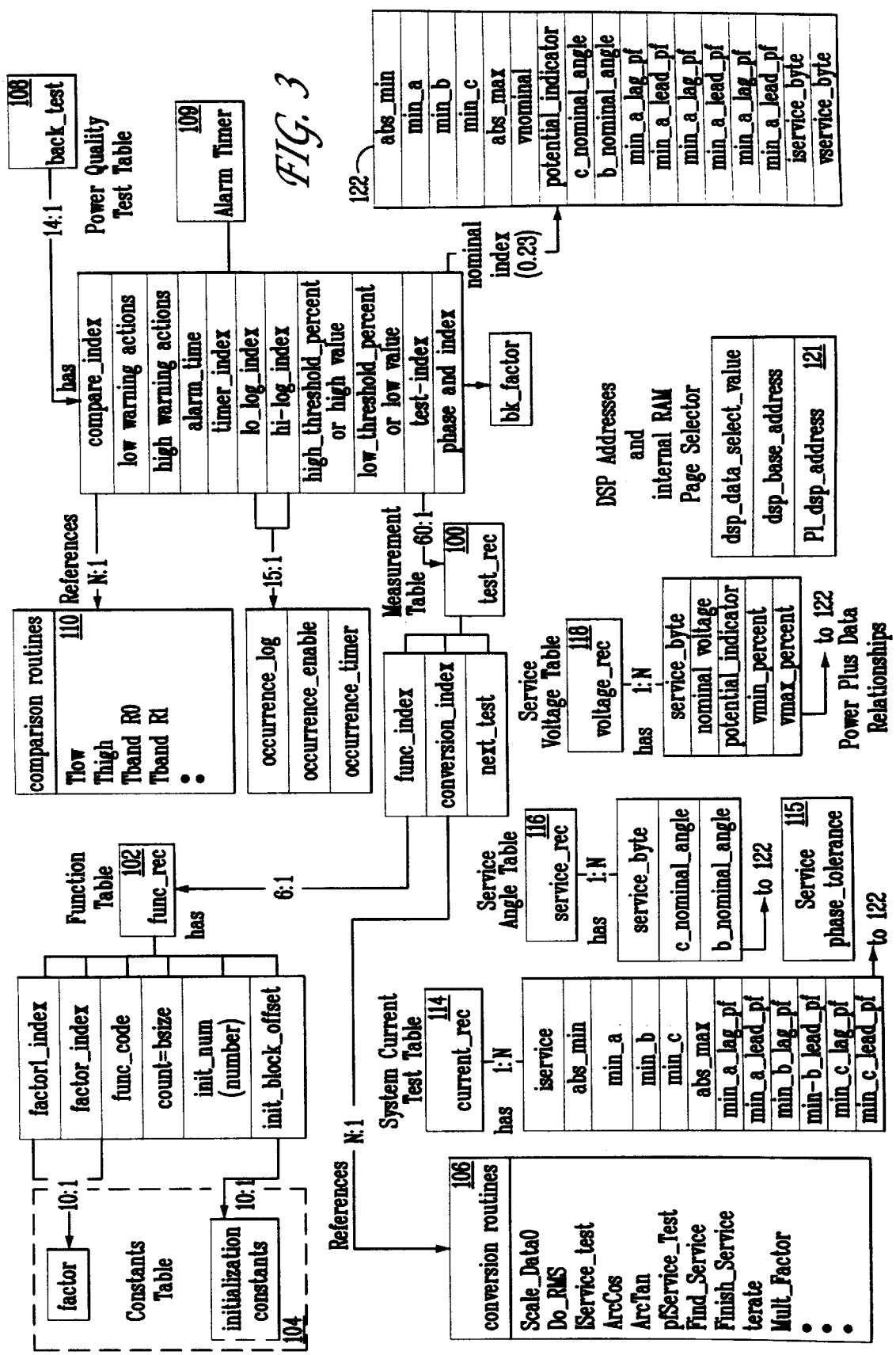
FIG. 3 is a diagram showing the functional grouping of data into tables and the meter relationship among the tables as implemented in a preferred embodiment of the invention.

The systems for performing system, power quality, and flicker tests according to the present invention are preferably implemented in firmware, wherein such operations are enabled by the correct programming of several data tables. The functional inter-relationships of these tables is shown in FIG. 3. System current tests are performed utilizing data stored in records in the system current test table 114 which generally includes system current thresholds for each service supported by the meter. Service tests are performed utilizing the data records stored in the service angle table 116 and the service voltage table 118. The records in the service angle table 116 may preferably include the nominal phase angle information for each service supported by the meter, whereas the records in the service voltage table 118 may preferably include the nominal voltage and tolerances for each service and a corresponding potential indicator threshold. A separate table, the phase tolerance table 115, is preferably used in connection with the service voltage test stored in EEPROM 35. Once the service is locked, the data corresponding to the service is transferred from tables 114, 116, and 118 to a thresholds table 122.

The power quality tests preferably form a predefined set of comparison tests. A record is stored in a power quality test table 108 for each comparison test to be carried out by the meter. The comparison tests and associated records are stored in a comparison test table 110. The power quality test table 108 also may include information referencing a measurement record for the measurement to be tested by the referenced comparison test. The power quality test table 108 additionally references threshold information for test comparisons from the thresholds table 122.

The measurement records are stored in a measurement table 100 which preferably includes information referencing a record in the measurement function table 102. The records in the measurement function table 102 identify a DSP function to be performed and may additionally reference a record in the constant table 104 which may include initialization and calibration constants used to carry out the functions. The records in the measurement table 100 may also reference a record in a conversion table 106 which specifies particular computations to be performed in connection with the specified DSP function to complete the measurement required for comparison by the power quality test.

The DSP program in conjunction with the DSP hardware implements the fundamental measurement capabilities of the meter. The preferred embodiment has provisions for different versions of DSP programs to provide the capability to perform additional fundamental measurements. In the preferred embodiment, a DSP address and internal RAM page selector 121 are provided to the power quality measurement engine to allow the engine to communicate with versions of DSP programs that may have different IIC addresses and/or internal RAM addresses.

Programming for the data tables shown in FIG. 3 can preferably be divided into four levels of activities: (1) Display and Test Selection; (2) Display and Test Parameter Adjustment; (3) Test Definition; and (4) Measurement Definition.

Display selection involves the insertion of predefined byte sequences into a display table to enable the meter to display predefined measurement quantities. Test selection involves the insertion of predefined byte sequences into the power quality test table 108 to enable the meter to perform predefined power quality tests.

Display parameter adjustment involves changing the number of line cycle pairs over which a given electrical measurement is performed as indicated by the selected function. Test parameter adjustment involves the modification of voltage, current, power factor, and time thresholds in the system current test table 114, the service phase table 116, the service voltage table 118, and the power quality test table 108 to effect the sensitivity of the various tests that can be performed.

Test definition involves the creation of new power quality tests by new combinations of test parameter threshold in tables 114, 116, and 108 with defined electrical measurements.

Measurement definition involves the creation of new electrical measurements by new combinations of DSP functions and computations.

New hardware capabilities are added via the measurement function table 102 and the constants table 104. Moreover, new computations can be added or defined via the conversion table 106 or by specifying a sequence of computations from the conversion table 106. New measurements can be added by either combining new DSP functions with computations, DSP functions with new computations, or new DSP functions with new computations, into new measurement records.

B. Instrumentation Measurement and Monitor Interaction

Figure 4:
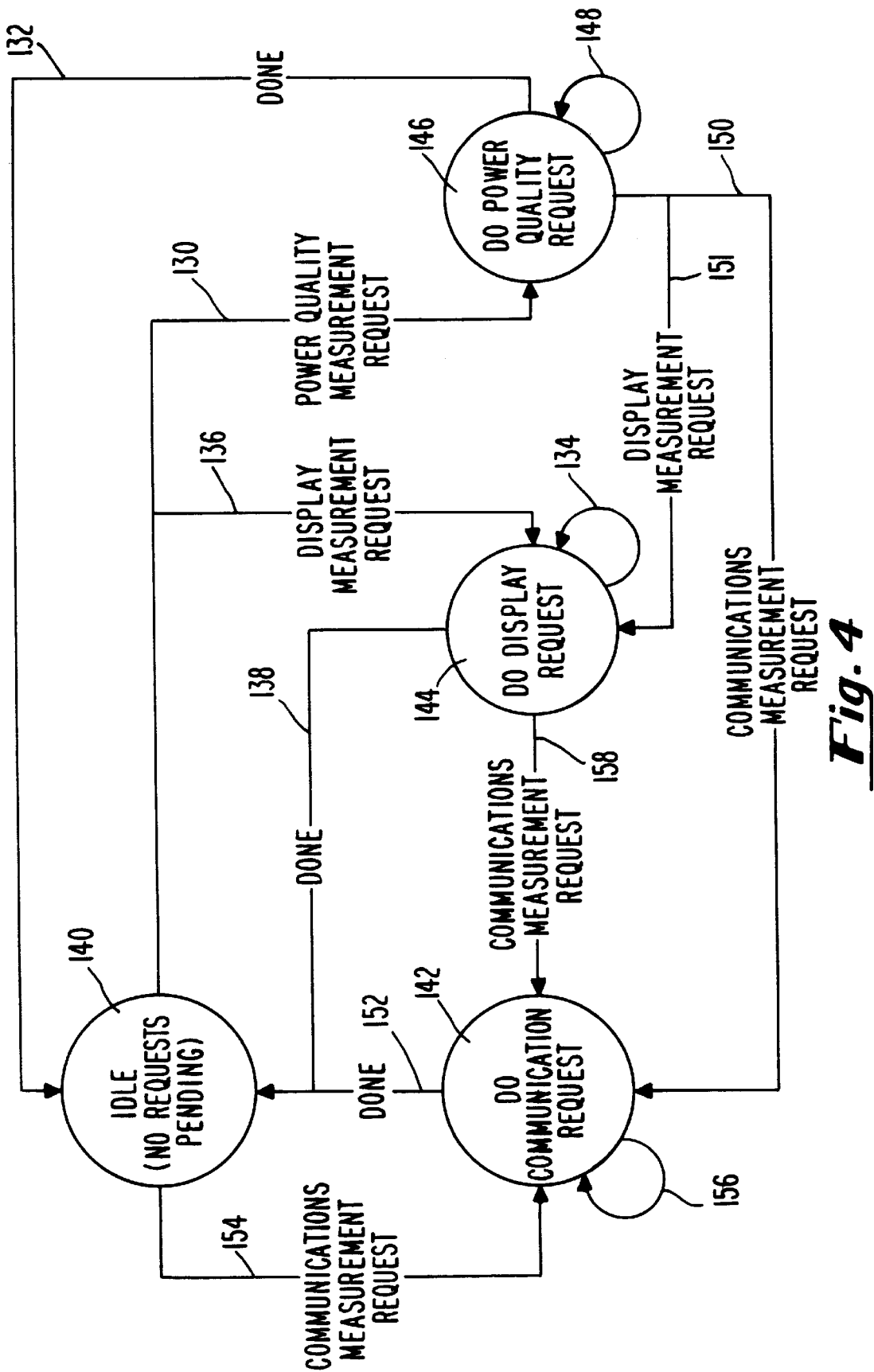
FIG. 4 is a state diagram showing the measurement states within a preferred embodiment of the invention.

FIG. 4 shows a state diagram of the measurement states within a preferred embodiment of the invention. The measurement routines are executed by a measurement engine which is described in detail below. The measurement engine remains in the idle state 140 until a request for measurement is received. Measurement requests may be initiated for the purpose of displaying an instrumentation parameter, performing a power quality test, or for transmitting a measured parameter via external communications.

A display measurement request 136 may be received when a quantity is required for display in one of the display modes supported by the meter. Upon receipt of a display measurement request 136, the measurement engine transitions to the display measurement processing state 144 and remains in that state 144 until the measurement is computed, stored in a register, and retrieved for display. In a preferred embodiment, the measurement engine remains in the display measurement processing state 144 until (1) the measurement is computed, stored in a register and retrieved for display, (2) until a higher priority measurement request is received, or (3) an error occurs as a result of processing the display request. After the measurement is completed, the display request processing state transitions at 138 back to the idle state 140.

As shown in FIG. 4, so long as background testing is enabled, a power quality measurement request 130 may be received. The power quality measurement request 130 designates which measured quantity is to be used in a current power quality test, e.g., phase B RMS voltage for comparison to a maximum acceptable voltage level for phase B, given the locked service. When received, the measurement engine transitions from the idle state 140 to the power quality measurement processing state 146 where the measurement designated by the power quality measurement request 130 is processed. The measurement is stored in a register which is accessed by a power quality test engine (described below in detail) so that the power quality test can be carried out utilizing the measured quantity. In a preferred embodiment, the power quality test engine acknowledges receipt of the measured quantity. The measurement engine remains in state 146 until the measurement is done. When the power quality measurement processing is complete, the measurement engine transitions at 132 to the idle state 140.

An external communication request 154 may be received via optical communications or electronically from an external source in which a particular measurement is requested for transmission to the external source. When a request 154 is received, the measurement engine transitions from the idle state 140 to the communication measurement processing state 142. The designated measurement is processed and stored in a register accessible by the communications routines of the meter. When the measurement is done, the measurement engine transitions at 152 back to the idle state 140.

In a preferred embodiment, meter communications has priority over both measurement display functions and power quality testing. Similarly, display measurement functions have priority over power quality testing. Thus, if the measurement engine is in the power quality measurement processing state 146 and a display measurement request 136 is received, the measurement engine transitions at 151 to the display measurement processing state 144. Any computations or measurement data generated before transitioning to the display measurement processing state 144 is preferably not saved, and therefore, the power quality measurement is reinitiated when the measurement engine returns to the idle state 140 after display measurement processing is complete.

In a similar manner, if a communication measurement request 154 is received while the measurement engine is in either the power quality measurement processing state 146 or the display measurement processing state 144, the measurement engine transitions at 150 and 158, respectively, to the communication measurement processing state 142. In a preferred embodiment, no data generated in either state 146 or state 144 is stored after transitioning to state 142. Consequently, a new power quality measurement request 130 or display measurement request 136 is initiated to invoke the interrupted measurement processing after the communication measurement processing is complete and the measurement engine returns to the idle state 140.

Figure 5:
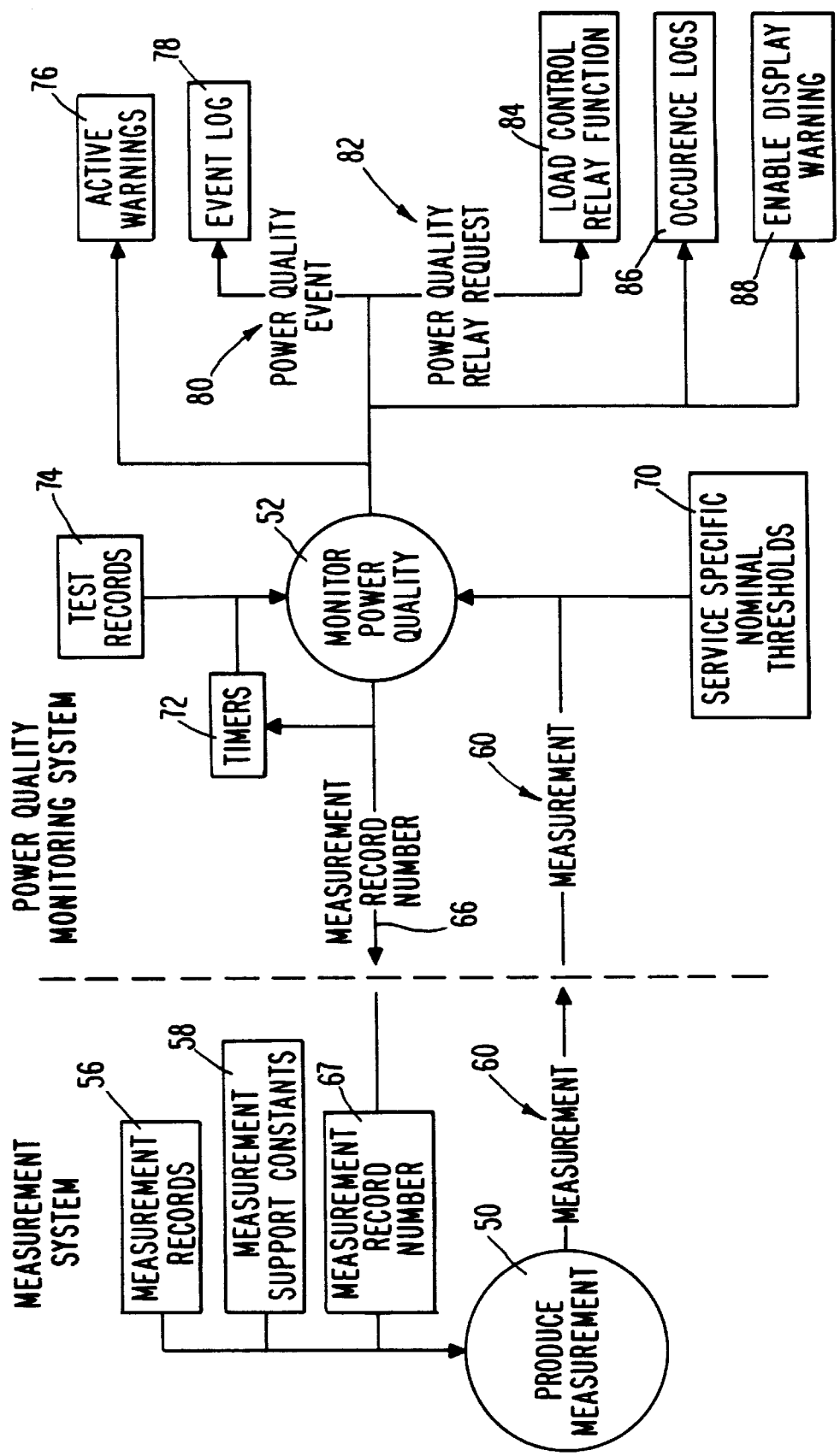
FIG. 5 is a functional diagram showing the system architecture for performing instrumentation measurements and power quality monitoring as is implemented in accordance with a preferred embodiment of the invention.

The system architecture for performiing instrumentation measurement and power quality monitoring is implemented in accordance with a preferred embodiment of the invention as shown in FIG. 5. The system architecture is functionally divided into two engines, the measurement engine 50 and the power quality engine 52.

Instrumentation measurements may be selected for display by programming (1) a measurement record number, (2) formatting information, and (3) phase to measure in a display table which defines the display sequence. An example of the information that might be included in a display table is set forth in Table 3.

TABLE 3

Electrical Measurements and Measurement Record (MR) Numbers

| MR # | Name |
|------|------|
| 1 | Frequency |
| 2 | Current * 10, Voltage * 10 |
| 3 | Total power factor angle (arithmetic) |
| 4 | KVA, KW |
| 5 | Current |
| 6 | Voltage |
| 7 | KVAR |
| 8 | PF Angle |
| 9 | KW |
| 10 | 2nd Harmonic Current Magnitude |
| 11 | V Angle |
| 12 | I Angle |
| 13 | Percent 2nd Harmonic Voltage |
| 14 | Total Power KVARs, KWatts (Vectorial) |
| 15 | Total Power KWatts (Vectorial and Arithmetic) |
| 16 | Total VA (Vectorial) |
| 17 | Total PF |
| 18 | Total PF Angle |
| 19 | V THD |
| 20 | I THD |
| 21 | Total Power KVA, KWatts (Arithmetic) |
| 22 | Total VAR (Arithmetic) |
| 23 | Total PF (Arithmetic) |
| 24 | Single Phase Power Factor |
| 25 | Electrical System Service Determination |
| 26 | System Current Tests |

The display table is preferably generated and written to the meter EEPROM 35 so that the information can be accessed by both the microcontroller 16 and the DSP in the meter IC 14 during meter operation.

As discussed above, instrumentation measurements may also be required for power quality tests. The power quality engine 52 allows the meter to monitor and log various conditions of the power line. A power quality test may be constructed by combining any instrumentation measurement, for example, in Table 3, with a comparison test which may utilize test parameters configured by the service test, i.e., threshold values based on the locked service. Records of this nature are stored in the power quality test table shown generally in FIG. 3 and described in detail below.

Therefore, the display configuration table preferably includes two entry definitions, one for normal display quantities and one for power quality measurements. The definitions can be mixed within the table to obtain the desired display sequence. Power quality measurements are considered instrumentation quantities as opposed to billing quantities. If a power quality measurement is selected which is unavailable in a given meter or installed service, the meter preferably skips the display with no warning or error. This is desirable so that a single pre-defined display table will work in multiple applications regardless of the rate for which the program was generated.

Referring again to FIG. 5, the power quality engine 52 retrieves a measurement record number 67 from the next power quality test record and generates a power quality measurement request comprising a measurement record number 66. The request references one of the measurement records from the measurement table. A measurement record generally comprises a function/constant index, a conversion routine index, and a pointer to the next measurement record. The function index references one of a predefined set of measurement functions that the DSP may perform. The constant index references initialization constants and service-dependent constants based on the locked service. The conversion routine index references one of a set of predefined conversion routines that operate on the data manipulated and returned by the DSP. Examples of conversion routines include computational routines such as scaling, square root or trigonometric functions, system test routines, iteration routines, expansion routines, and power measurement computation routines, to name a few.

To better understand the measurement process, consider the situation in which the phase angle for the current $I_B$ is desired to be displayed. The microprocessor references a measurement record and invokes the DSP function designated in that record via bus 36 to the DSP. In this example, the DSP function returns Watts and VA on phase B over a designated number of line cycles. When the DSP completes these measurements, the measurements are stored in the return registers in data RAM. The microcontroller 16 polls for these measurements and retrieves them over the bus 36 when they are available. Then the microcontroller 16 performs the conversion routine referenced by the measurement. In the present example, the conversion routine would call for dividing the watts measurement by the VA measurement to compute the power factor for phase B. The next record field would then reference the next measurement record to be processed. That record would include a reference to the conversion routine for determining the arccosine of the power factor to arrive at the phase angle associated with phase B current.

In FIG. 5, the measurement engine 50 is shown processing a measurement record for power quality monitoring purposes although the measurement record processing is preferably the same for display processing. In either case, the measurement record number is shown at 67, the conversion index is shown at 58, and the function index is shown at 56. The measurement engine 50 thus performs the designated DSP function and computational routines specified by respective function and conversion indices of the measurement record identified by the power quality measurement request. The measurement engine 50 then processes the next measurement record designated in the next measurement record field of the current measurement record.

Figure 6:
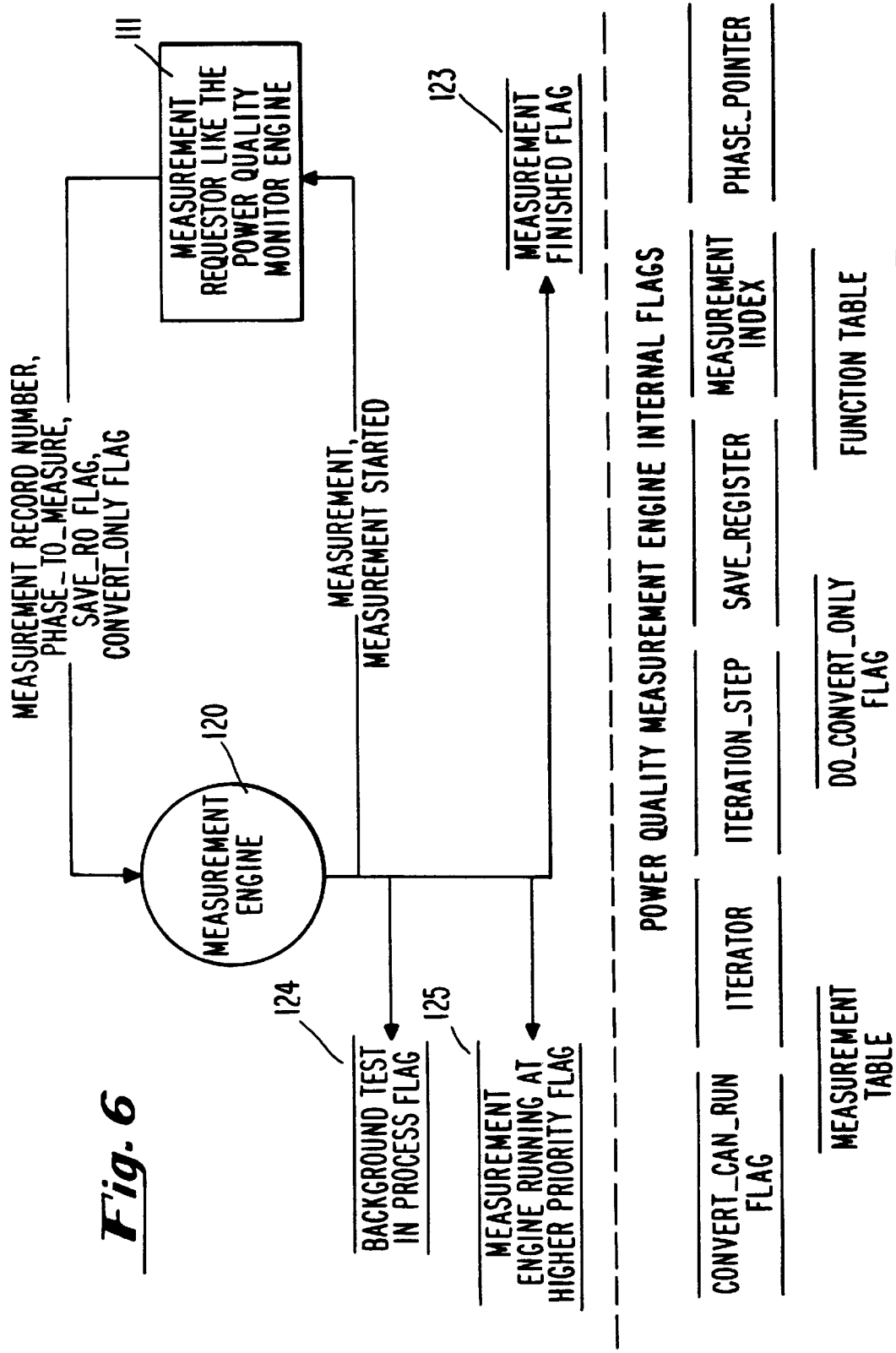
FIG. 6 is a context diagram showing an exemplary measurement engine processing utilizing internal flags in accordance with the present invention.

FIG. 6 is a context diagram showing the measurement engine processing utilizing internal flags in accordance with the present invention. In a preferred embodiment, the DSP is capable of being programmed to perform several different types of measurement functions such as voltage, current, power, apparent power, frequency, harmonic content, etc., on the meter inputs. Of course, the DSP could be replaced by any type of device, or system that is capable of producing a fundamental measurement. For this discussion the production of any fundamental measurement by such a system is referred to as a DSP conversion. The measurement engine provides the capability to combine sequences of fundamental measurements and mathematical computations (referred to as conversion routines) to produce an instrumentation measurement.

The context diagram in FIG. 6 shows that a measurement requester 111 such as the power quality monitor engine starts the measurement engine 120 by providing a measurement record number, a description of the meter phase or phases that are to be measured, a flag indicating whether or not intermediate working register R0 should be saved before beginning, and a flag indicating whether or not DSP conversion should be performed before the conversion routine is executed. The measurement engine 120 responds by clearing the measurement furnished flag 123 and returning a flag indicating that the measurement has been started. The measurement engine 120 then operates independently from the requester 111 to interpret a linked list of measurement records in the measurement table to produce a measurement result for the requester.

In a preferred embodiment, if the measurement engine 120 is started before a previous measurement request has been completed, the first measurement request will be aborted and the second request will be performed. Contention for the measurement engine 120 is avoided by a priority scheme. Three levels of priority are used: background priority, foreground priority, and communication priority. The power quality monitor engine operates at the background priority, the meter display operates at the foreground priority, and devices communicating via a communications protocol operate at the communications priority. Other embodiments might provide other means for handling multiple measurement requests such as, but not limited to: requiring a measurement request to be finished before another can be started, allowing additional measurement requests to be queued and processed one at a time, interrupting the measurement request in process until the new request is processed, or processing the measurement requests in parallel.

Figure 7:
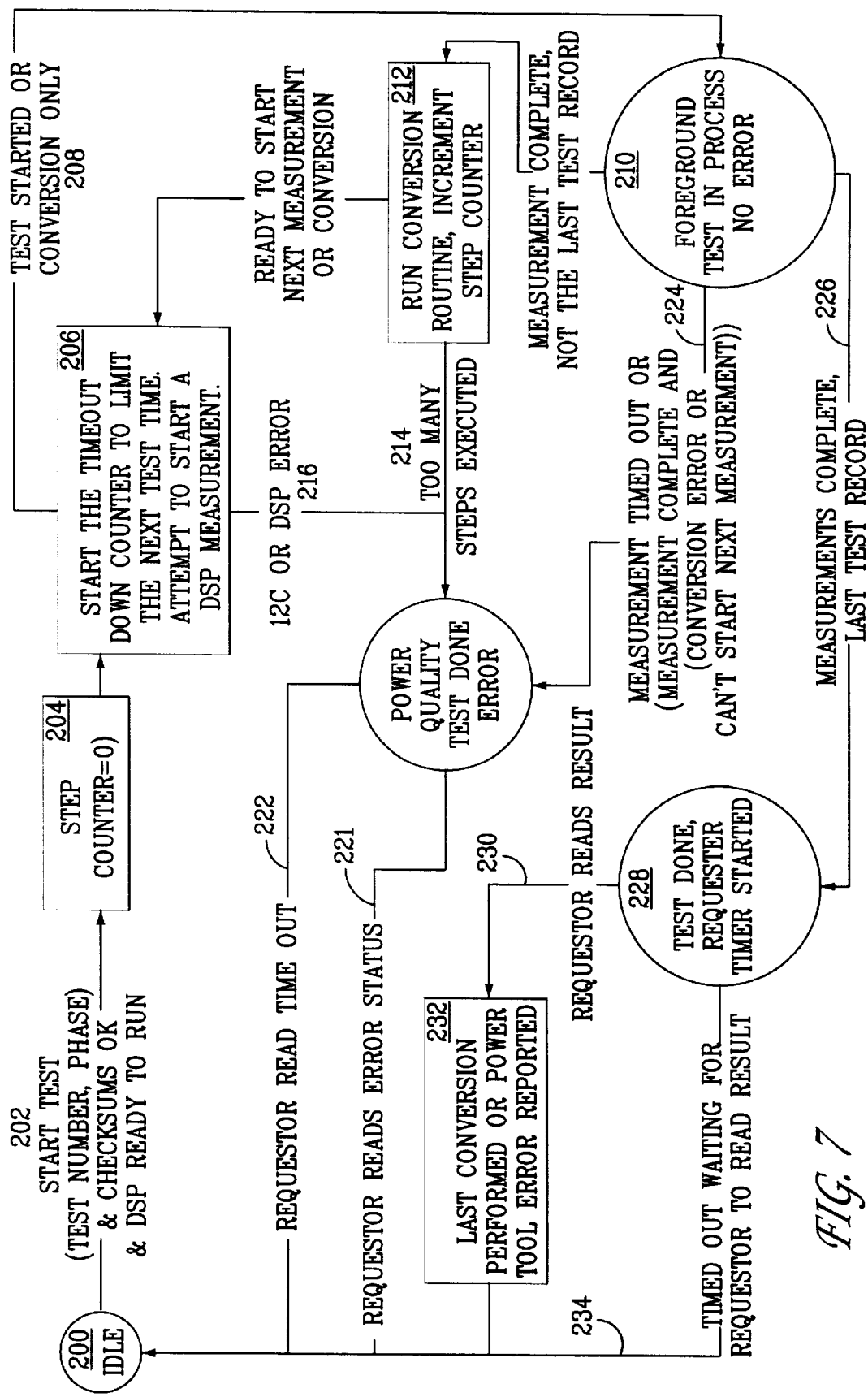
FIG. 7 is an example of a state transition diagram for the measurement engine in accordance with the present invention.

FIG. 7 is an example of a state transition diagram for an exemplary measurement engine 50 in accordance with the present invention and FIGS. 8A–8E are more detailed functional flow diagrams showing the steps carried out by the measurement engine 50 in accordance with a preferred embodiment of the invention. In FIG. 7, the circles represent states and the boxes represent actions. The labeled lines represent the conditions required to transition between states.

During the Idle state 200 the measurement engine waits for a Start Test event 202. The Start Test event 202 provides the measurement engine with a test number and specifies the phase or phases on which to perform the test. The test number is used as an index into a linked list of test records. Each test record can specify zero or one DSP measurement requests and several kinds of conversion routines. If the EEPROM tables used by the measurement engine have valid checksums (indicating that the tables have been correctly programmed) and the DSP can be put in a state where it is ready to receive measurement requests, then test step counter 204 is initialized to zero and the actions specified in box 206 are performed. A test can comprise of a number of steps. A step may require waiting for the DSP to perform a measurement. At box 206, a timeout down counter is started to provide a time limit on the amount of time that the measurement engine will wait for the DSP to complete a requested measurement. If the test record indexed by the test number contains a DSP measurement request, the measurement request is sent to the DSP. If the measurement request was sent to the DSP or the test record specifies only conversion routines, then the measurement engine transitions along line 208 to the Foreground Test In Process, No Error state 210. If the DSP could not be sent a measurement request in 206 or if an I2C bus error occurred while accessing the DSP or EEPROM, then line 216 is followed to the Power Quality Test Done Error state.

The measurement engine remains at the Foreground Test In Process, No Error state 210 until either the DSP measurement is completed or the timeout down counter counts down to zero. If the DSP measurement completes without error and the test record indexed by the test number points to another test record, then at box 212 the conversion routine is performed and the step counter is incremented. If the step counter exceeds a maximum number of steps (preferably set to 127), then the test is assumed to be incorrectly defined and the measurement engine will transition along line 214 to the Power Quality Test Done Error state. Otherwise, the test number is replaced by the test number of the test record indexed by the present value of the test number and the actions specified by box 206 are repeated.

If the DSP measurement completes without error and the test record indexed by the test number does not point to another test record, then the Foreground Test In Process, No Error state 210 transitions at 226 to the Test Done Requestor Timer Started state 228. During this transition, the timeout count down timer is reset to a new value to set a limit on the amount of time that the measurement engine will wait before automatically returing to the Idle state 200.

If an error has been detected 224 at the Foreground Test in Process, No Error state 210, then the measurement engine transitions to the Power Quality Test Done Error state. During this transition, the timeout count down timer is reset to a new value to set a limit on the amount of time that the measurement engine will wait before automatically returning to the Idle state 200.

If the measurement engine is at the Power Quality Test Done Error State and the timeout down counter counts down to zero, then a Requestor Read Time Out event 222 has occurred and the measurement engine transitions to the Idle state 200.

If the measurement engine is at the Power Quality Test Done Error State error status may be read as indicated by the Requestor Reads Error Status event 221 and then the measurement engine will transition to the Idle state 200.

If the measurement engine is at the Test Done, Requestor Timer Started state and the timeout down counter counts down to zero then a Time Out Waiting For Requestor To Read Result 234 event has occurred and the measurement engine will transition to the Idle state 200.

If the measurement engine is at the Test Done, Requestor Timer Started state 228 and the measurement engine is asked for the measurement result via the Requestor Reads Result event 230, then the conversion routine of the last test record indexed will be performed and the result will be returned to the requestor or if the conversion routine created an error then a power tool error will be reported, as shown at box 232.

Figure 8A:
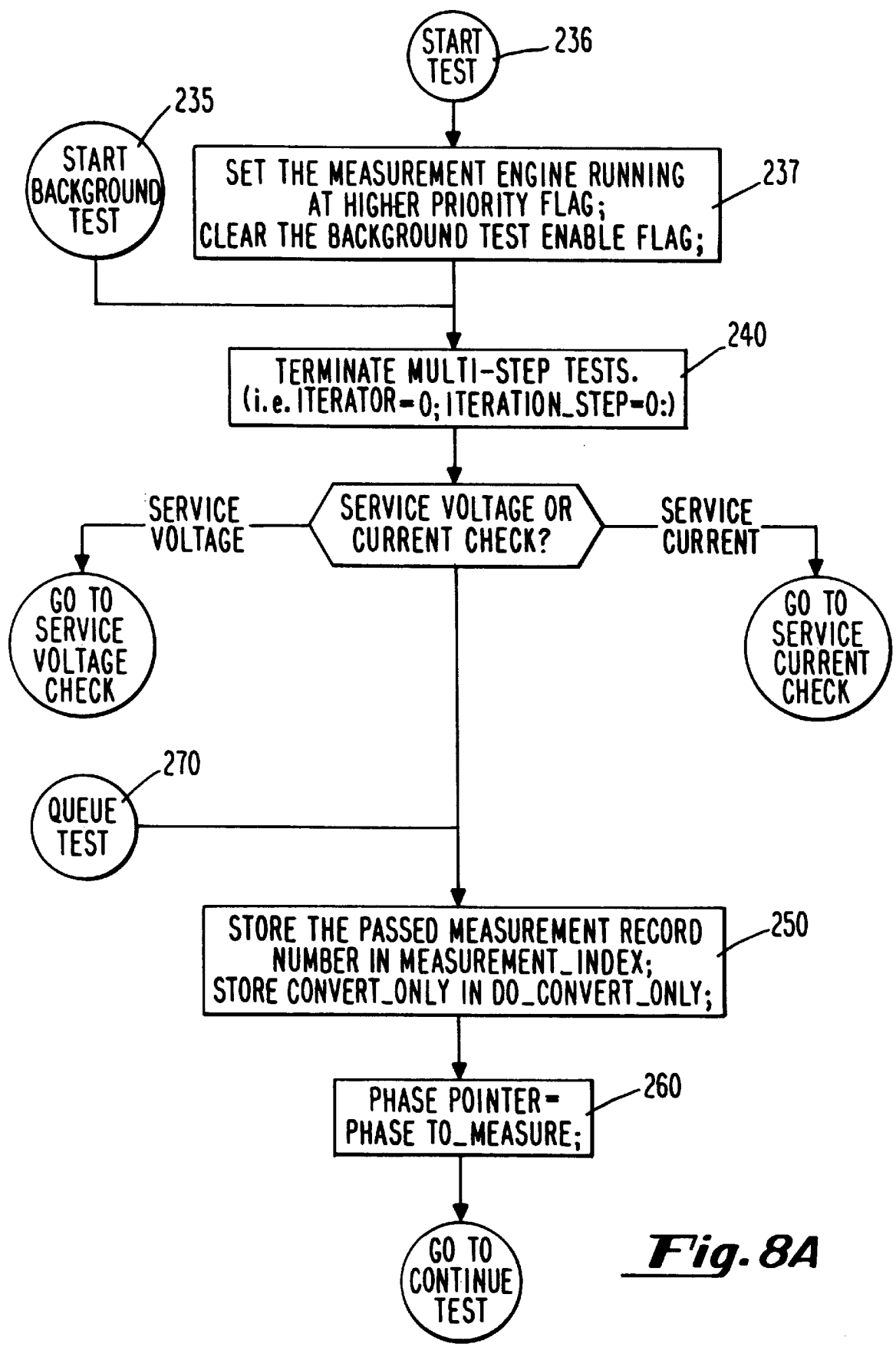

FIGS. 8A–8E are more detailed functional flow diagrams showing the steps carried out by the measurement engine 50 in accordance with a preferred embodiment of the invention. Referring to FIG. 8A, it can be seen that the measurement engine 50 has two entry points: start background test 235 and start test 236. The start background test 235 is used by the power quality monitor engine 52 to send a measurement request to the measurement engine 50. The background test in process flag (element 124 in FIG. 6) provides feedback to the power quality monitor engine 52 to indicate that the test is still process. The start test 236 is used by the meter display and communications functions to send foreground and communications priority measurement requests to the measurement engine 50. Should the measurement engine 50 receive a measurement request via the start test entry point 236, then the background test in process flag 124 will be cleared and the measurement engine running at higher priority flag (element 125 in FIG. 6) will be set at 237. When a measurement request has been completed and the requester has read the instrumentation measurement, the measurement engine running at higher priority flag 125 is desirably cleared. The power quality monitor engine 52 will not issue a measurement request while the measurement engine running at higher priority flag 125 is set. If the flag 125 is not set, the power quality monitor engine 52 will restart its power quality monitor test if the background test in process flag 124 is cleared.

In a preferred embodiment, the measurement engine 120 will perform all actions specified up to the conversion routine specified by the last measurement record in the linked list. The measurement engine 120 will then set the measurement finished flag 123. When the measurement requester 111 observes that measurement finished is set, then the measurement engine 120 will be commanded to perform the last conversion routine and return the final measurement to the measurement requester 111. Other embodiments could complete all actions specified by the linked list before setting the measurement finished flag 123 provided that the final measurement result is left undisturbed until it has been read by the measurement requester 111.

A measurement record will preferably specify zero or one DSP conversion to be performed, one conversion routine to perform, and either the next record to be interpreted or an indicator that the end of the linked list has been reached. The engine 120 will continue operation at the next measurement record and so on until the "next measurement record" field contains a code indicating the end of the linked list.

The measurement records define what the measurement engine 120 must do to produce a requested measurement. Each measurement record is comprised of 24 bits. Bits 8 through 13 represent the pointer to the conversion function associated with a measurement record. Depending on the purpose of the conversion function, the measurement record fields may be interpreted in different ways by the measurement engine 120. In the preferred embodiment, the conversion functions cause the fields to be interpreted in four different ways designated as types 1, 2, 3, and 4 as shown in Table 4.

TABLE 4

| | Measurement record bit field definitions | | | |
|---|---|---|---|---|
| Record type | Bit # 23-22 | 21-20 | 19-16 | 15-14 |
| type 1 | chg ph | pre conv | func index | pre xfer |
| type 2 | chg ph | iteration steps-1 | | pre xfer |
| type 3 | phase dependent | const index | | pre xfer |
| type 4 | xx | expanded function | | pre xfer |
| | Measurement record bit field definitions | | | |
| Record type | Bit # 13-18 | 7 | 6 | 5-0 |
| type 1 | conv function | r0- > dsp sav | conv only | next measurement record index |
| type 2 | iterate function | r0- > dsp sav | conv only | iterated measurement record index |
| type 3 | conv function with index | r0- > dsp sav | conv only | next measurement record index |
| type 4 | expand | r0- > dsp sav | conv only | next measurement record index |

Measurement Record Field Descriptions

In a preferred embodiment, the measurement record fields have the following meaning. Other embodiments may utilize different field definitions, field sizes, and record sizes.

next measurement record index

Pointer to the next measurement record in measurement table.

iterated measurement record index

Pointer to the first measurement record for an iterated measurement record sequence. This measurement record sequence will be executed for the number of specified iteration steps. After the last iteration then execution will continue at iterated measurement record index +1.

chg-ph

Indicates that the phase to be measurement recorded should be modified before the DSP conversion is started.

chg_ph=00 for no change 01 for select phase A 10 for select phase B 11 for select phase C function_index The index to the function record in the function table.

pre_conv

Indicates actions to be taken after DSP conversion values have been scaled but before the conversion routines run.

pre_conv=00 for none

01 Clamp0_Low_VA

10 Clamp1_Low_VA 11 for none (spare)

Const_index

Used as an index to the constant table and service thresholds table.

Phase dependent

The constant index is phase dependent if the bit is set. In the preferred embodiment, the phase dependent bit indicates to certain conversion functions that alternative actions may be taken depending on which service phase the DSP conversion was performed.

PreConversions 0 0 no transfers 0 1 dsp_sav->r1

1 0 r1->dsp_sav 1 1 dsp_sav->r0, 0->dsp_sav

Conversion Routines

The conversion routines are defined to operate on the data produced by DSP measurements. Thirty-one routines were used to meet the exemplary specifications for a preferred embodiment of the meter. These routines are specified by the appropriate value in the func_index field. The actual purpose of each conversion routine is not important to the understanding of the measurement engine except for the iterate routine. Table 5 lists some exemplary routines executable the present invention.

TABLE 5

Expanded function index

| func_index | Name |
|---|---|
| 0 | Read Dummy |
| 1 | Scale Data0 |
| 2 | Data0 by Data1 |
| 3 | Do RMS |
| 4 | Do RDS |
| 5 | Sum Square data0 data1 |
| 6 | Expanded Function |
| 7 | Iservice Test |
| 8 | ArcCos |
| 9 | ArcTan |
| A | Pack |

TABLE 5-continued

Expanded function index

| func_index | Name |
|---|---|
| B | pfService Test |
| C | LLArcCos |
| D | LLArcTan |
| E | Find Service |
| F | Finish Service |
| 10 | Add Freq_Const |
| 11 | Add Normal |
| 12 | Iterate |
| 13 | Mult Factor |
| 14 | Finish THD |
| 15 | Div Factor |
| 16 | Total Power |
| 17 | Scale rl |
| 18 | Pack Power |
| 19 | Clr r0 if r1 0 |
| 1A | Set r0 if r1 lt Nominal |
| 1B | Scale Up |
| 1C | Mod 360 |
| 1D | Clamp0 Low VA |
| 1E | Clamp1 Low vAa |
| 1F | Total VAW |

Forty-nine additional routines, shown in Table 6, perform basic operations on the power tool working registers. They are provided to support new functions.

TABLE 6

| expanded function code | Name |
|---|---|
| E | HiLoRatio |
| F | Set LL Do RmS |
| 10 | XOR Signs LL |
| 11 | xor Signs |
| 12 | Data0 by Data1 Set Signs LL |
| 13 | Data0 by Data1 Set LL |
| 14 | Set LL |
| 15 | Read Data |
| 16 | Add Factor |
| 17 | Get Freq Const |
| 18 | Smult |
| 19 | sqrt r0 |
| 1A | Square data0 data1 |
| 1B | mag r0 |
| 1C | mag r1 |
| 1D | Adjust Index |
| 1E | divide |
| 1F | Scaled Div |
| 20 | sqrt |
| 21 | Negate |
| 22 | Swapr0r1 |
| 23 | r0 to dsp sav |
| 24 | dsp sav to r0 |
| 25 | dsp sav to r1 |
| 26 | dsp sav to temp1 |
| 27 | f1 to r0 |
| 28 | r0 to r1 |
| 29 | r0 to temp1 |
| 2A | r1 to r0 |
| 2B | r1 to r3 |
| 2C | r1 to f2 |
| 2D | r1 to temp1 |
| 2E | r1 to dsp sav |
| 2F | r3 to r1 |
| 30 | r3 to r0 |
| 31 | r3 to temp1 |
| 32 | r3s to r0 |
| 33 | r3s to r1 |
| 34 | temp1 to r0 |
| 35 | temp1 to r1 |
| 36 | f2 to r1 |
| 37 | sub r1 r0 |
| 38 | sub r1 r3 |

TABLE 6-continued

| expanded function code | Name |
| --- | --- |
| 39 | sub r3s r0 |
| 3A | add r3 to r0 |
| 3B | add sav a r0 |
| 3C | add sav b r1 |
| 3D | add r3s to r0 |
| 3E | add dsp sav to r0 |
| 3F | Add r3 5 dsp sav |

Definitions

Data0

The DSP is capable of producing two conversion results in parallel. Data0 represents the primary raw value read from the DSP. Data0 is preferably multiplied by a conversion/calibration factor specific to the type of DSP measurement performed to obtain a calibrated value.

Data1

Represents the secondary raw value read from the DSP. Data1 is preferably multiplied by a conversion/calibration factor specific to the type of DSP measurement performed to obtain a calibrate value.

R0,R1

General working registers. The register contents will both be preserved across DSP measurements or while waiting for the display or communications routines to read a measurement engine result.

DSP_SAVE

Working register defined specifically for use by measurement engine functions. The contents is preserved until cleared or overwritten by a power quality measurement engine function.

Iterate routine

The effect of this routine is to provide power tools with a REPEAT . . . UNTIL capability. The iteration step, and any steps that it may chain to, will be performed and then the iterator will be decremented. This sequence will continue until the iterator decrements from 0 to $FF. Operation will then continue at the next step following the iteration step.

Phase_Pointer,Phase_to_measure

The phase_to_measure and phase_pointer contents encode a phase designator, phase_a, phase_b, phase_c, end/begin, and a multiphase test flag.

In general, if the multiphase test flag is set, then the measurement engine will automatically advance the phase designator in the phase_pointer to the next phase (in end/begin, A, B, C, end/begin order) supported by the service the meter is connected to before interpreting the measurement record indicated by measurement index. After the conversion routine has been executed, the measurement engine will again automatically advance the phase designator and interpret the measurement record. This advance and repeat sequence continues until the last service phase has been converted and the measurement engine advances the phase designator to the end/begin designator. If the phase designator specified a phase that is not defined for the present service that the meter is connected to, then the measurement engine will not start and will return measurement started=false to the measurement requester.

In the preferred embodiment, measurement records are interpreted as shown in FIGS. 8A–8E. Either entry point start background test 235 or start test 236 are suitable for starting the measurement engine. The difference between the entry points is simply the implementation of the preferred embodiment's priority method at 237. The ability to abort measurement requests in process is accomplished by insuring that the iteration capability is reset at 240 and the parameters measurement record number, convert_only and phase_to_measurement overwrite the respective internal data storage areas measurement_index, do_convert_only at 250 and phase_pointer at 260. The entry point queue test at 270 is used by the measurement engine to process special instrumentation measurements such as the service_voltage and service_current. Just after 240 and before the queue_test entry point, the measurement engine tests the measurement record number for reserved code indicating the service_voltage check or the service current check. These checks use additional processing to set up or check necessary preconditions before the normal functions of the measurement engine can be performed. If either type of check is found, then the processing is performed which includes changing the measurement record number to specify a measurement sequence the measurement engine is capable of performing. Then control is returned to the measurement engine at queue_test. The measurement engine will be the requester and call itself using entry point queue test at 270.

Figure 8B:
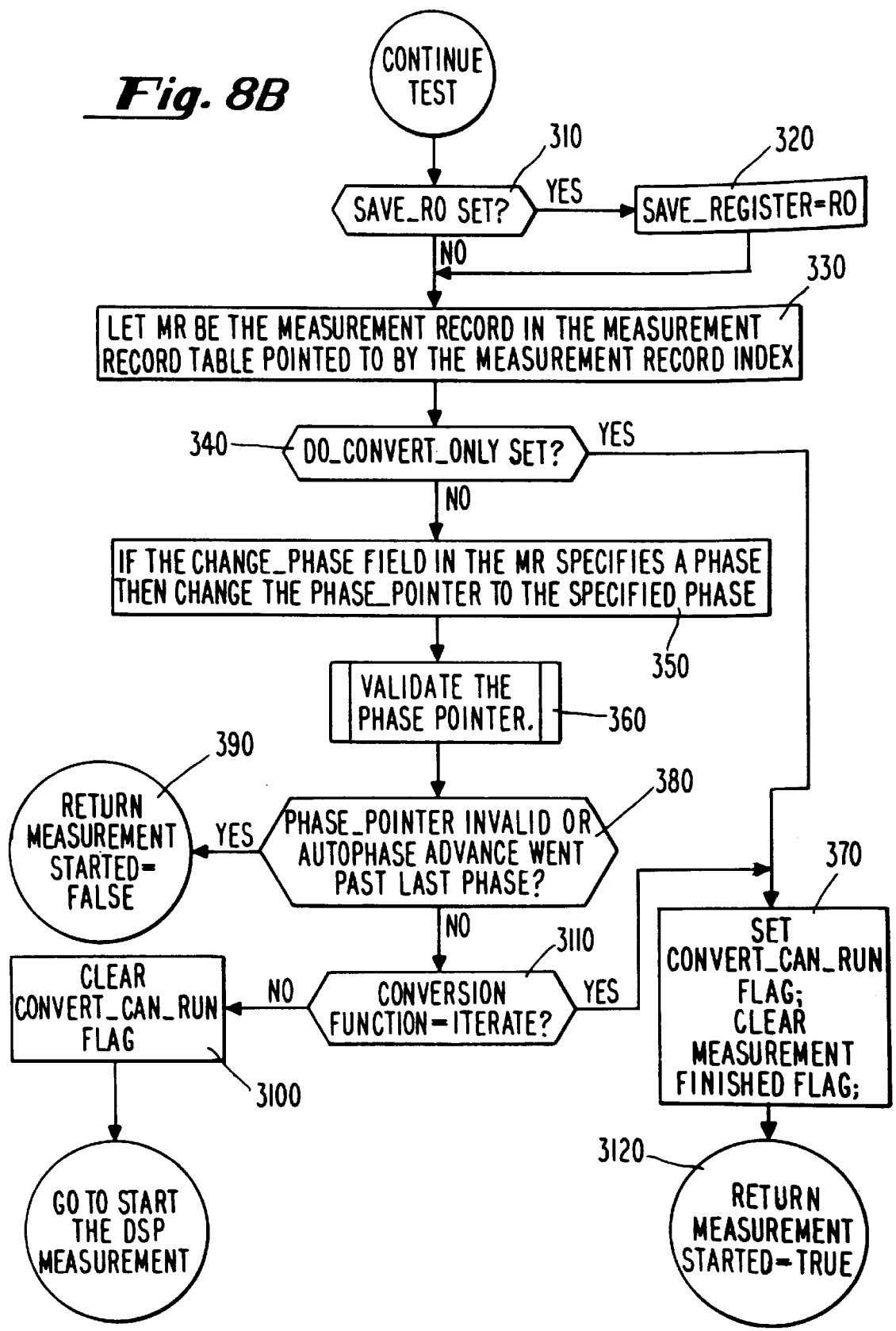

Once the parameters passed from the measurement engine have been saved, processing continues as shown in FIG. 8B. If the save_R0 flag was received set at step 310, then the contents of working register R0 is transferred to the save_register at 320. The measurement record fields to be interpreted is denoted MR in 330. MR is the measurement record in the measurement table indexed by the measurement_index. If the do_convert_only flag is set at 340, then the convert_can_run flag is set at 370, and the measurement engine clears the measurement fiished flag and returns measurement_started=true at 3120. If do_convert_only was not set, then the change overrides the phase_pointer's phase designation. The phase_pointer will then be validated at step 360 to insure that the phase designated is supported by the service and phase. Note that in cases where the service has not been determined, the phases supported are determined to be those phases that the meter has been configured to be capable of measuring. If the phase designated was not supported by the service or auto advancing the phase designator resulted in the end/begin designation at 380, then the measurement engine returns measurement started=false at 390 to the measurement requester. If the phase_pointer is designating a valid phase, then the conversion function index of the MR is tested at 3110 to determine if the MR is a type 2 (iterate) record. If the MR is a type 2, then convert_can_run is set at 370 and the measurement engine returns measurement_started=true to the measurement requester.

Figure 8C:
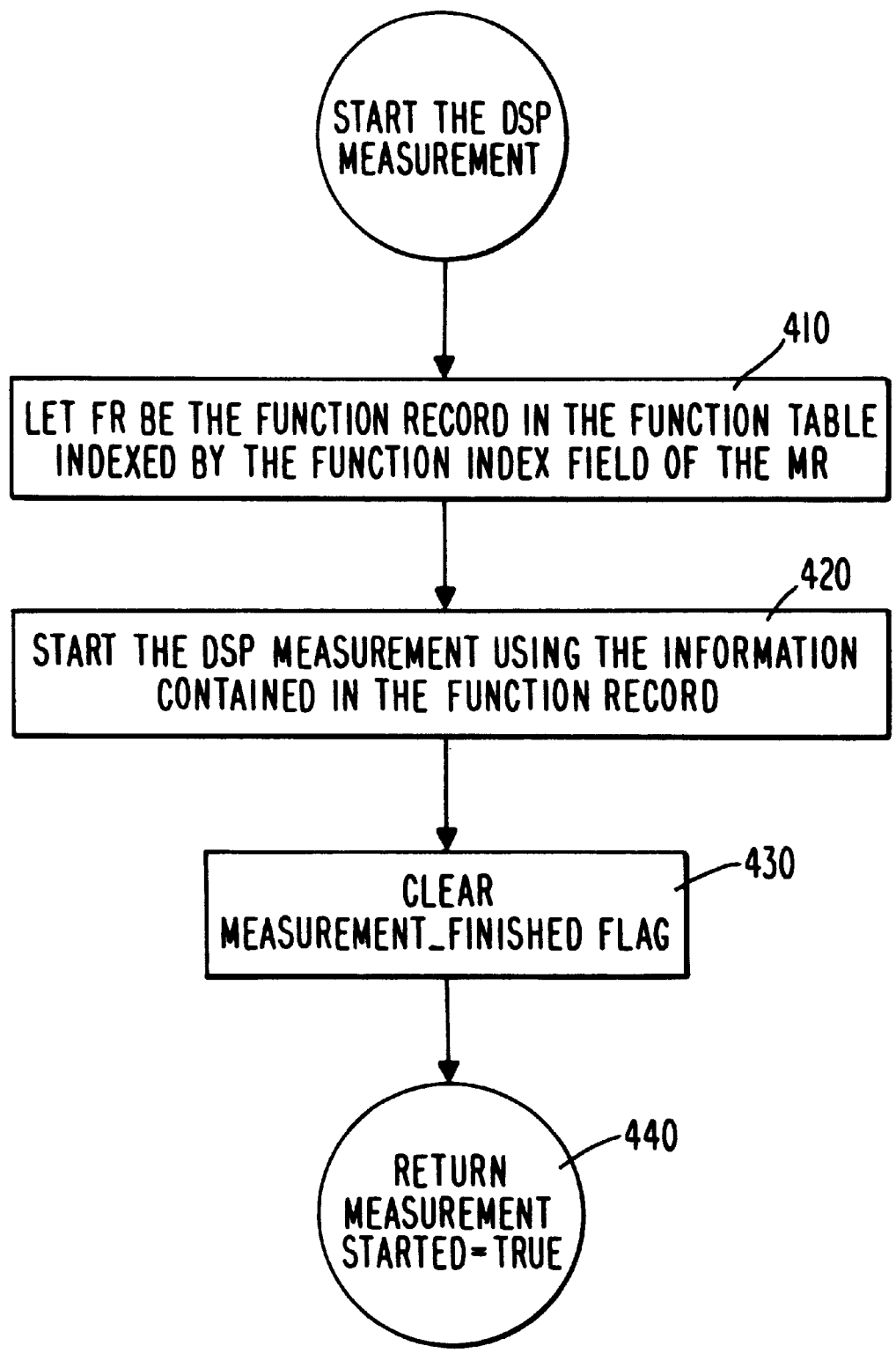

All other types of measurement records preferably utilize a DSP conversion to be started prior to returning at 3100. Note that while it is possible for a type 3 or type 4 measurement record to erroneously be processed at step 3100 (erroneous because type 3 and type 4 do not specify a DSP conversion), in practice this preferably will not occur provided the requester has set the convert_only flag. In the preferred embodiment, the DSP conversion is started as shown in FIG. 8C. FR denotes the function record, indexed by the func_index field in the MR, of the function table at 410. The FR in conjunction with the phase designator is the phase_pointer which represents a complete specification of which DSP conversion to start, what phase to perform the conversion on, how many line cycle pairs to perform the conversion for, what initialization data should be provided to the DSP, and what scale factors should be used to scale or calibrate the DSP conversion results to known units of measure. This information is used at 420 to start the DSP conversion. Once the conversion is started, the measurement_finished flag 123 is cleared at 430 and the measurement engine returns measurement_started=true at 440.

It can be seen from the above discussion that when the measurement engine returns to the measurement requester either no measurement was started, or the measurement was started and the measurement finished flag is cleared, and either the convert_can_run flag is set and the DSP was not started, or the measurement was started and convert_can_run is not set and DSP conversion was started.

Figures 2, 8D:
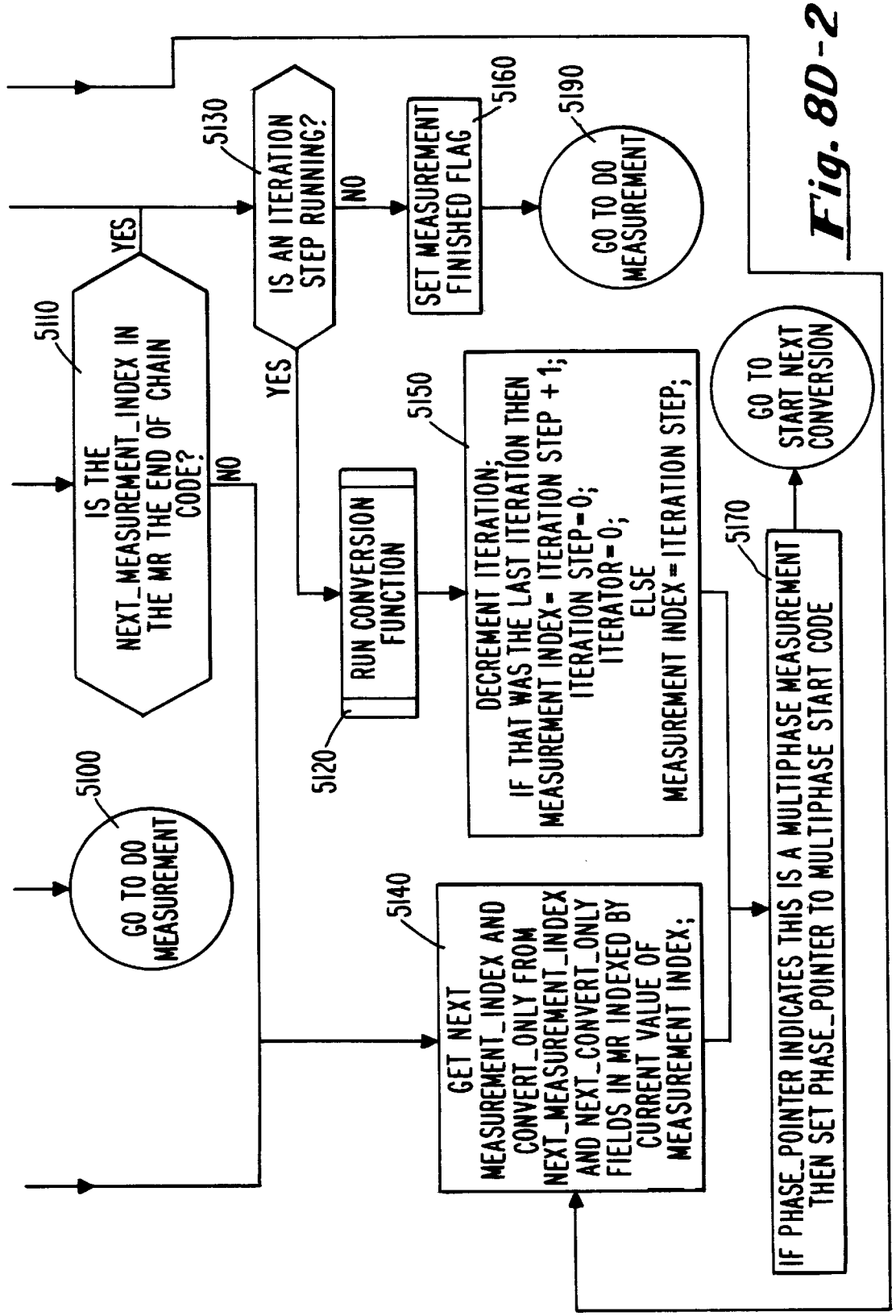

The measurement engine responds to the measurement requester as discussed above to begin the instrumentation measurement. Once begun, the measurement engine executes independently from the measurement requester, as shown in FIG. 8D. Decision block 510 shows that the Do_Measurement process is in an idle loop while measurement finished is true or while the DSP is converting. If neither case is true, then the phase_pointer is tested at 560 to determine if this was the last measurement to be performed to produce the instrumentation measurement. If the end_of_chain designator is found then the iteration_step is tested at 5130 to determine if an iterate instruction is in process. If not, then the measurement finished flag is set to notify the measurement requester that the instrumentation measurement is ready to be read. The measurement requester can read the instrumentation measurement by calling the read conversion function shown in FIG. 8E. After the measurement requester has obtained the result, the requester clears the measurement engine running at higher priority flag.

Figure 8E:
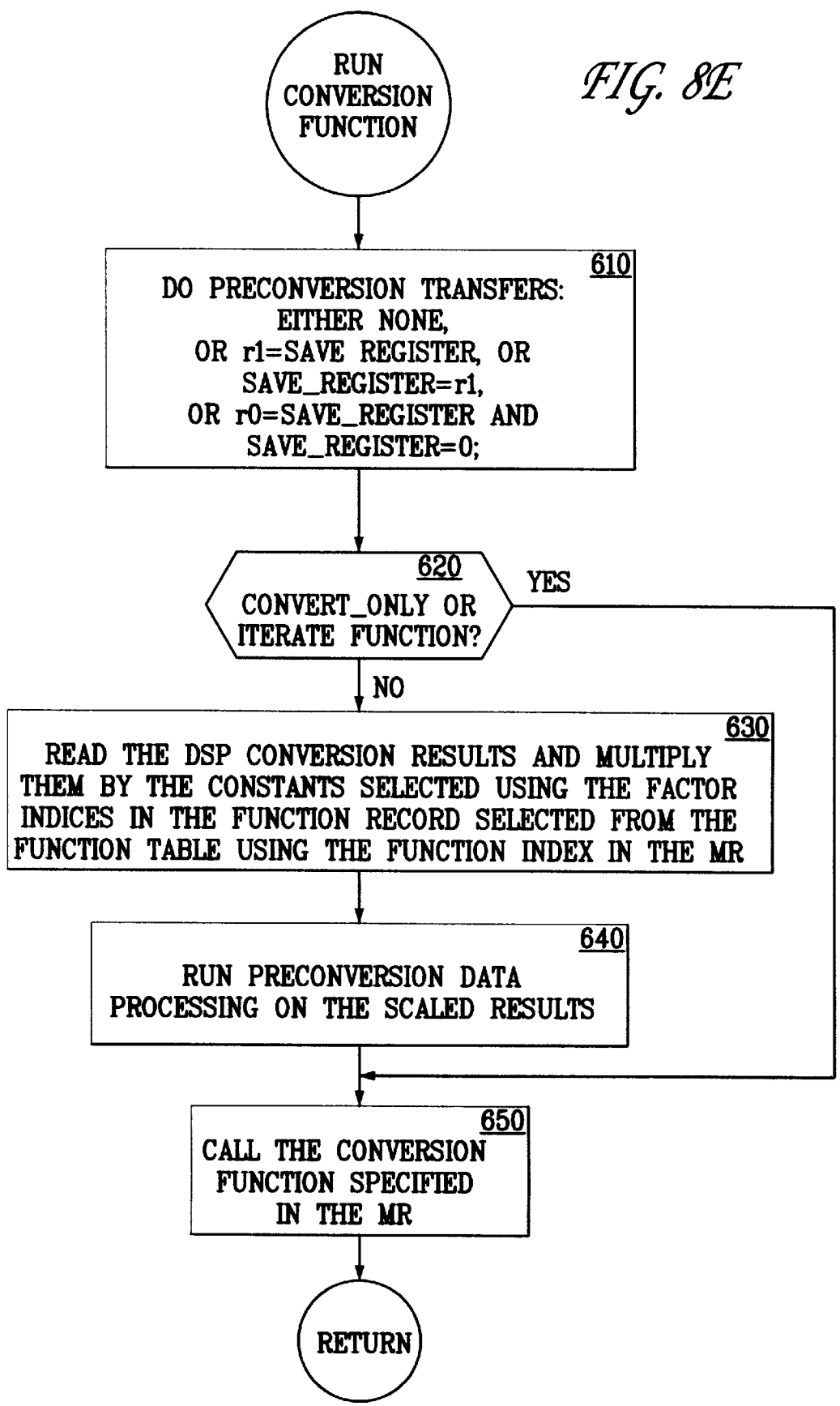

If it is determined that an iteration instruction is in process at 5130 after finding the end_of_chain at 560, the conversion function pointed to by the MR will be executed by the Run_Conversion process in FIG. 8E. After the conversion function has completed, the iterator value will be decremented. If that was the last iteration, then the measurement_index will be changed to the contents of iteration_step. If phase_pointer indicates that this is a multiphase measurement, then the phase_pointer will be reset to the end/begin designator so that after the auto advance occurs at 360, the next phase measurement will be phase A.

Processing continues at 530 to begin the next iteration. The continue test is called at 550 to start the first measurement of the iterated sequence. After the continue test returns either the measurement was not started or it was started, either converted_can_run is true or false. If the measurement was not started then the conversion routine for the MR corresponding to the measurement_index will not be executed. Instead, processing will continue at 5130. If the measurement was started and convert_can_run is false, then a DSP conversion was started and the measurement engine must wait for the conversion to complete at 5100. If convert_can_run is true, then a DSP conversion was not started. The conversion routine of the MR is executed by Run_Conversion_Function at 5110. After the conversion function has completed, the next_measurement_index of the MR is checked for the end_of_chain code. If the end_of_chain code is discovered, then processing begins again at 5130 as described above. Otherwise processing will continue at 5140.

At 5140, the next_convert_only flag of the MR is transferred to the convert_only flag and the next_measurement_index field of the MR is transferred to the measurement_index to select the next MR. Processing continues as 5170 as described above. At 560, if the next_measurement_index was not the end_of_chain code, then the conversion routine specified by the MR will be executed by calling the Run_Conversion process at 590. After the conversion routine has been has been completed, then processing continues at 5140 as described above.

At 520, if the phase_pointer can be auto advanced to another phase supported by the service, then the conversion routine specified by the MR will be executed by a call to Run_Conversion at 540. After the conversion routine has been completed, the processing continues at 550 as described above.

The Run_Conversion routine flowchart is shown in FIG. 8E. The preconversions field of the MR processed in 610 provide general purpose register operations to all conversion functions. If the MR caused a DSP conversion to be performed at 620, the DSP conversion results are read and then scaled by the scale factors pointed to be the function record selected from the function table according to the func_index field of the MR at 630. The pre_conv function specified in the MR is then performed on the scaled data at 640. Lastly, the conversion routine specified by MR is called at 650 and then Run_Conversion returns to its caller. If at 620 it was determined that no DSP conversion had been performed, the processing continues at 650 as described above.

In a preferred embodiment, at least fourteen different power quality tests are programmed for concurrent operation. Referring back to FIG. 5, power quality tests (also referred to as background tests) can make use of the following resources: occurrence logs 86, event logs 78, active warnings 76, load control relays 84, and display warnings 88. There are preferably the same number of occurrence logs 86 as power quality tests. An occurrence log 86 consists of a logging flag, a binary occurrence counter, and an occurrence timer. Background warning start and stop times can be recorded in the event log 78 if the background test has an occurrence log 86 specified. The event codes are based on the occurrence log number associated with the background test. Each background warning condition can be programmed to assert the load control relay. The relay will deassert if no function within the meter has requested an assertion. The use of these power quality resources is explained in detail below.

Figure 9A:
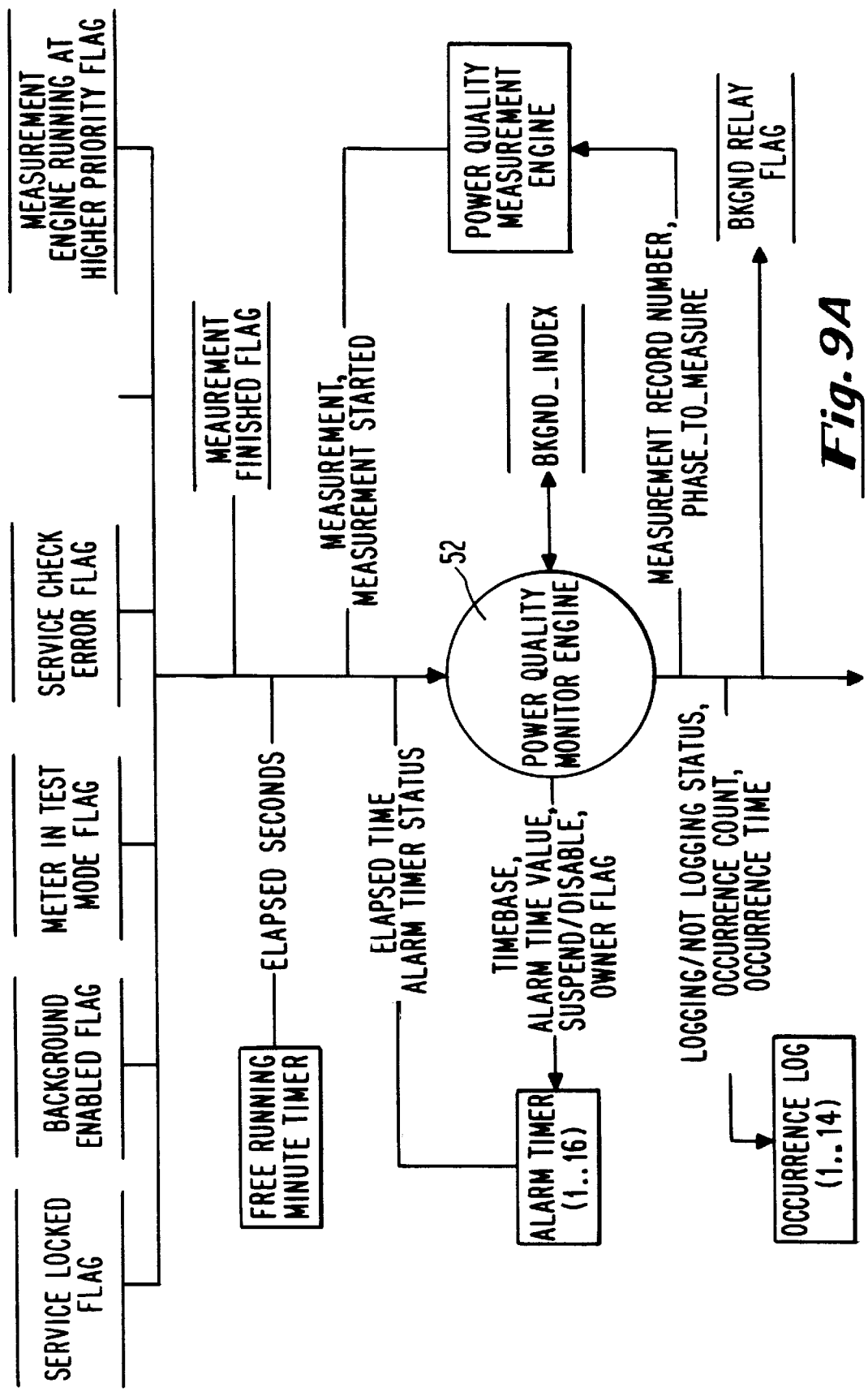
FIGS. 9A and 9B show a context diagram for an exemplary power quality test engine processing utilizing internal flags in accordance with the present invention.
Figure 9B:
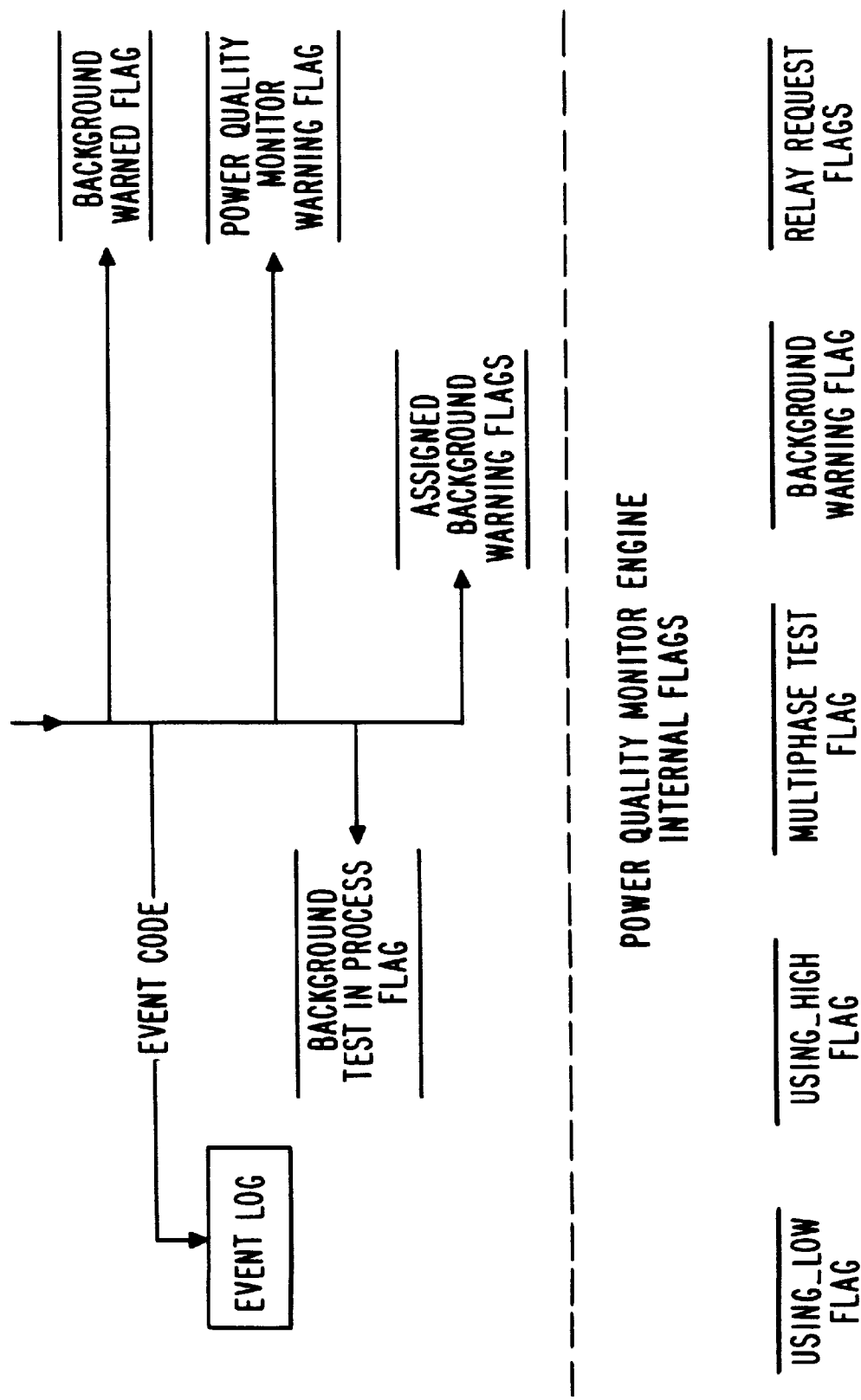

FIGS. 9A and 9B show a context diagram showing the power quality test engine processing utilizing internal flags in accordance with the present invention. Power quality tests are checks of instrumentation values to determine unusual conditions on the electrical service which might indicate power quality, equipment failure, or tampering issues. These conditions are qualified against a magnitude threshold for a minimum duration. For example, voltage above 120% of the nominal voltage might damage electrical equipment, but short term transitions to this level have little effect and are relatively common. Thus, a magnitude and a minimum duration is typically required to qualify a condition as an abnormal condition. These qualified tests are referred to as power quality events. The magnitude thresholds can be minimum thresholds as well as maximum thresholds. Thresholds can also define acceptable or abnormal bands of operation. Because the meter can operate in a number of services and over a number of voltages, the thresholds for many of the monitors are best defined in terms of the service locked into the meter. Other tests need thresholds which are absolute numbers. Both methods are supported in the present invention. The duration can be defined in terms of seconds or minutes. In accordance with the present invention, any number of quantities can be monitored for abnormal conditions within practical constraints imposed on the background processing and the desired time frame for repeating the tests. These quantities can be defined to a particular phase or can be treated generically for all meter phases.

The power quality tests are performed preferably one-at-a-time, in sequence. Quantities are requested of and obtained from the meter IC 14 over the IIC serial bus 36 using the instrumentation (power quality measurement) feature of the meter IC 14 when other higher priority operations are not using this feature of the meter IC 14. The display and communications routines have priority over the power quality monitors. Because the power quality measurements vary in length and the other routines have a higher priority than the power quality tests, time between monitor samples is not consistent or predictable as is described in more detail below.

When a power quality event is identified, a number of actions can be taken by the meter. The meter can count the event and accumulate the duration of the event. The meter can also set a warning which can appear on the meter's display. The meter can also set a warning which is definable by the utility, but only available through optical or remote communications. The meter can also operate a relay. The meter can also record the start and end time and date of the event in an event log. The exact action of the meter is defined by the meter configuration.

Figure 10A:
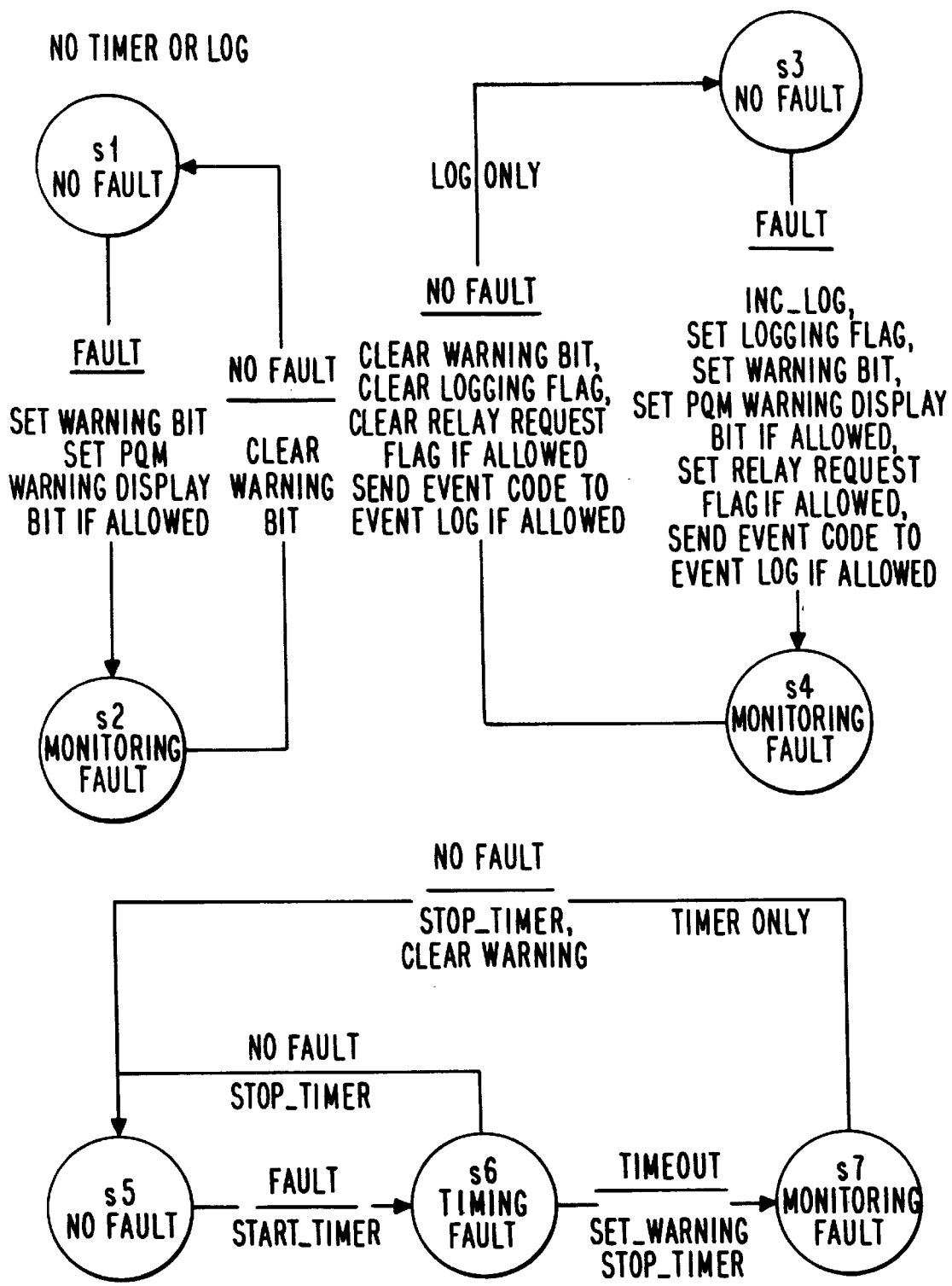
FIGS. 10A and 10B are a series of state diagrams showing exemplary power quality engine resource processing scenarios in accordance with present invention.
Figure 10B:
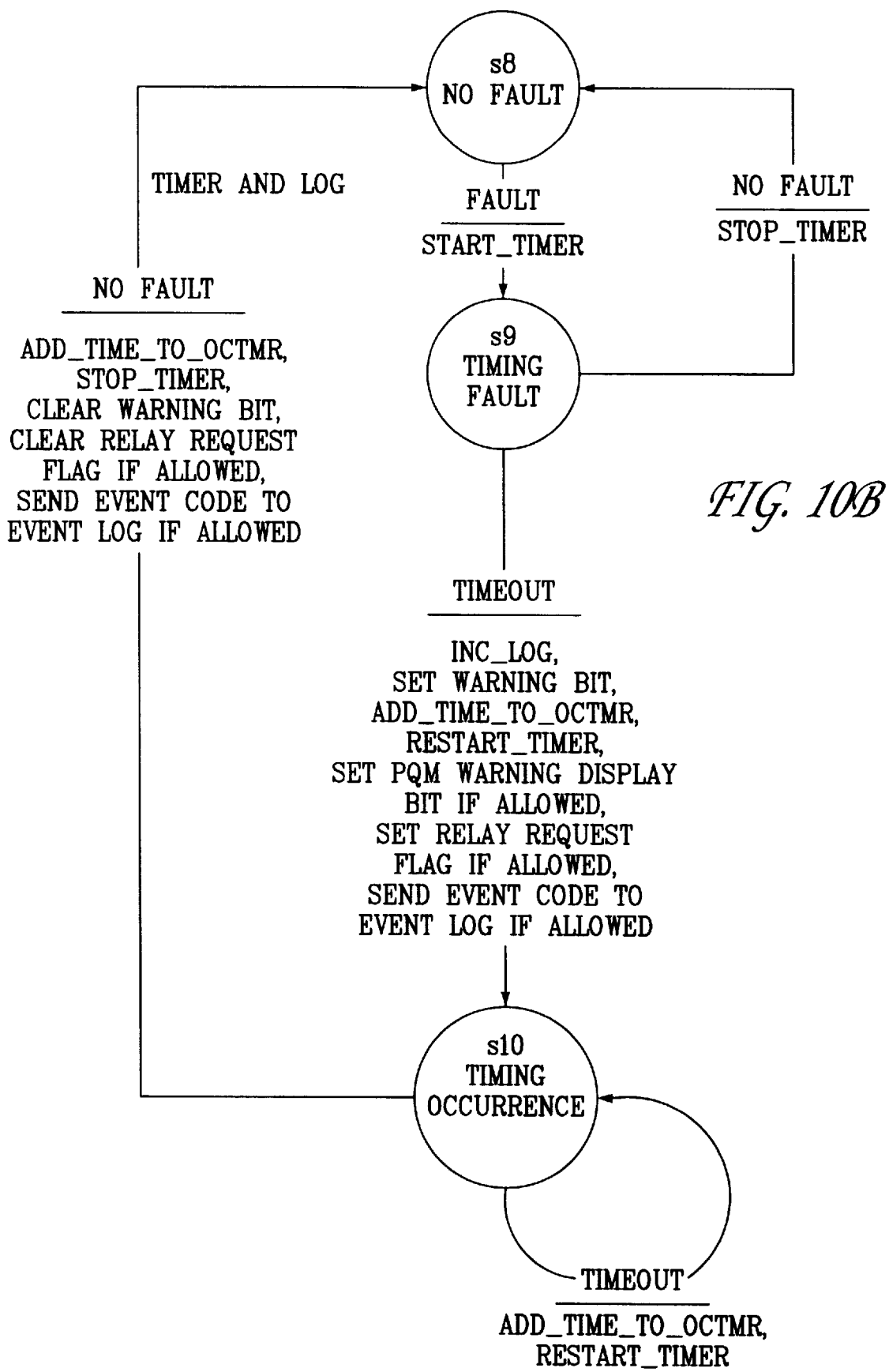
Figure 11A:
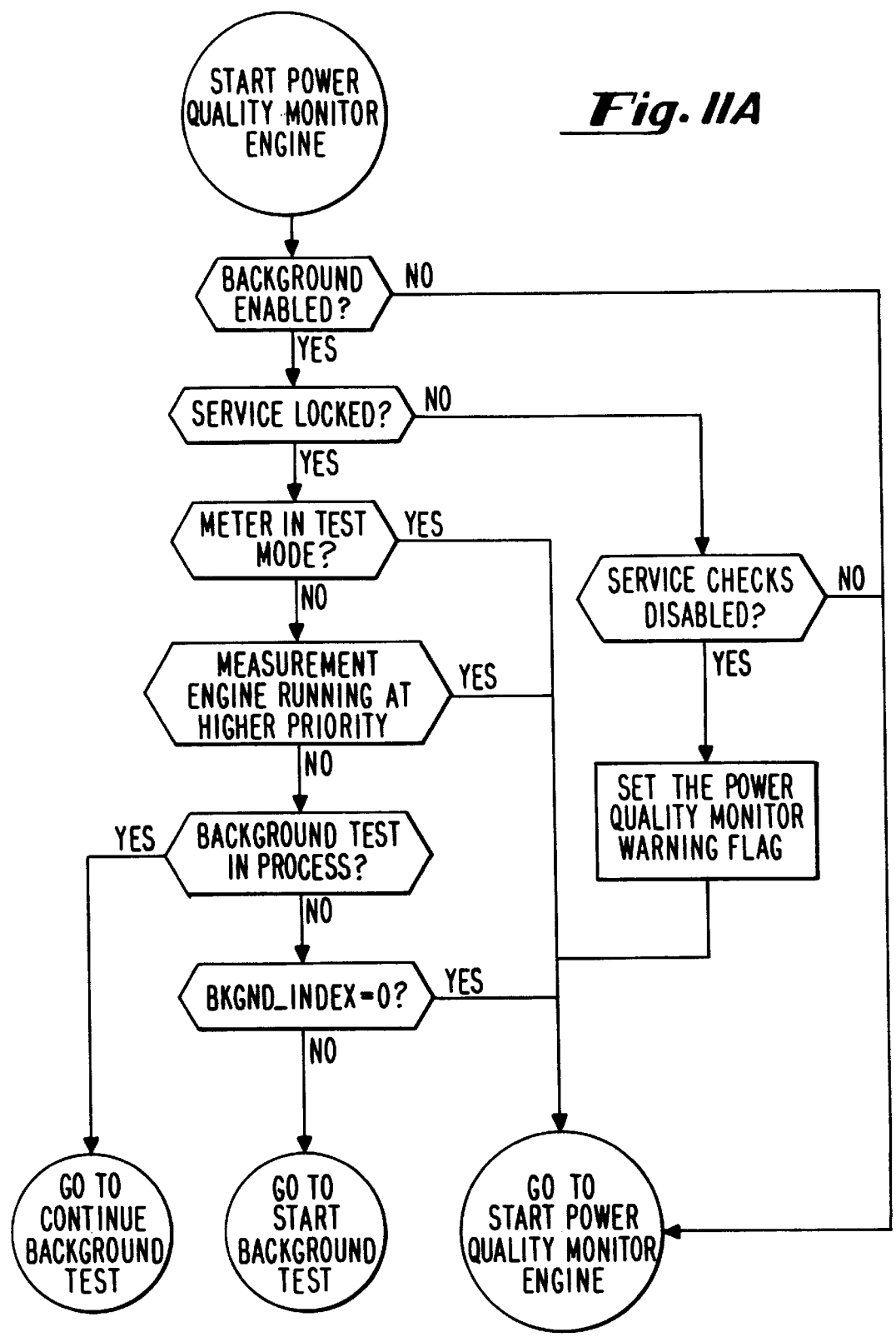
Figures 1, 11B:
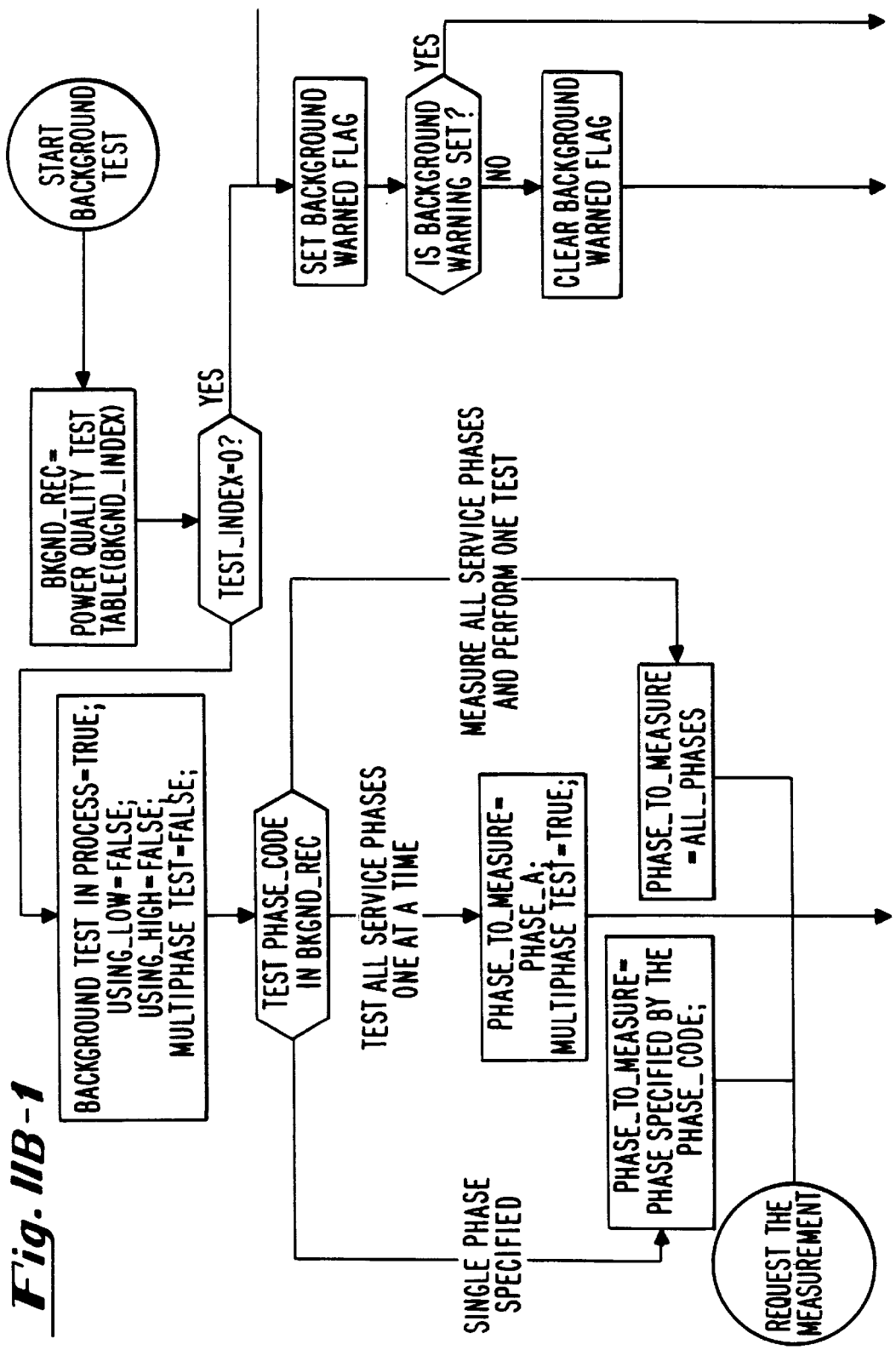
Figures 2, 11B:
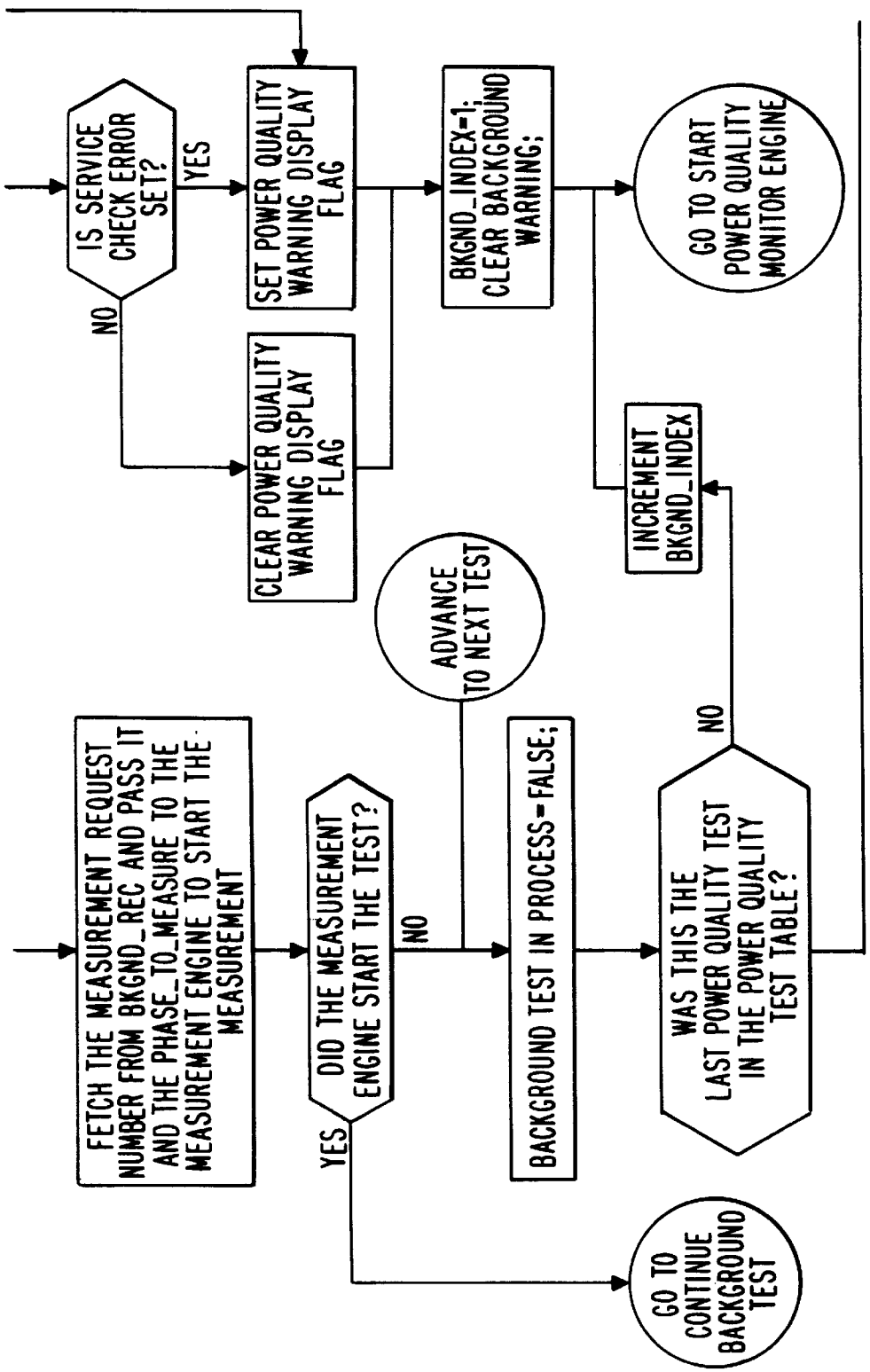
Figure 11C:
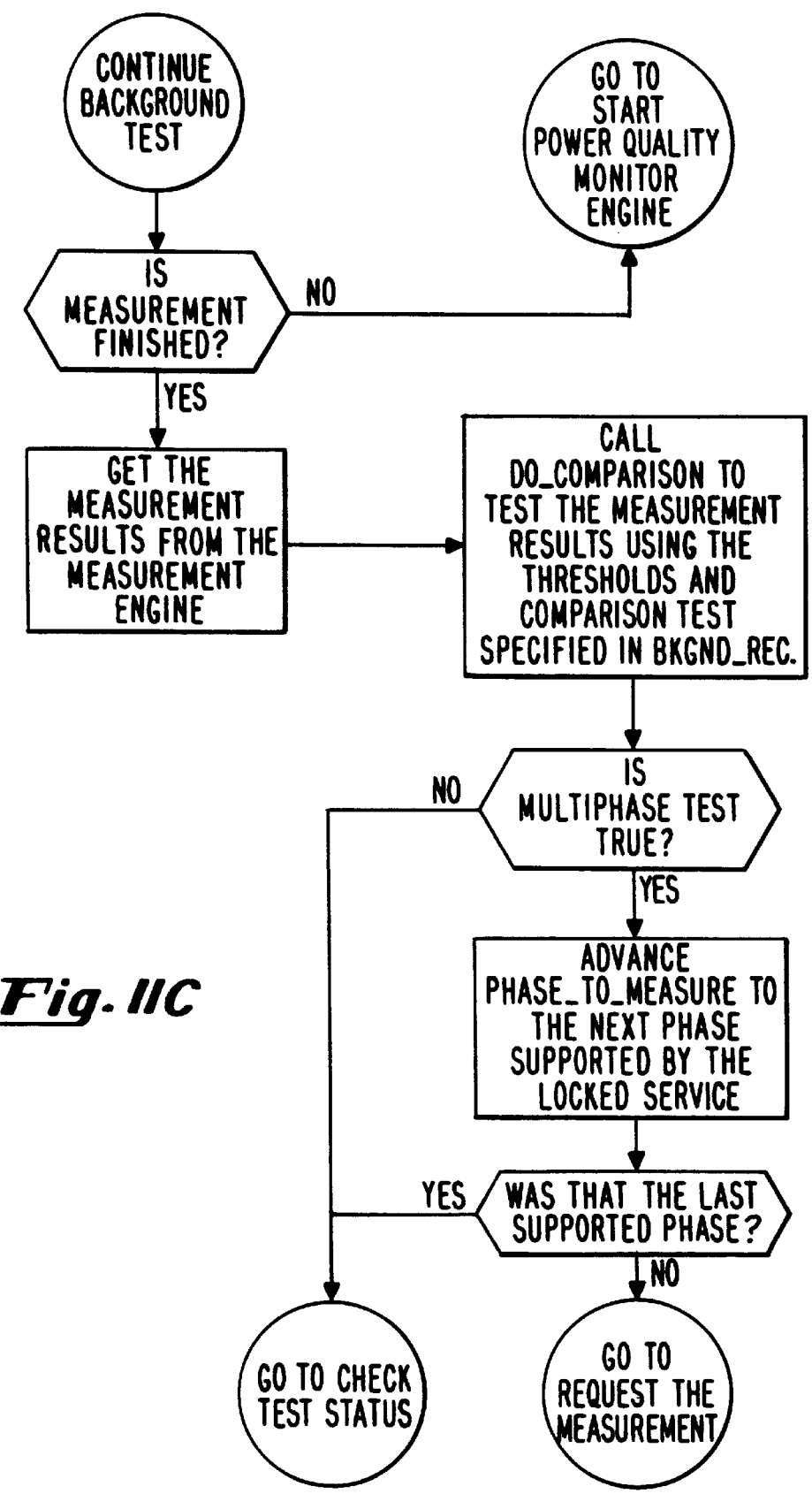
Figure 11D:
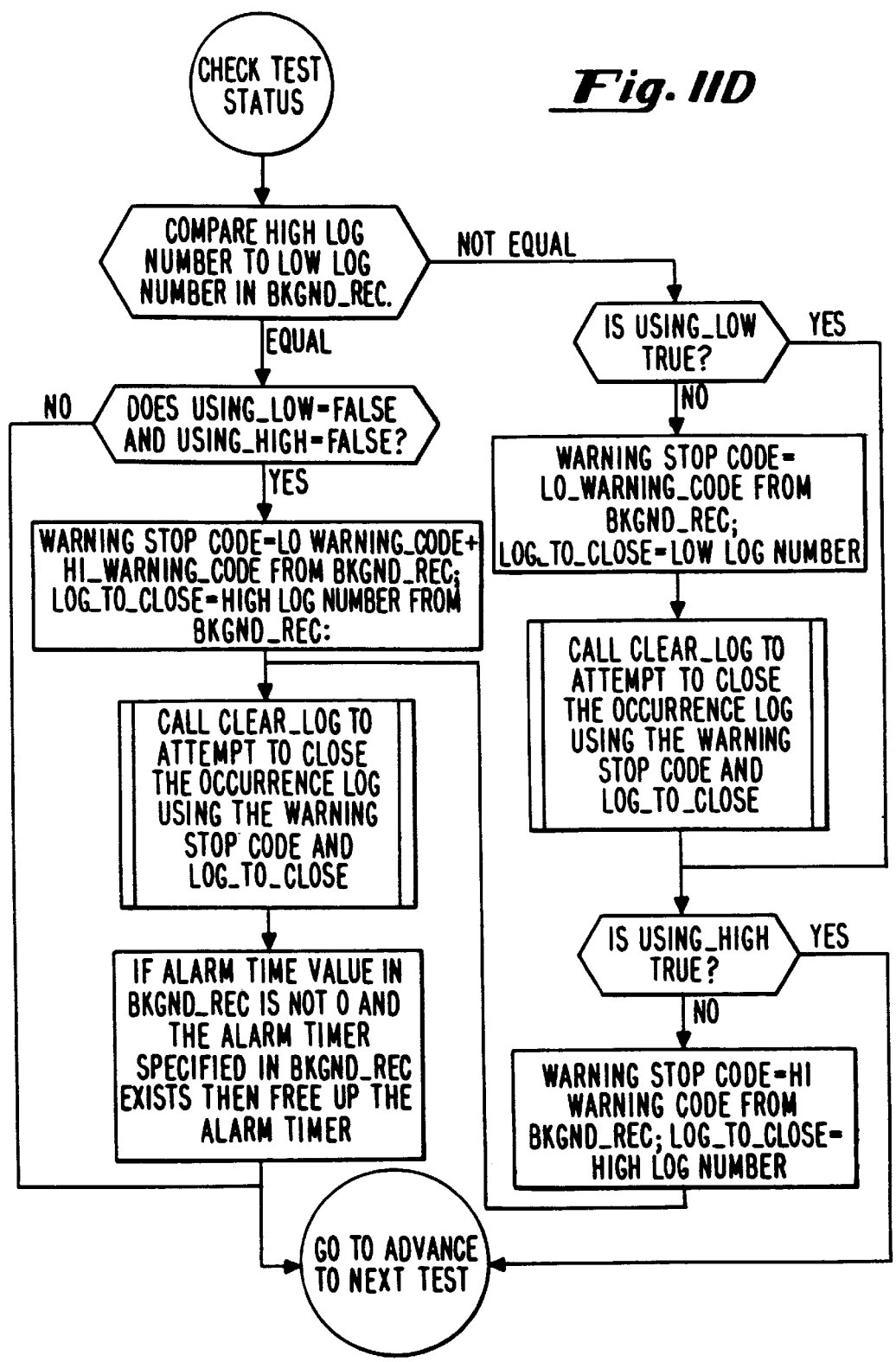
Figure 11E:
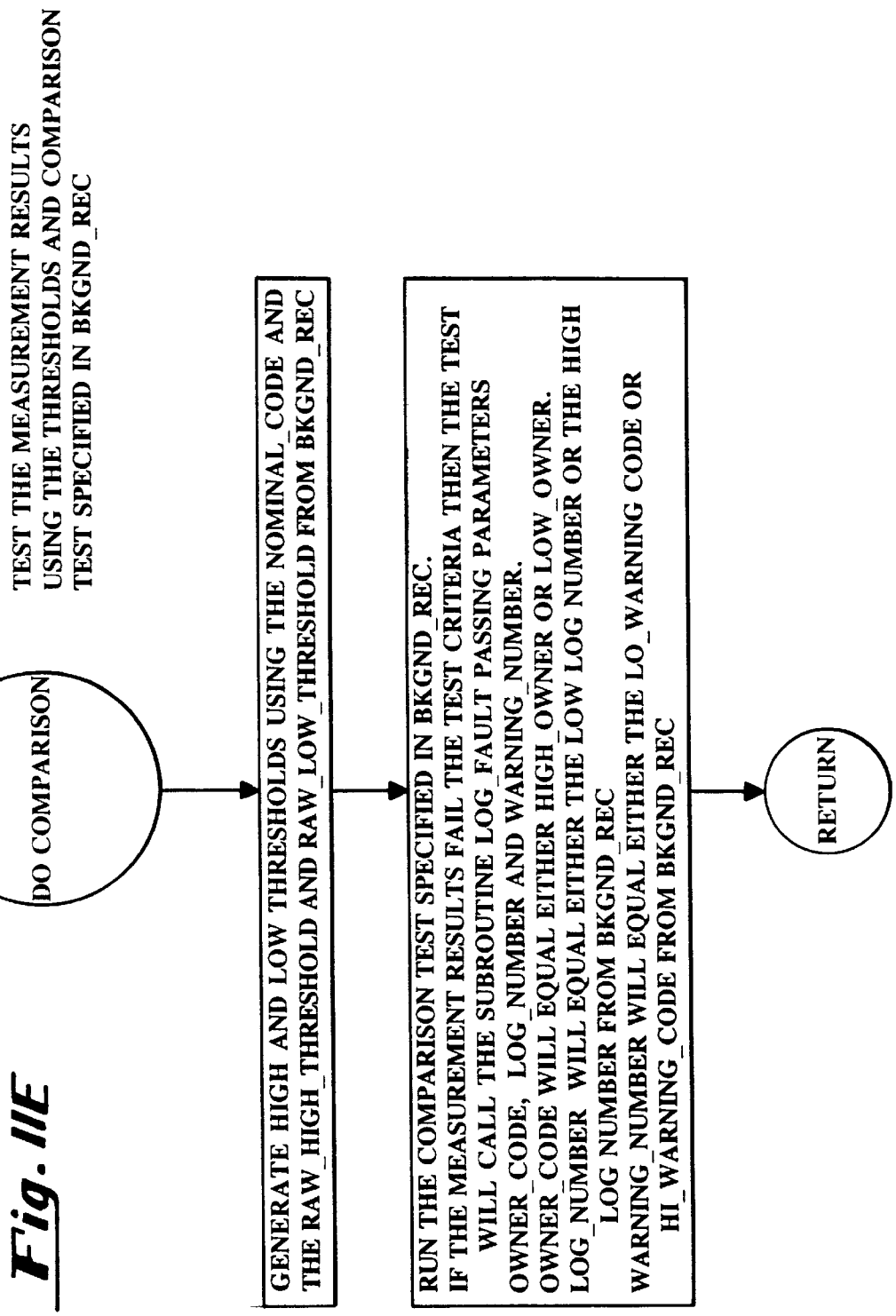
Figure 11F:
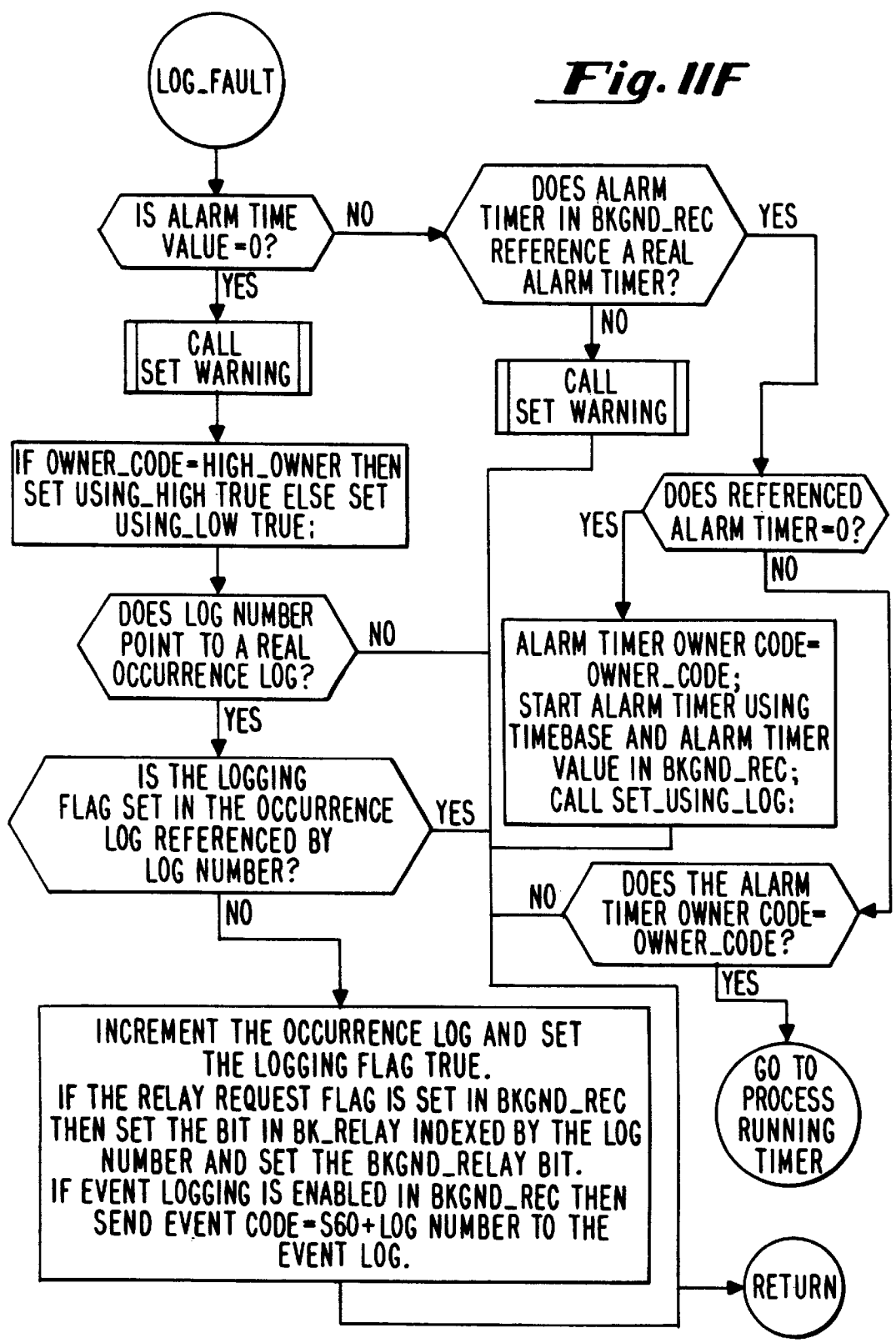
Figure 11G:
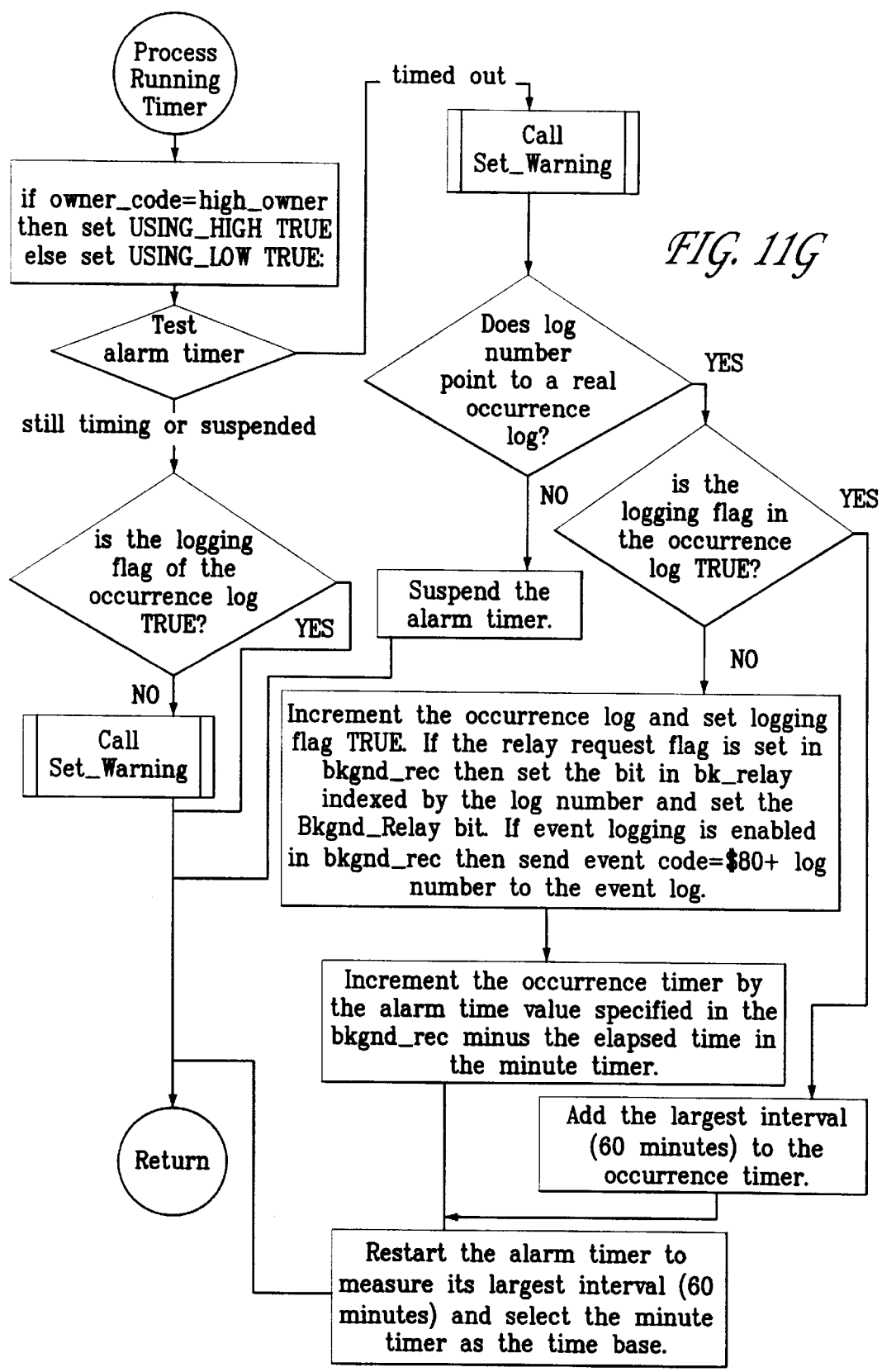
Figure 11H:
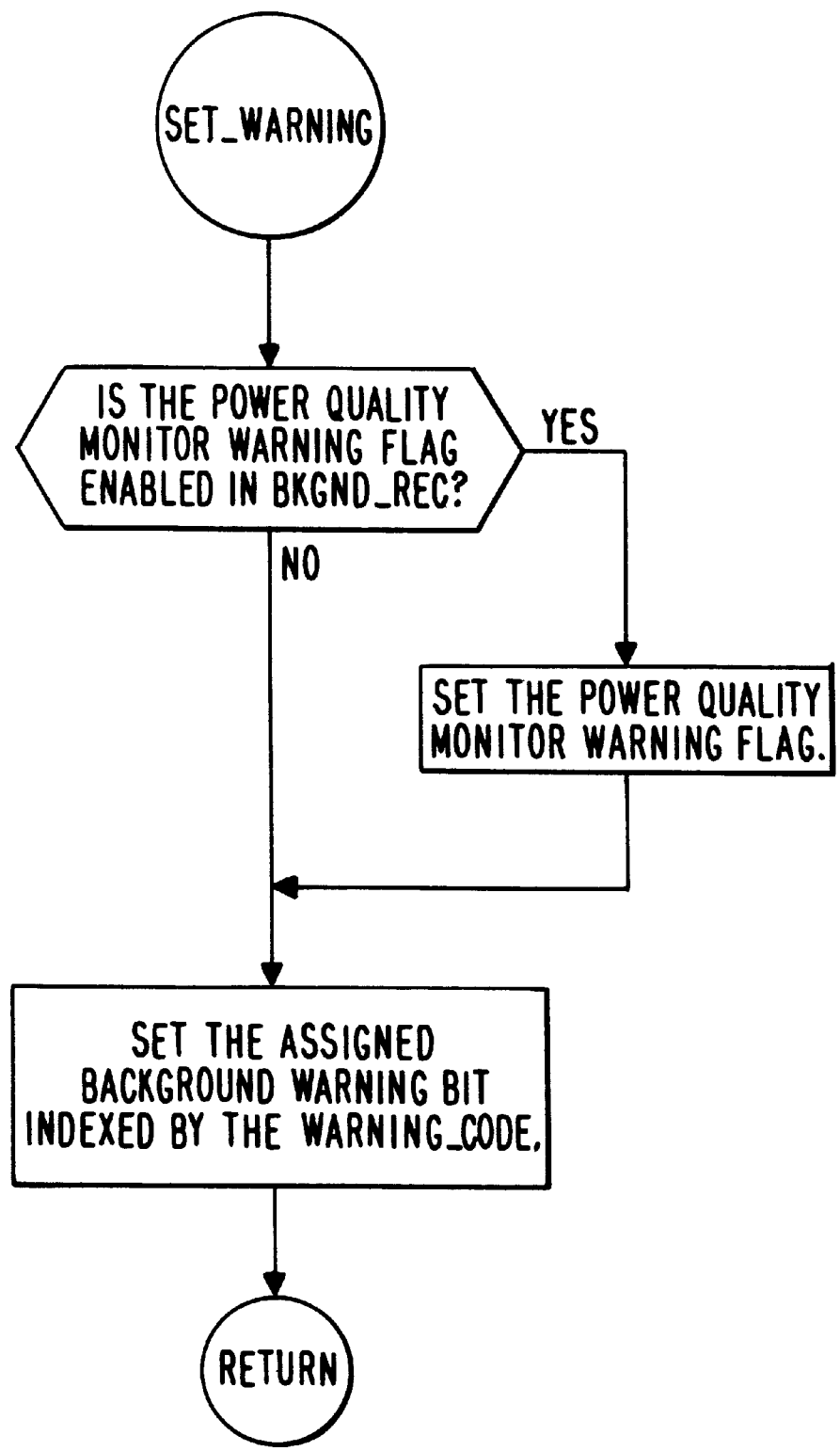

The operation and interactions of the power quality monitor can be better understood from the power quality monitor context diagram shown in FIGS. 9A and 9B, the state diagram in FIGS. 10A and 10B, and the associated flow charts in FIGS. 11A–11I. Before the power quality tests are operational, several conditions are preferably satisfied. If these are not met, the meter continues to poll these conditions to determine when they have been met. The BACKGROUND ENABLED FLAG turns on or off the power quality test feature within the meter, and thus, this flag is set before the tests may be carried out by the meter. As previously stated, the thresholds for many of the power quality tests are defined in terms of the service locked into the meter, thus, the SERVICE LOCKED FLAG is also preferably set. Also, if power quality tests are enabled to run, the service is not locked, and service checks are not permitted to run (disabled), then the meter has not been configured correctly because the service cannot be locked-in. In this condition, a warning should be set. In this invention this is the same warning as is displayed for active power quality monitor events (POWER QUALITY MONITOR WARNING FLAG). Other warnings are also within the scope of the invention. Because the test mode is used when the meter is being verified, service conditions may be abnormal while the various tests are being run. Thus, in accordance with a preferred embodiment of the invention, the power quality tests are disabled while in the test mode (the METER IN TEST MODE FLAG is set). It should be understood however, that the power quality tests may be enabled during test mode operation. Thus in a preferred embodiment, if any of these flags are set, the power quality tests do not run.

In addition, certain conditions can suspend power quality tests while higher priority routines are serviced. Because the power quality tests preferably use the same resources within meter IC 14 as the display or communications routines, the power quality monitor is suspended while measurements for these higher priority routines are performed (MEASUREMENT ENGINE RUNNING AT HIGHER PRIORITY FLAG) and while previous measurements are in-progress (BACKGROUND TEST IN PROCESS FLAG). If the measurement does not successfully complete, an error flag is set (MEASUREMENT ERROR FLAG), and the present invention advances to the next test. This is done so that a measurement error caused by improper configuration or equipment failure does not prevent other power quality monitors from running. When any pending measurements have successfully completed (MEASUREMENT FINISHED FLAG) and the conditions previously described have been met, the power quality monitors are free to start a measurement sample.

Because the time between power quality measurements varies, an ELAPSED SECONDS count and FREE RUNNING MINUTES TIMER is used to provide the time base. The power quality test engine needs to know which test is the next to execute. This is controlled by a pointer to the next record, BKGND_REC, known as BKGND_INDEX. The monitor defines the measurement to make (MEASUREMENT RECORD NUMBER) and the phase or phases to measure (PHASE_TO_MEASURE). Thus the POWER QUALITY MONITOR ENGINE knows the next measurement to perform. (The BKGND_INDEX is normally not 0.) The monitor engine 52 starts the test by setting the BACKGROUND TEST IN PROCESS FLAG to true and clearing other flags that will be used in the engine. The monitor can be run on a single phase specified in the monitor record, on all valid phases performing the test on each phase, or on all valid phases performing the test once on the combination of the phases. The PHASE_CODE in the record is examined and based on its value is assigned to the variable PHASE_TO_MEASURE and for a monitor which tests all valid phases individually, the MULTIPHASE TEST variable is set to true. This information and the MEASUREMENT RECORD NUMBER are provided to the POWER QUALITY MEASUREMENT ENGINE to start the measurement. The POWER QUALITY MEASUREMENT ENGINE provides information on the status of the measurement by setting the MEASUREMENT ERROR FLAG. If the measurement did not start, the power quality monitor engine 52 clears the BACKGROUND TEST IN PROCESS FLAG and the MEASUREMENT ERROR FLAG, and advances to the next power quality monitor.

Because the display warning code can be driven by multiple monitors, a state is needed to check if no events are active. In the present invention, the test index equal to 0 allows for this state. This state could have occurred at other (or multiple) test index numbers. When the test index equals 0, the power quality monitor engine assumes an event is active (BACKGROUND WARNED FLAG set). The assigned background warning flags are examined and if all of those which are intended to drive a display warning (POWER QUALITY MONITOR WARNING FLAG) are clear, the BACKGROUND WARNED FLAG is cleared. If the SERVICE CHECK ERROR FLAG is not set, the POWER QUALITY MONITOR WARNINGS FLAG is cleared. Otherwise, the POWER QUALITY MONITOR FLAG is set. The BKGND_INDEX is now set to 1 and the background warning flags are cleared and waiting to be set at the detection of an event.

When the measurement is complete, the high and low thresholds may need to be computed from the nominal identified in the monitor record. The quantity is compared using the test defined within that power quality monitor record against the raw or computed threshold by the POWER QUALITY MONITOR ENGINE. If the threshold test indicates a possible event (fails the test criteria), the event may need to be qualified against a minimum duration and warnings and other event logging may need to occur. The routine in this invention which determines when and what actions to take is the LOG-FAULT routine. The LOG_FAULT routine is passed the OWNER_CODE which defines if the high or low threshold was exceeded, the LOG_NUMBER which is the log number in the monitor record corresponding to threshold exceeded, and the WARNING_NUMBER which is the warning code in the monitor record corresponding to the threshold exceeded.

In the LOG_FAULT routine, if the minimum duration (ALARM TIME) in the monitor record is 0, the event does not need to be qualified against a minimum duration and can be immediately logged. This is done by checking the monitor record to determine if the POWER QUALITY MONITOR WARNING FLAG should be set (this causes a warning to be displayed on the meter LCD), and the BACKGROUND WARNING BIT assigned in the monitor record is set. Based on the OWNER_CODE, either the USING_HIGH or USING_LOW variable is set to true. These variables are used to identify the owner of the log. If the LOG_NUMBER does not point to a real occupance log, the LOG_FAULT routine can do no more, and thus, returns. If the LOG_NUMBER points to an occurrence log presently in use (LOGGING FLAG set), the routine need not do anything else, and thus returns. If the LOG_NUMBER points to an occurrence log not presently in use, the routine increments the number of event (OCCURRENCE LOG), and sets the LOGGING FLAG. If the RELAY REQUEST FLAG is set in the monitor record, then the BKGND RELAY FLAG is set and it should be noted that this log has set the relay flag (BK_RELAY). This assures that this log has set the relay flag (BK_RELAY) and assures that the BKGND_RELAY gets cleared if all the logs which can set the BKGND_RELAY have ceased to have active events. If event logging (time and date of occurrence in the event log) is enabled in the monitor record, the start condition for this event is generated by adding hex '80' to the log number and sending this event code to the event log routine.

If the minimum duration (ALARM TIME) in the monitor record is not 0, the event needs to be qualified against a minimum duration. The units of the minimum duration (TIMEBASE), minimum duration value (ALARM TIME VALUE), and timer to use to time the minimum duration (ALARM TIMER) are also defined in the power quality monitor record. In the present embodiment, sixteen ALARM TIMERS are available from which to choose. Multiple monitors can use the same timer. However, if the monitor record does not reference a real alarm timer, this qualification cannot occur, and thus, the warnings for the event are set as described above, and the routine returns. If a real alarm timer is referenced, that timer is checked to see if it is 0 (not running). If it is 0, the alarm timer is assigned to the OWNER_CODE. The monitor activating the ALARM TIMER is maintained (OWNER CODE) so that the POWER QUALITY MONITOR ENGINE knows which minimum duration time to compare the alarm timer's ELAPSED TIME against and which monitor can terminate the timing of a condition. The timer is started using the timebase defined in the monitor record. When a timer is started, an ALARM TIMER STATUS is set indicating that the timer is in use. The routine can then return. If the alarm timer is running (timer not equal to zero), an event is presently being timed. If this event (OWNER_CODE) is not the same event as presently timed, the routine returns. Otherwise, based on the OWNER_CODE, either the USING_HIGH or USING_LOW variable is set to true. The alarm timer is tested. If the timer is still timing (LOGGING FLAG True), then the routine returns. If the timer is suspended, indicating that the timer was used to qualify an event but no occurrence log is being used, then the warnings for the event are set as described above and routine returns. If the timer has met the minimum duration requirement (Timed Out), the warnings for the event are set as described above and the LOG_NUMBER is checked. If the LOG_NUMBER points to an occurrence log presently in use (LOGGING FLAG set) then the alarm timer has timed out at least once before and was reloaded to measure its largest possible time interval. In that case, the routine adds the largest interval to the timer to record the elapsed interval and then again restarts the alarm timer to measure its largest interval and select the minute timer as the time base, and returns. If the LOG_NUMBER points to an occurrence log not presently in use, the routine increments the number of events (OCCURRENCE LOG), and sets the LOGGING FLAG. If the RELAY REQUEST FLAG is set in the monitor record, then the BKGND RELAY FLAG is set. Note that this log has set the relay flag (BK_RELAY) which only gets cleared if all the logs which can set the BKGND_RELAY have be ceased to have active events. If event logging (time and date of occurrence in the event log) is enabled in the monitor record, the start condition for this event is generated by adding hex '80' to the log number and sending this event code to the event log routine. The routine then increments the occurrence timer by the alarm time value specified in the monitor record minus the elapsed time in the minute timer, restart the alarm timer to measure its largest interval and select the minute timer as the time base, and returns. Thus, the timers are appropriately started and any warnings have been flagged.

Once any faults are logged, the MULTIPHASE TEST flag is checked. If this is a multiphase test, the PHASE_TO_MEASURE is advanced to the next phase supported by the locked service. If this is not the last phase, the above measurement is repeated on the new phase and the above operation is repeated back to this point. If this was not a multiphase tests or it was the last phase of the multiphase test, the status of the event is checked by the check test status routine.

Since a single power quality monitor test definition can cause multiple phases to be tested and possibly logged, the power quality monitor engine does not attempt to change an occurrence log from logging to not logging or clear an alarm timer until all phases specified by the power quality monitor test have been tested. The check test status routine is responsible for inspecting the test conditions and making the decision to transition from logging and or timing an event into waiting for the next event. This transitioning operation is referred to as closing the log. If the power quality monitor test specifies the same occurrence logs for both high and low events, then if either USING_HIGH or USING_LOW is set, the occurrence log and alarm timer should be left in its present state and Check Test Status returns. If both USING_HIGH and USING_LOW are clear, then Clear_Log is called with parameters warning_stop_code set the occurrence log number. Clear_log performs the transition steps required to close the log specified in log_to_close. If an alarm timer was used by the test, it is cleared in preparation for timing the next occurrence of an event. Check Test Status then returns. If Check Test Status determines that different occurrence logs are specified for high and low events, then conditions will be checked to see if each log can be closed. If USING_LOW is not set, then the low log can be closed. The warning_stop_code will be set to low_warning_code and Clear_Log will be called to insure the low log is closed. After Clear_Log returns or if USING_LOW was true, then USING_HIGH is tested. If USING_HIGH is set, then no further action is required and Check Test Status returns.

Otherwise, the warning_stop_code will be set to the high_warning_code and Clear_Log will be called to insure the high log is closed. At this point, if USING_LOW is clear, then neither high nor low type events are being logged. If an alarm timer was used by the test, it is cleared in preparation for timing the next occurrence of an event. Check Test Status will then return. If USING_LOW is set, then the alarm timer must be left as is and Check Test Status will return.

As previously stated, Clear_Log performs the transition steps desired to close the log specified in log_to_close. The background warning bit indexed by the passed warning code is cleared. If the log_to_close does not point to a real occurrence log, then no ftuther action is required and Clear_Log returns. Otherwise, the occurrence log referenced by log_to_close is closed by insuring that the logging flag is cleared. If an alarm timer was in use by the power quality monitor test, then the elapsed time since the alarm timer was last restarted and the elapsed seconds since the minute timer last rolled over are added to the occurrence timer. If the relay request flag is set for the power quality monitor test, then the relay request flag corresponding to the log_to_close will be cleared. If the relay request flags are determined to be cleared, then the bkgnd relay flag will also be cleared to indicate that no power quality monitor test requires the relay associated with background test to be cleared. If event logging is enabled for the power quality monitor test, then an event code of hex$C0+log_to_close is sent to the event log to record the transition from log open to log closed. Finally, Clear_Log returns.

Thus, in summary, if the condition does not persist for the minimum duration, the ALARM TIMER STATUS is cleared, and the event is not qualified and is treated as if the condition never existed. If the condition persists for the minimum duration, a new ALARM TIMER STATUS is set and a number of meter operations can occur depending on the configuration of the power quality monitor. If the monitor is configured to have an event drive one of the 14 OCCURRENCE LOGs, the OCCURRENCE COUNT is incremented in the appropriate OCCURRENCE LOG and the LOGGING STATUS is set for that LOG. When the event terminates, the ALARM TIMER elapsed time is added to the OCCURRENCE TIME and the logging status is cleared (NOT LOGGING STATUS). If the monitor is configured to drive the EVENT LOG, the start time and date of the event is recorded with the start EVENT CODE in the EVENT LOG. When the event terminates, the end time and date of the event is recorded with the end EVENT CODE in the EVENT LOG. (The EVENT CODE is defined by the Power Quality Monitor number so that the actual monitor causing the event is known, but other methods of assigning the EVENT CODE's could be employed.) If the monitor is configured to drive a specific warning (ASSIGNED BACKGROUND WARNING FLAGS), that defined warning is set in the POWER QUALITY MONITOR WARNING FLAG for the duration of the event. This warning is cleared when the event ends. If the monitor is configured to drive the display warning for power quality monitor events (BACKGROUND WARNING FLAG), this flag is set for the duration of the event. This warning is cleared when all events end which are driving this warning. If the monitor is configured to drive the load control relay, the BKGND RELAY FLAG is set for the duration of the event. This flag is cleared when the event terminates. The relay drive routine monitors this flag and handles the actual driving of the relay. The power quality monitors can configure any combination of these operations.

The meter may be programmed to increment event counters, totalize event times, set warning indicators, latch relays, and log event start and stop times when a measurement fails a test. The tests may be further qualified by timers such that a measurement fails a test for a programmable amount of time (e.g., 1 second to 60 minutes) before the programmed action occurs. Such parameters are stored in the EEPROM 35 in the power quality test table shown in FIG. 3. The power quality test table comprises a preselected set of records. Each power quality test definition specifies the electrical measurement to perform, the phase or phases to test, the type of comparison to perform after the measurement, the value to compare the measurement against, the amount of time that the test must fail before an action is taken, and the action to take in the event that a measurement exceeds a threshold. In a preferred embodiment the records comprise the following field descriptions:

Field 1: Comparison test number—This field is a single index that specifies which of several possible types of comparison tests to perform on the value measured during a given background test and the threshold values specified by the background record.

Field 2: Specifies actions to take if a test against a low threshold fails.

Field 3: Specifies actions to take if a test against a high threshold fails.

Field 4: Initial alarm time value—Specifies the time that a warning condition preferably should exist before a failure is declared. If the value is zero then no time delay will be in effect and warning conditions are consequently logged immediately upon detection.

Field 5: Timer number—Specifies the alarm timer to be used if the initial alarm time value is non-zero.

Field 6: Low log number—Specifies which occurrence log to use to log low warnings, Field 7: High log number—Specifies which occurrence log to use to log high warnings.

Field 8: This field provides the raw data used to compute a high threshold value to test against a background measurement. The field is interpreted as either an Embedded Normal value, an Embedded Percent value or a Percent Above Nominal value depending on the value of the Nominal_Code in field 10.

Field 9: This field provides the raw data used to compute a low threshold value to test against a background measurement. The field is interpreted as either an Embedded Normal value, an Embedded Percent value or a Percent below Nominal value depending on the value of the Nominal_Code in field 10.

Field 10: Specifies the Nominal_Code and the Phase_Code designating either phase A, B or C which are described in more detail below.

Field 11: DSP measurement record index—Specifies the measurement record number needed for the background test to be performed. An index of 0 indicates the end of the background test list if fewer than maximum background tests are defined. Setting any background test index causes that background test and all following tests not be performed. The background test sequence will start again at test 1. Note that setting DSP_Test_Index=0 is one way to disable background tests.

Referring back to FIG. 5, the power quality engine 52 performs the designated comparison test after receiving the measurement 60 from the measurement engine 50. The returned measurement is then tested in accordance with the comparison tests specified by the power quality test record utilizing service specific thresholds 70 which are referenced by the power quality test records. The following lists a few exemplary power quality tests and describes how these tests utilize service threshold information.

PQ Test 1: Abnormal service voltage:—Defined by the Service Test (repeated below)
  Measured voltage phase angles outside a +/−15 degree nominal voltage angle band; and
  Measured voltages outside a +/−10% nominal phase voltage band.
  Duration: Either condition or combination of conditions for greater than 60 seconds.

PQ Test 2: Abnormally low voltage
  Measured voltage less than 6% of nominal service voltage on any phase.
  Duration: Condition on any phase or combination of phases for greater than 60 seconds.

PQ Test 3: Abnormally high voltage
  Measured voltage greater than 6% of nominal service voltage on any phase.
  Duration: Condition on any phase or combination of phases for greater than 60 seconds.

PQ Test 4: Abnormal service current (power factor and reverse power)—Defined by the Service Current Test (repeated below)
  Leading or lagging measured power factor less than 0.25 on single phase and wye services, and 0.00 on delta services,
  Negative measured power (current) on any phase.
  Duration: Either condition or combination of conditions for greater than 5 minutes.

PQ Test 5: Abnormally low service current—Defined by the Service Current Test
  Measured current less than 0.1% of class current on any phase, but not ALL phases.
  Duration: Condition on any phase or combination of phases for greater than 5 minutes.

PQ Test 6: Abnormal power factor
  Measured Power factor less than 0.45 leading or lagging on any phase on single phase and wye services, and 0.2 on delta services.
  Duration: Condition on any phase or combination of phases for greater than 5 minutes.

PQ Test 7: Excess 2nd harmonic current
  Measured 2nd harmonic current greater than 0.5 amperes on any phase.
  Duration: Condition on any phase or combination of phases for greater than 15 minutes.

PQ Test 8: Excess total harmonic current distortion
  Measured total harmonic distortion greater than 30% of fundamental on any phase.
  Duration: Condition on any phase or combination of phases for greater than 60 seconds.

PQ Test 9: Excess total harmonic voltage distortion
  Measured total harmonic distortion greater than 30% of fundamental on any phase.
  Duration: Condition on any phase or combination of phases for greater than 60 seconds.

Based on the outcome of the specified power quality test, one or more power quality resources 76, 78, 80, 82, 84, 86, 88 in FIG. 5 are acted on by the power quality engine as is described in detail below. The individual power quality monitor comparison tests specify how fields 6, 7, 8 and 9 are used. In general, low log numbers indicate the log to use if a test against a low threshold fails. Likewise, the high log numbers are used when testing measurements against high thresholds. This implementation allows a single measurement to be tested against one or more thresholds but defining a single test. With a single log, the statistics about the times the test failed are known. However, for multiple threshold tests, information about which threshold was crossed more often or for longer periods of time is preferably not delineated. The use of two logs supports band type tests where a measurement may be required to be either between two thresholds or outside two thresholds. This allows outcome statistics to be collected for each threshold.

Each power quality test is capable of selecting one value from the service thresholds table shown in FIG. 3. The value selected is considered to be a nominal value to be used to create test thresholds. High and low thresholds are computed by scaling the nominal value up and down by the high and low threshold percent values which are preferably labeled Raw_High_Threshold and Raw_Low Threshold in the power quality test table. The service thresholds table has been implemented as packed array of words or records. The array is indexed by the Nominal_Table_Index. The Nominal_Table_Index is stored in the Nominal_Code_ sub-field of field 10.

As an example, consider a nominal code represented by a five-bit value. If the five bits are considered to represent values from $00 to $1F then: values in the range of $00 to $1C are considered to be word boundary indices into the service thresholds table; the value $1D is used to specify that the special six byte value bk_factor should be used as the nominal value; the value $1E is used to specify that the high and low thresholds should be generated by treating the high and low threshold percent values as packed word values for the high and low thresholds that each represent the range of 0 to 100 percent; the value $1F is used to specify that the high and low thresholds should be generated by treating the high and low threshold percent values as packed word values for the high and low thresholds that each represent the range of 0 to 1. In a preferred, embodiment computes and stores the thresholds using forty-eight bit arithmetic with sixteen bits of resolution to the right of the binary point.

Field 10 also contains a three bit sub-field called Phase_ Code to indicate the phases the power quality test shall test. The values of the Phase_Code field are defined as follows:
  Phase_Code=0 . . . 7
  0=Test Phase A measurement
  2=Test Phase B measurement
  4=Test Phase C measurement
  1=Measure all service phases and perform one test on the result
  7=Test all service phases one at a time.

The power quality monitor engine is responsible for interpreting the Phase_Code field and constructing correct measurement requests to the power quality measurement engine.

Referring back to FIGS. 10A and 10B, each power quality test will be in a state that depends on whether or not an alarm timer is allocated to the test, whether or not an occurrence log is allocated to the test, and on the condition being monitored relative to programmable test limits.

If no alarm timer or occurrence log is assigned to a power quality test, then the power quality test will either be in state s1 or s2. The power quality test will be state s1 as long as the measurement defined for the test passes the test. If a measurement defined for the test fails, then the test the warning bit assigned to the power quality test will be set, the power quality monitor warning flag will be set if programmably enabled for the power quality test, and the power quality test will be in stated s2. The power quality test will remain in state s2 until the measurement defined for the test passes and the power quality test returns to state s1. During the transition to state s1, the warning bit assigned to the power quality test will be cleared.

If no alarm timer is assigned to a given power quality test but an occurrence log is assigned, then the power quality test will either be in state s3 or s4. The power quality test will be in state s3 as long as the measurement defined for the test passes the test. While in state s3, if a measurement defined for the test fails the test, then the warning bit assigned to the power quality test will be set, the power quality monitor warning flag will be set if programmably enabled for the power quality test, the occurrence log logging flag will be set, the binary occurrence log will be incremented, a relay request flag corresponding to the occurrence log number will be set, if programmably enabled, to request the load control relay be actuated, a power quality monitor start event code corresponding to the occurrence log number will be sent to the event log if programmably enabled, and the power quality test will be state s4. The power quality test will remain in state s4 until the measurement defined for the test passes and the power quality test returns to state s3. During the transition from state s4 to s3, the warning bit assigned to the power quality test will be cleared, the relay request flag corresponding to the occurrence log number will be cleared, if programmably enabled, to indicate that this power quality test does not require actuation of the load control relay and the occurrence log logging flag will be cleared.

If an alarm timer is assigned to a given power quality test but an occurrence log is not assigned, then the power quality test will either be in state s5, s6 or s7. The power quality test will be in state s5 as long as the measurement defined for the test passes the test. If a measurement defined for the test fails the test, then the alarm timer assigned to the power quality test will be programmed with the alarm time value defined for the power quality test. The power quality test will transition to state s6 and shall remain in this state until either the measurement defined for the test passes or until the alarm timer times out. If the measurement for the test passes then the alarm timer will be disabled and the power quality test will return to state s5. If the alarm timer times out while in state s6, then the warning bit assigned to the power quality test will be set, the power quality monitor warning flag will be set if programmably enabled for the power quality test, the alarm timer will be disabled, and the power quality test will transition to state s7. The power quality test will remain in state s7 until the measurement defined for the test passes and the power quality test transitions to state s5. During the transition from states s7 to s5, the warning bit assigned to the power quality test will be cleared and the power quality monitor warning flag will be cleared if programmably enabled for the power quality test.

If an alarm timer and an occurrence log is assigned to a given power quality test, then the power quality test will either be in state s8, s9 or s10. The power quality test will be in state s8 as long as the measurement defined for the test passes the test. If a measurement defined for the test fails the test, then the alarm timer assigned to the power quality test will be programmed with the alarm time value defined for the power quality test. The power quality test will transition to state s9 and shall remain in this state until either the measurement defined for the test passes or until the alarm timer times out. If the measurement for the test passes, then the alarm timer will be disabled and the power quality test will return to state s8. If the alarm timer times out while in state s8, then the warning bit assigned to the power quality test will be set, the power quality monitor warning flag will be set if programmably enabled for the power quality test, the occurrence log logging flag will be set, the binary occurrence log will be incremented, the relay request flag corresponding to the occurrence log number will be set, if programmably enabled, to request the load control relay be actuated, a power quality monitor start event code corresponding to the occurrence log number will be sent to the event log if programmably enabled, the alarm time value will be added to the occurrence timer, the elapsed seconds of the free running minute timer will be subtracted from the occurrence timer, the alarm timer will be restarted to measure its maximum elapsed time (sixty minutes in the preferred embodiment using the free running minute timer as the alarm timer's time base), and the power quality test will transition to state s10. The power quality test will remain in state s10 until the measurement defined for the test passes or until the alarm timer times out. If the alarm timer times out while the power quality test is in state s10, then the maximum elapsed time that the alarm timer has measured will be added to the occurrence timer and the alarm timer will be reloaded to measure its maximum elapsed time. If the measurement passes the test while the power quality test is in stated s10, then and the power quality test transitions to state s8. During the transition from state s10 to s8, the warning bit assigned to the power quality test will be cleared, the relay request flag corresponding to the occurrence log number will be cleared, if programmably enabled, to indicate that this power quality test does not require actuation of the load control relay, the power quality monitor warning flag will be cleared if programmably enabled for the power quality test, the elapsed time since the alarm timer was reprogrammed will be added to the occurrence timer.

The purpose of subtracting the elapsed seconds of the free running minute timer from the occurrence timer during the transition to state s10 and later adding the elapsed seconds of the free running minute timer to the occurrence timer during the transition to state s8 is to enable the use of a single free running minute timer as a time base to multiple alarm timers running asynchronously with respect to each other while maintaining the time measurement accuracy and resolution of the free running minute timer's timebase.

C. Service Identification

Figure 12:
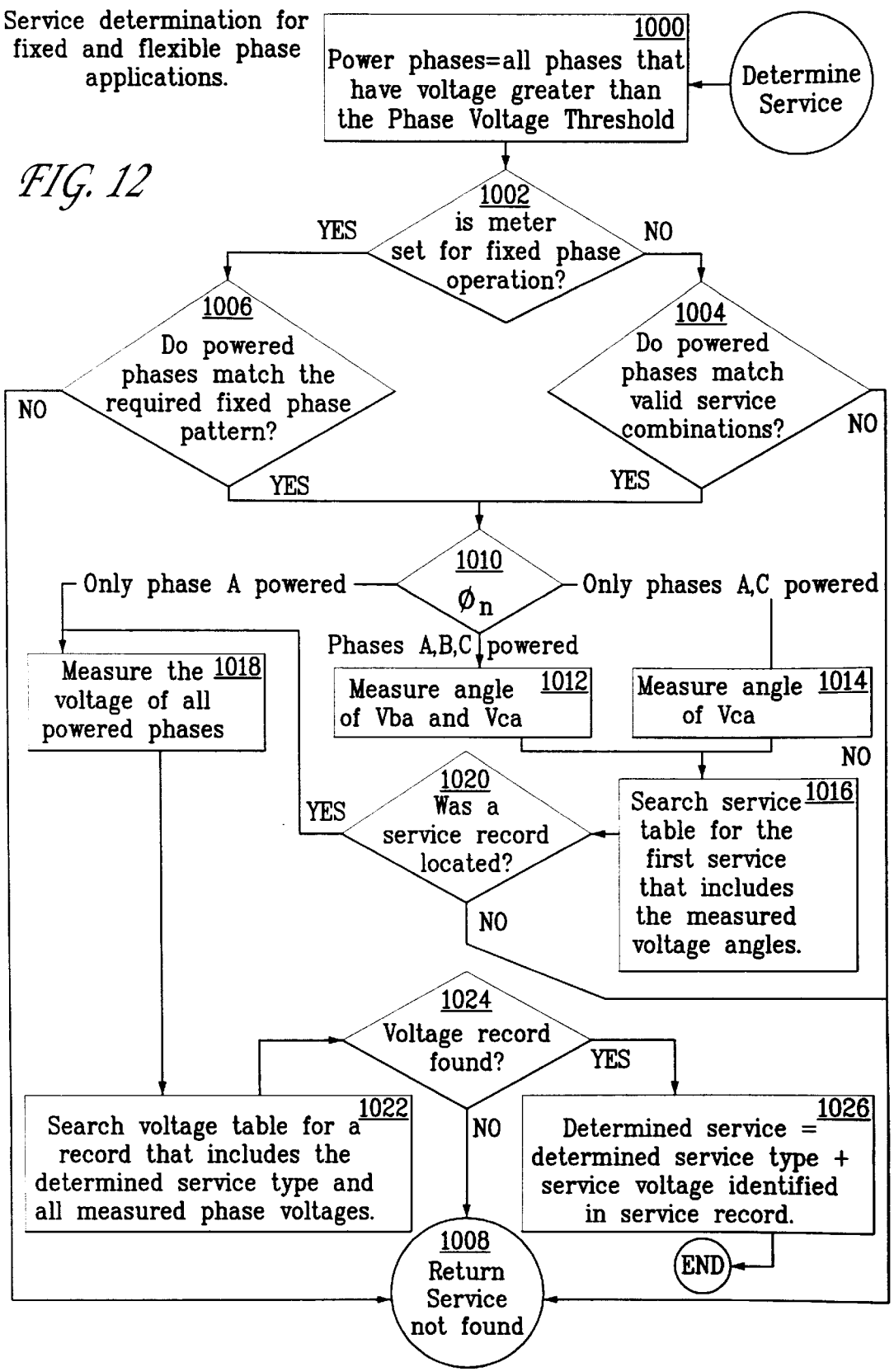
FIG. 12 is a flow diagram showing the steps carried out by an exemplary microcontroller in accordance with the present invention to automatically and electronically identify the service definition.

FIG. 12 is a flow diagram showing the steps carried out by the microcontroller 16 in accordance with the present invention to automatically and electronically identify the service. At 1000, the DSP outputs which drive the phase potential indicators (FIG. 2) are to check. In a preferred embodiment, phases having an associated output with a high signal level are determined to be powered.

Information representing the meter element configuration is preferably stored in a predefined memory location in the EEPROM 35. In a preferred embodiment, information indicating whether the meter must utilize all of the elements is also stored in a memory location in the EEPROM 35. The meter element configuration refers to how many and which phase voltages and currents the meter is capable of measuring. At step 1002, the microcontroller 16 checks the meter element configuration data stored in the EEPROM 35 to determine whether the maximum meter elements must be used or whether a lesser number of elements can be used. If the maximum meter elements must be used, then at 1006 the microcontroller 16 determines whether the correct phases are available, i.e., the phases present match the phases identified by the meter element configuration data. If the correct phases are not available, no service is determinable.

If the maximum number of elements is not required as determined at 1002, then the microcontroller 16 checks for valid configurations such as single phase on phase A, two-phase (present on phases A and C), and three-phase services at 1004. Other configurations are preferably deemed invalid.

If no service is determinable or if the configuration is invalid, then at 1008 the unknown service code, e.g., "NONE", is stored in RAM in connection with the service type status information which is referred to herein as the service byte.

At step 1010, the microcontroller 16 determines whether the service is a single phase, two-phase, or three-phase service. When the service is two-phase service, the angle for Vca (the phase angle between phase C and phase A) is measured. When the service is a three-phase service, phase angles Vba (the phase angle between phase B voltage and phase A voltage) and Vca are measured. In a preferred embodiment, the voltage phase angles are measured using a DFT technique referenced to zero-crossing of Va.

As discussed above in connection with FIG. 3, a service angle table is stored in the EEPROM 35. The service angle table, which is described in detail below, generally includes records with a service byte and nominal phase angles for phase C and B. The service byte is the first byte in the service record and defines the services to which the entry applies. For example, the service byte format may be represented as follows:

Bit 7: spare—not used.
Bit 6: cba—defines that cba rotation is a valid rotation.
Bit 5: abc—defines that abc rotation is a valid rotation.
Bit 4:4 wd—4 wd service; 1=4WD, 0=not 4WD.
Bit 3:4 wy—4 wy service; 1=4WY, 0=not 4WY.
Bit 2:3 wy—3 wy service; 1=3WY, 0=not 3WY.
Bit 1:3 wd—3 wd service; 1=3WD, 0=not 3WD.
Bit 0:1 p—single phase service; 1=1P, 0=not 1P.

The nominal phase angles are preferably in 2-byte format represented in binary in 0.01 degree increments. The microcontroller 16 at step 1016 searches the service phase table record-by-record for the first service that includes the measured voltage angles. This process is described in detail below. If a service phase angle record is found for the measured phase angles at step 1020, the service byte is defined to identify the phase rotation and service type corresponding to that record. Otherwise, no known service is found, e.g., service byte="NONE", as shown at step 1008.

When the service byte has been defined, either because the service was determined to be a single phase service at step 1010 or through the table search technique described in connection with steps 1016 and 1020, the service test continues at step 1018. At step 1018, each phase voltage that is present is measured. Using these measurements, the microcontroller 16 searches the service voltage table 118 (described in connection with FIG. 3) at step 1022 for a record that includes the service type identified by the service byte and each measured phase voltage. In a preferred embodiment, the records in the service voltage table 118 may include a service definition byte identifying possible services and scaling information, information identifying the nominal service voltage, information identifying the programmable potential indicator threshold to be used with the service, and information identifying each of the maximum and minimum tolerances with respect to the nominal service voltage.

Once the phase voltages are measured, the records are searched to determine whether the measured voltages are within the defined tolerance range for the phase and service type. If the voltages are valid, as determined at step 1024, then the nominal voltage will be returned. The service voltage record search must repetitively find a service voltage record that matches the service designated by the service byte. The high and low tolerances corresponding to the nominal voltage in the service voltage record are preferably based on a minimum and maximum percent of the service voltage. All voltages for the service preferably fall within the thresholds. Note that some service types may require that phase A, B and C limits be scaled. The voltage test procedure as well as the fields of the service voltage table records is described in more detail below.

If a voltage test record is not identified at step 1024 as a matching record, then the service byte is defined as "NONE" and the service nominal voltage is set to zero at step 1008. If a voltage test record is identified at step 1024, then the service byte and service voltage identified by the matching record is returned and stored in RAM.

Figure 13:
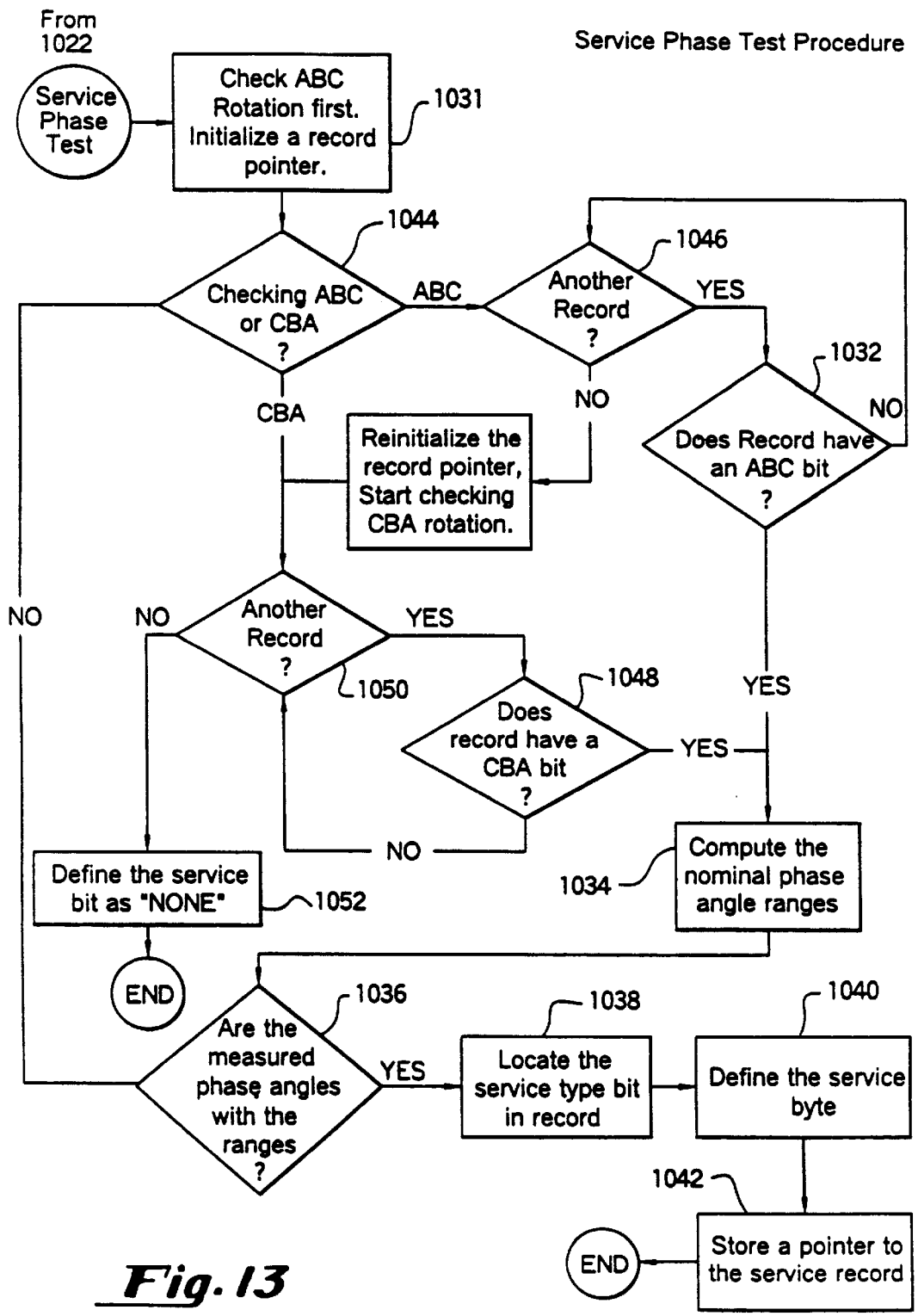
FIG. 13 is a detailed flow diagram showing an exemplary service phase table search in accordance with the present invention.

FIG. 13 is a detailed flow diagram showing an exemplary service phase table search procedure in accordance with the present invention. This procedure is best illustrated by reference to the Service Phase Table definition set forth below:

```
;***************************************************
;
;00 00 00 00 00 00     ; header spares ;09 CC4 ; eephase_tolerance 25 degrees * 100 = 2500 = $09C4
;05 dc  ; eephase_tolerance 15 degrees * 100 = 2500 = $05dc
;37     ; Not used ; service_test; record definition
;                            service information byte   na, cba, abc, s4wd, s4wy, s3wy, s3wd, s1p
; |                       c_nom phase c nominal angle * 100: high, low
; |   |              b_nom   phase b nominal angle * 100: high, low
; |   |   |
; |   _|_ _|_        service information byte column: 4   3   2   1   0
; |  |  |  |  |  index         na, cba, abc, s4wd, s4wy, s3wy, s3wd, s1p
 21 00 00 00 00 ; 1 1ph          0   0   1   0    0    0    0    1
 ;
 62 75 30 17 70 ; 2 3WD ABC, CBA: 0   1   1   0    0    0    1 0
                ; phC:
                ;  300*100 = $7530
                ; phB:
                ;  60*100 = $1770
                ;
 70 69 78 46 50 ; 3 4WD ABC, CBA: 0   1   1   1    0    0    0 0
                ; phC:
                ;  270*100 = $6978
                ; phB:
                ;  180*100 = $4650
                ;
 6C 5D C0 2E E0 ; 4 3WY, 4WY ABC, CBA: 0 1 1 0  1    1    0 0
                ; phC:
                ;  240*100 = $5DC0
                ; phB:
                ;  120*100 = $2EE0
                ;
 21 46 50 46 50 ; 5 1 ph 180 degree   0   0   1   0    0    0    0 1
                ;
 00 00 00 00 00 ; 6 spare             0   0   0   0    0    0    0 0

;***************************************************
;
```

The phase angle tolerances are preferably stored in EEPROM in advance as indicated. The record definition includes a "service information byte" which in the preferred embodiment includes the bit definition as indicated above. Specifically, bit 7 is empty, bit 6 defines a cba phase rotation, bit 5 defines an abc phase rotation, and bits 4–0 define different service types. Each record in the service phase table includes a different service information byte.

Referring back to FIG. 13, the first record in the service angle table is checked at 1032 to determine whether the service information byte includes an abc rotation bit. If so, the nominal phase angle range is then computed at 1034 for phase C and phase B if those phase are present. The phase angle computations are preferably carried out by adding the tolerance specified for the appropriate phase to the phase angle specified in the record to obtain the upper angle limit for the phase and subtracting the tolerance from the phase angle specified to obtain the lower limit for the phase. For example, referring to the Service Angle Table above, assume the tolerance to be 25 deg. Considering the first listed record, to determine the phase angle range to compare the measure phase angle for phase C, the following computations are carried in hex:

upper limit=7530+05 dc or in decimal 300 deg.+25 deg.

lower limit=7530+05 dc or in decimal 300 deg.-25 deg.

If the measured phase angles are within the ranges computed as determined at 1036, the first service bit=1 going from left to right in the service information byte is identified as the service at 1038. For example, considering the first record in the Service Angle Table above, the first service bit in the service information byte corresponds to a 3-wire delta type service. The service byte is then updated to define the 3-wire delta service at step 1040. A pointer is then preferably stored to identify the service angle record at step 1042.

If the measured phase angles were not determined to be within the computed ranges at 1036, then the next record with an abc rotation bit in the service information bit is located by carrying out steps 1044, 1046, and 1032. Therefore, each record with an abc rotation bit is checked for matching phase angle measurements until either a match is found and the service defined, or until no more records are available to check as determined at step 1046. When no more records are available, the cba rotation bit of the service information byte of each record is similarly checked via steps 1044, 1050, 1048. If a record with a cba rotation bit includes angle ranges that matches the measured ranges as determined at step 1036, then the service bit is located at step 1038, the service defined at step 1040, and a pointer set to the record at 1042. If no record with a cba rotation bit matches the measured phase angles as determined at 1036, then the service in the service byte is defined as "NONE" at 1052.

Figure 14:
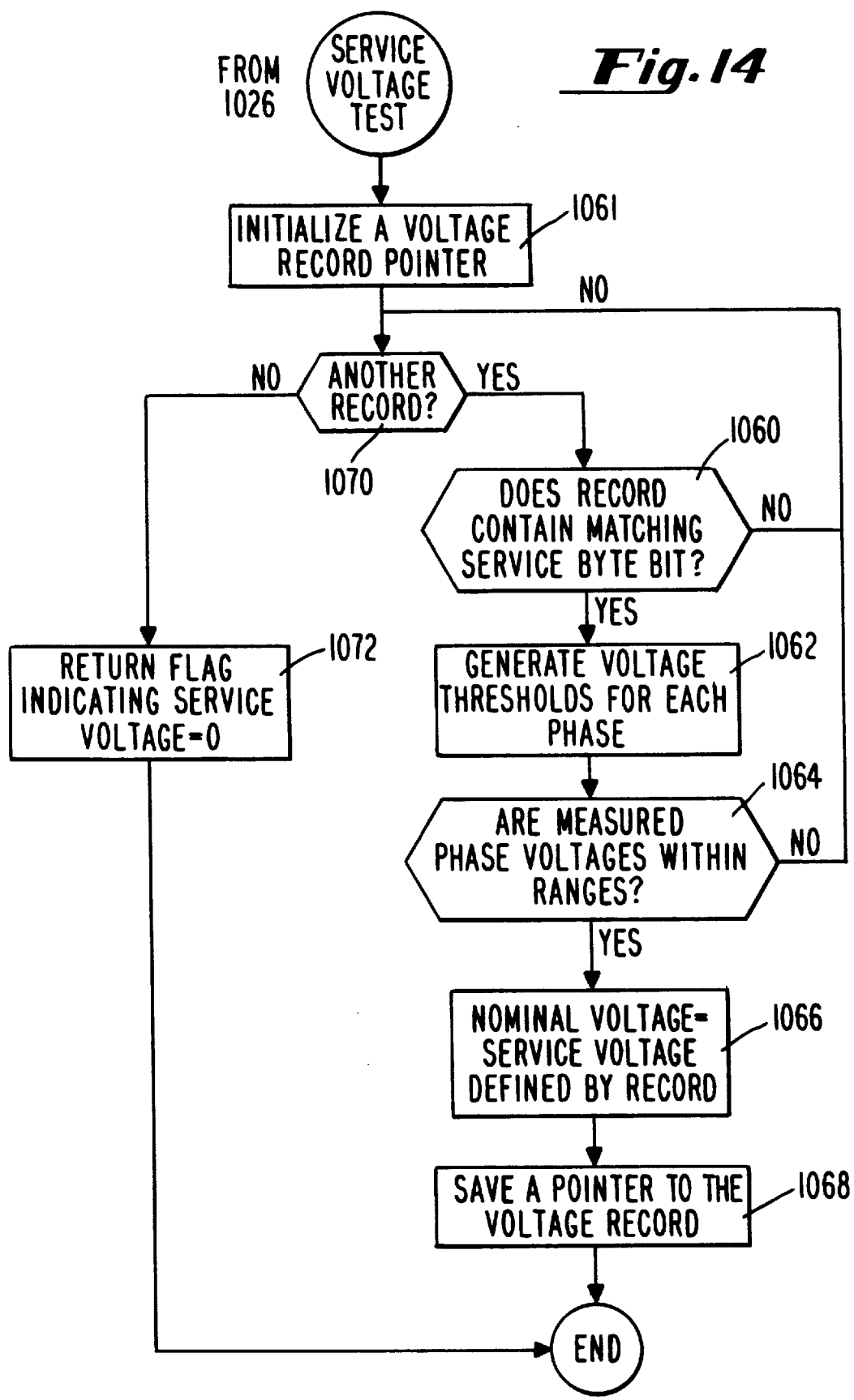
FIG. 14 is a detailed flow diagram showing an exemplary service voltage table search in accordance with the present invention.

FIG. 14 is a detailed flow diagram showing an exemplary service voltage table search procedure in accordance with the present invention. This procedure is best illustrated by reference to the Service Voltage Table definition set forth below:

```
;***************************************************
; voltagetest
;
;                         vservice ab.5, c.5,c.86, s4wd, s4wy, s3wy, s3wd, s1p
;|                 _____vnominal
;|        |        ____Pl    (7 bit dsp format: low byte, high byte
;|        |        |    ____vmax_percent
;|        |        |    |    ___vmin_percent
;|   _|_ _|_ _|_ |
;|   | || || ||| _|_        ab.5, c.5, c.86, s4wd, s4wy, s3wy, s3wd, s1p
;|   | || || |||             |   |    |     |     |     |     |     |
 0D 02 B5 3D 0A 19 9A E6 66  ; 0  0    0     0     1     1     0     1

;1 1P, 4WY, 3WY
; 69.3V, PI = 55V = 0A3D in dsp format.
; -10%, +10%

0F 04 B0 25 12 19 9A E6 66  ; 0  0    0     0     1     1     1     1

;2 1P, 4WY, 3WY, 3WD
; 120V, PI = 96V = 1225 in dsp format.
; -10%, +10%

B0 09 60 4B 24 19 9A E6 66  ; 1  0    1     1     0     0     0     0

;3 4WD
; 240V, PI = 192V = 244B in dsp format.
; -10%, +10%

03 09 60 4B 24 19 9A E6 66  ; 0  0    0     0     0     0     1     1

;4 1P, 3WD
; 240V, PI = 192V = 244B in dsp format.
; -10%, +10%

B0 12 C0 4B 24 19 9A E6 66  ; 1  0    1     1     0     0     0     0

;5 4WD
; 480V, PI = 192V = 244B in dsp format.
; -10%, +10%

0D 0A D2 0E 2A 19 9A E6 66  ; 0  0    0     0     1     1     0     1

;6 1P, 4WY, 3WY
; 277V, PI = 221V = 2A0E in dsp format.
; -10%, +10%

03 12 C0 16 49 19 9A E6 66  ; 0  0    0     0     0     0     1     1

;7 1P, 3WD
; 480V, PI = 384V = 4916 in dsp format.
; -10%, +10%

C1 09 60 25 12 19 9A E6 66  ; 1  1    0     0     0     0     0     1

;8 1P
; 240V, PI = 96V = 1225B in dsp format.
; -10%, +10%

00 01 01 01 01 19 9A E6 66  ; 0  0    0     0     0     0     0     0
                             ;
 00 01 01 01 01 19 9A E6 66  ; 0  0    0     0     0     0     0     0

60              ; checksum
;***************************************************
```

As indicated above, each record of the Service Voltage Table preferably includes a 1-byte field referred to as the voltage service byte, a 2-byte field representing the nominal voltage for the service, a 2-byte field representing the programmable potential indicator threshold to be used in connection with the service, a 2-byte field representing a factor (>1) to multiply the nominal voltage to arrive at the maximum threshold on the nominal voltage range for the service, and a 2-byte field representing a factor (<1) to multiply the nominal voltage to arrive at the miinimnum threshold of the nominal voltage range for the service. The voltage service byte preferably includes the following bit definition:

bits 7, 6, 5:

100=ab.5=scale A and B voltages by 0.5

010=c.5=scale C voltage by 0.5

001=c.866=scale C voltage by 0.866

011=2b=scale B voltage by 2 bits 4–0: Each bit represents a different electrical service.

Referring to FIG. 14, the search procedure begins after a service is identified by the service angle search procedure. Each record of the service voltage table is checked at 1060 to determine whether the voltage service byte field includes a bit matching the same service identified in the service byte, e.g., bit 1 in the voltage service byte and the service byte=1 defining the 3-wire delta service. If a match is found at step 1060, the nominal voltage ranges designated by that record are computed at 1062. For example, the nominal voltage field data is multiplied by the vmax percent field data (1+vmax percent) and then scaled according to bits 7, 6, and 5 of the voltage service byte to arrive at the upper threshold for the nominal voltage range. Similarly, the nominal voltage field data is multiplied by the vmin percent field data (1 vmin percent) and then scaled according to the scaling information contained in the voltage service byte to arrive at the lower threshold for the nominal voltage range. As a specific example, consider the third listed record in the Service Voltage Table set forth above. The nominal phase voltage is designated in hex as "0960," the vmax percent is designated in hex as "199A," and the voltage service byte service bits indicate that phases A and B should be scaled by 0.5 and phase C should be scaled by 0.86. Thus to arrive at the upper threshold, the following computation is carried out:

0960 multiplied by (1+199A/FFFF)

Each measured phase voltage is then compared to the computed nominal voltage range associated with the same phase at step 1064 to determine whether or not the measured phase voltages "match," i.e., fall within the nominal range. If the measured voltages match the nominal ranges, then the service byte is defined as the current service definition at 1066 and a pointer is set to the current service voltage record at step 1068. If the measured voltages do not match the nominal voltage ranges then, the procedure continues by checking whether or not more records are available in the service voltage table at 1070. The same steps are carried out for each record until either a valid service is found or until no more records exist to check in the service voltage table. If no valid service is identified and all of the records have been checked the service byte returns "NONE" to indicate that no valid service was identified by the service test at 1072.

As discussed above, the power quality tests require service-dependent thresholds and other data. For this reason, it is important that the correct service definition be locked into the meter. It should be understood that power quality testing and flicker processing cannot be enabled until a valid service is identified and locked.

Figure 15:
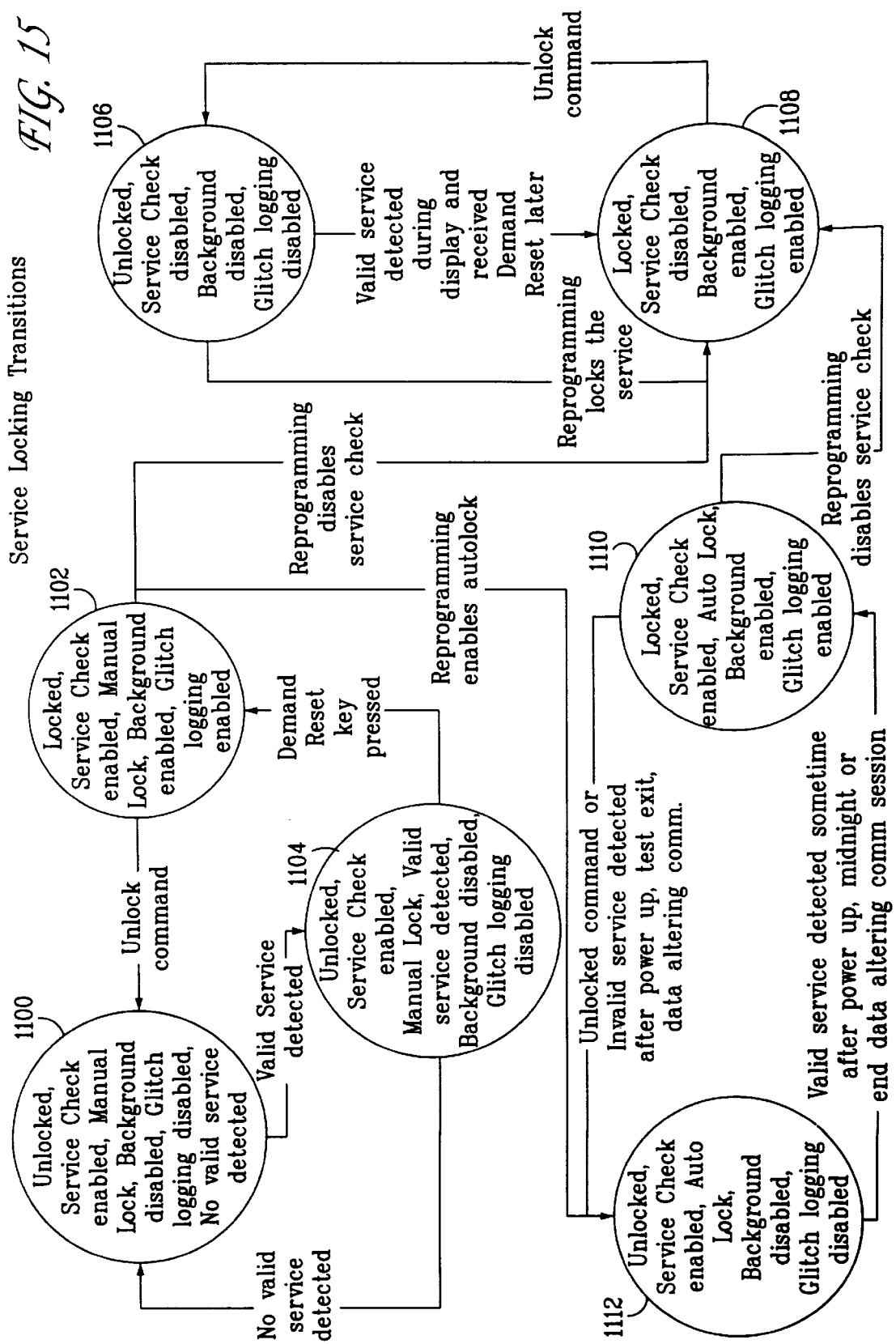
FIG. 15 is a state diagram showing the states for exemplary service lock processing according to the present invention.

FIG. 15 is a state diagram showing the states of the service locking procedure according to the present invention. As shown in FIG. 15, there are basically two states, locked and unlocked, each with a number of conditional state definitions. These conditional definitions may include whether or not the service test is enabled or disabled, whether or not power quality testing is enabled or disabled, whether or not flicker processing is enabled or disabled, whether or not a valid service has been defined, and whether or not manual or autolock is defined. When any of these conditional state definitions change, a transition to a different state is triggered. The receipt of a lock or unlock command may also result in a transition from one state to another.

At state 1100, shown in FIG. 15, the meter is in an unlocked state with service check enabled, manual lock specified, both power quality testing and flicker processing are disabled, and no valid service has yet been identified. Upon detection of a valid service, the state 1100 transitions to state 1104. As is described below, the valid service is preferably displayed on the meter display. If the displayed service is the anticipated or an acceptable service, the meter installer or technician may depress the demand reset key to manual lock the service. If the demand reset key is depressed, the state transitions from state 1104 to state 1102 and this locks the service.

A command to unlock the service is generated. If an unlock command is received while in state 1102, the meter then transitions back to state 1100. The meter may also be reconfigured through programming changes to provide the aforementioned autolock feature. If the meter is in state 1102 and is reconfigured to autolock the service, then the service is unlocked and the meter transitions to state 1112. In this state, if a valid service is defined by the service test, that service is automatically locked and the meter transitions to state 1110. If no valid service is identified or if an unlock command is received while in state 1110, then the meter renns to state 1112.

The service test may be disabled through programming changes. If the service test is disabled while the meter is in state 1102 or state 1110, the meter transitions to state 1108. While in state 1108, the service is locked and only the receipt of an unlock command win trigger a transition to a different state. When an unlock command is received, the meter transitions from state 1108 to state 1106. If the service is then locked via reprogramming, the meter returns to state 1108.

Figure 16:
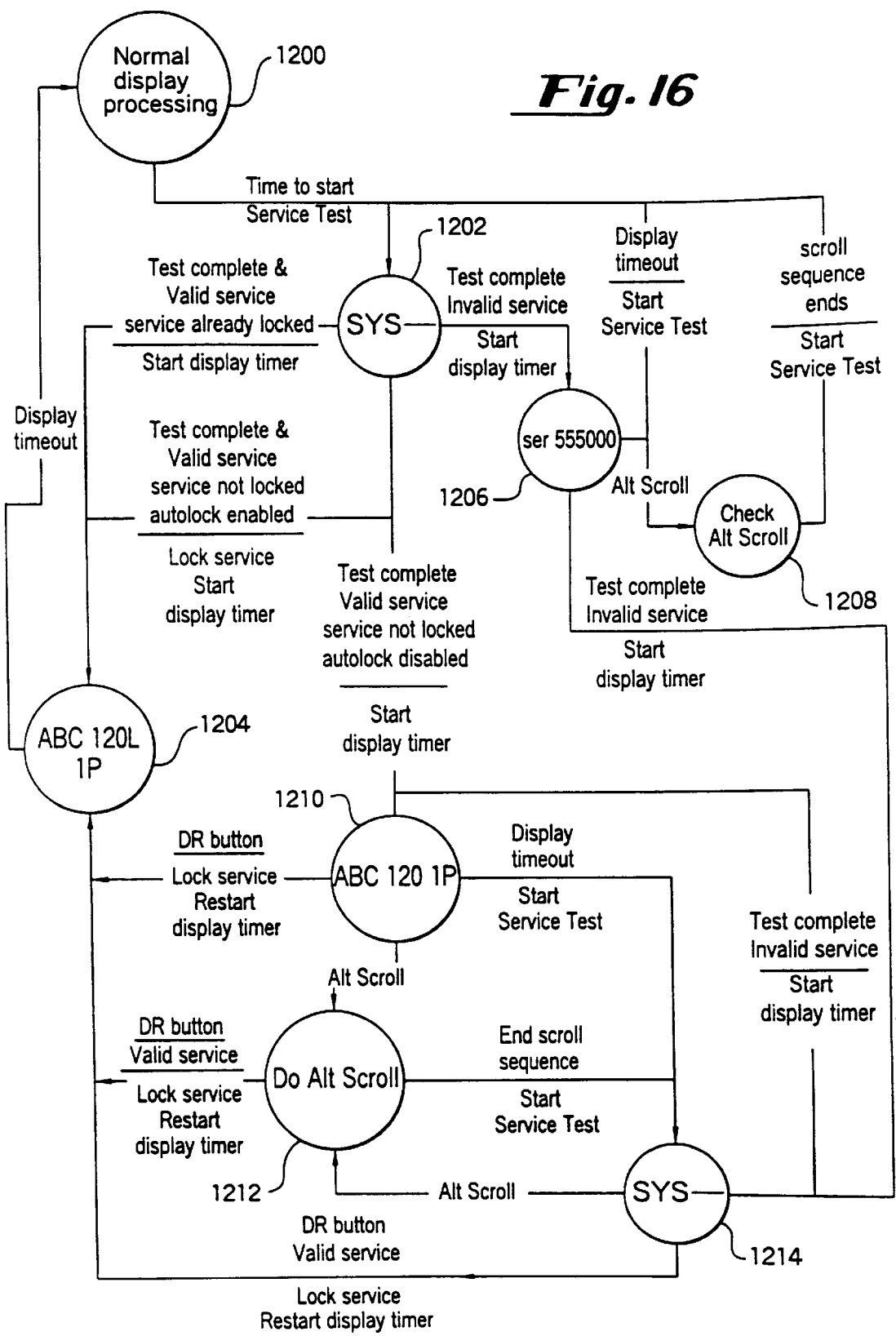
FIG. 16 is a flow diagram of an exemplary service test and display features in accordance with the present invention.

FIG. 16 is a state diagram for an exemplary service test procedure and display processing in accordance with the present invention. As discussed above, various parameters and/or tests may be selected for display in the normal or alternate display modes. Each selected item is measured, tested, etc. and displayed for a predefined period of time. In a preferred embodiment, the items are displayed one at a time in a fixed sequential sequence. Therefore, each item selected for display in the normal mode is sequentially processed and displayed while in the normal display processing state 1200.

If a service test is specified as one of the selected items, a transition to the service test processing state 1202 is made when the service test becomes the current item in the *display sequence. In a preferred embodiment, the meter displays the message "SYS_" on the LCD while in the service test processing state. If a valid service is found and autolocked, the service test procedure transitions to the locked display state 1204 and a display timer is started. In a preferred embodiment, the phase rotation, service voltage, locked status, and service type are displayed for the predefined period of time. As shown in FIG. 16, the phase rotation was "ABC", the service voltage was "120 ", the status "L" indicates that the service was locked, and the service "1P" refers to single phase. When the display timer indicates that the predefined display period has elapsed, i.e., the display timer "times out", the display procedure returns to normal display processing state 1200.

If a valid service is found but manual lock is required, the service test procedure transitions to the display state 1210 and a display timer is started. During the display state 1210, the service may is displayed and may be manually locked by depressing the demand reset button. In a preferred embodiment, the phase rotation, the service voltage, and the service type are displayed on the meter display. If the demand reset button is depressed, the service is locked, and the service test procedure transitions to the locked display state 1204 with an "L" preferably displayed in connection with the service definition. If the displayed service is not locked while in display state 1210 before the display timer times out, the service test procedure transitions to the service test processing state 1214 until a valid service is identified and locked. Once the valid service is locked, i.e., autolock is enabled, the service test procedure transitions from the service test processing state 1214 to the locked display state 1204 and restarts the display timer. If a valid service is identified during the service test processing state 1214, but requires manual locking, then the service test procedure transitions back to the display state 1210.

If no valid service is found while in either service test processing state 1202, 1214, the display timer is started and the service test procedure transitions to the error display state 1206. In a preferred embodiment, the service error code "ser 555000" is displayed and locked on the meter.

If the alternate mode is invoked during the normal display sequence, for example, by depressing the ALT button, the items designated for the alternate display mode are processed and are displayed during the alternate scroll processing states 1208, 1212. If the alternate scroll is invoked after an invalid service determination is made or when the ALT button is depressed before transitioning to the service test processing state 1202, then the service test procedure reinvokes the service test when the last alternate scroll item has been cleared from the display in the alternate scroll processing state 1208. Similarly, if the alternate mode is invoked during the display state 1210 or the service test processing state 1214, the alternate scroll processing state 1212 is entered and completed. At the end of the alternate scroll sequence, the service test may be reinvoked if no prior valid service was identified. However, if a valid service was identified prior to the alternate scroll processing, then service may be locked and the display timer reset.

Another feature of the present invention is the provision of flicker detection and indication capabilities. To this end, it will be recalled that the meter IC 14 provides phase A, phase B, and phase C outputs. These outputs are indicative of the presence of voltage on each of the respective phases. Because meter 10 is intended for a wide range of uses, i.e., capable of use over a wide range of voltages, the voltage levels on phases A, B and C vary from use to use. Accordingly, one aspect of the present invention is the provision of programmable threshold comparators in the meter IC 14. Such comparators can be programmed with the threshold appropriate for a given nominal service voltage. So long as the voltage remains above the programmable threshold voltage, the signals output from the DSP in the meter IC 14 will have a logic level indicating acceptable voltage. Should voltage fall below the threshold level, the output from DSP changes, thereby providing an indication to microcontroller 16.

Figure 17:
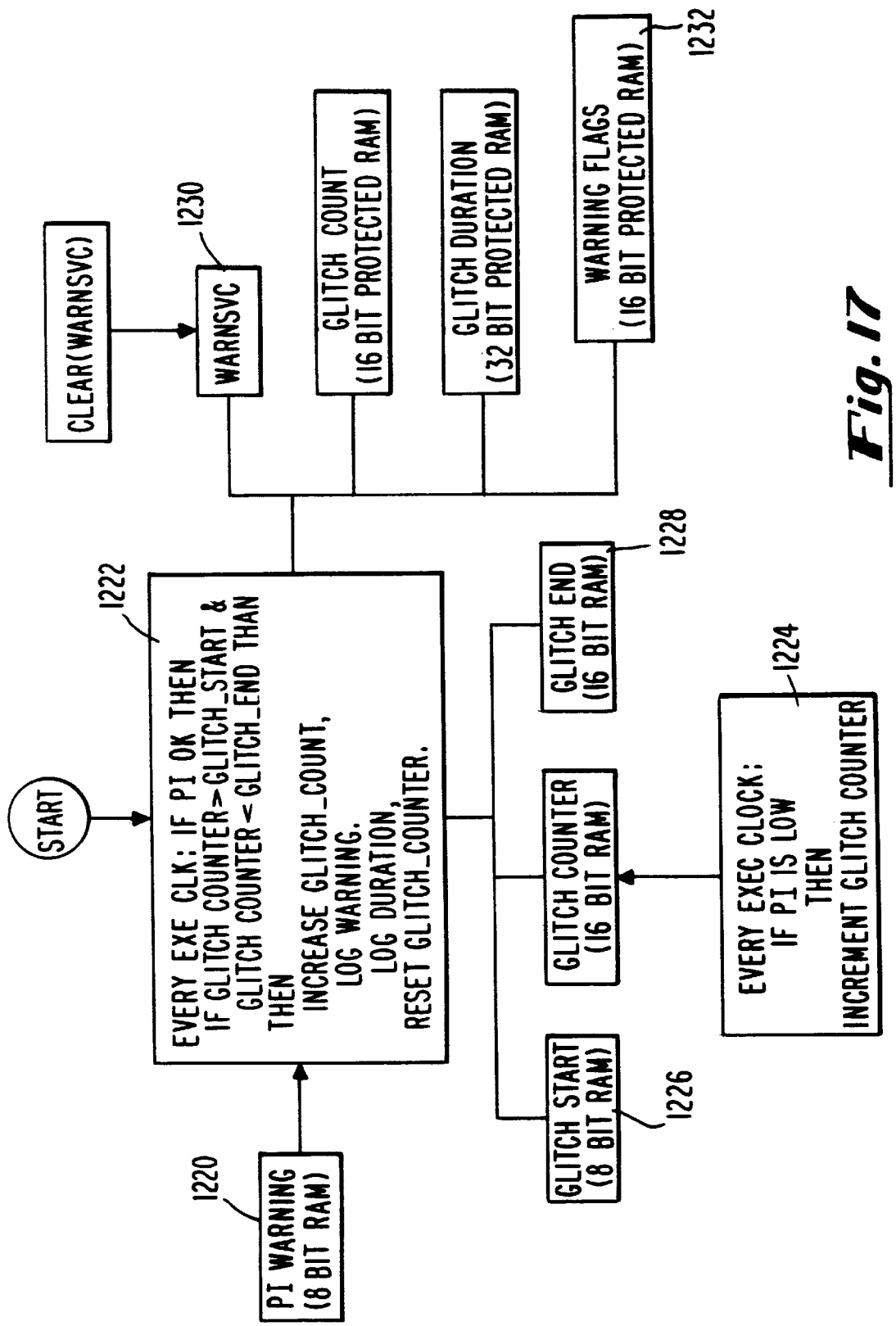
FIG. 17 is a flow diagram of an exemplary flicker determination and display feature in accordance with the present invention.

As shown in FIG. 17, the microcontroller 16 determines at every predetermined period (preferably defined as an executive clock pulse) the status of the phase A, B and C outputs to determine the presence of a "glitch" or "flicker". Flicker will be "announced" by the presence of a potential indicator (PI) Warning at 1220. For every executive clock pulse, a determination is made if flicker is present. If a flicker indication is present, a further determination is made to determine if the flicker indication is indeed flicker and not an actual power outage. To this end, a "glitch counter" is provided and is incremented at 1224 for each consecutive executive clock pulse during which a PI warning was also present. When the PI warning de-asserts, if the glitch counter is above a glitch start value (a minimum duration or number of counts desired for a legitimate glitch or flicker, stored at 1226 and determined at 1222) and less than a glitch end value (a maximum duration or number of counts above which a glitch or flicker is in fact a power outage, stored at 1228 and determined at 1222), a "glitch count" is increased by one, a log warning is generated, and a log duration is generated; i.e., the glitch counter is checked after each flicker episode ends.

Thus, the glitch counter determines the duration of a flicker (e.g., counts the number of clock pulses during which flicker is present), and the glitch count is the number of glitches or flickers that have occurred. Flicker is determined to have occurred when a voltage level drops below a predetermined threshold for a number of clock pulses. The number of clock pulses is between a lower number threshold and an upper number threshold. If the duration or number of clock pulses for which a voltage level drops below the predetermined threshold is less than the lower number threshold or greater than the upper number threshold, it is determined that flicker did not occur. Instead, the time of the event was too short (the duration or number of clock pulses is below the lower number threshold) or too long (the duration or number of clock pulses is above the upper number threshold), and another event, not flicker, such as a power outage, can be registered or logged. This operation can be duplicated for each phase. The lower number threshold preferably can be set as low as 1 count (which corresponds to about 16 msec at 60 Hz), and the upper number threshold preferably can be set as high as 1280 counts (which corresponds to about 512 seconds at 60 Hz). A preferred lower number threshold is the number of clock pulses corresponding to about 30 msec and a preferred upper number threshold is the number of clock pulses corresponding to about 10 seconds. It is contemplated that instead of the lower number threshold and upper number threshold being values of "clock pulses", the lower number threshold and upper number threshold are other measurements of duration, such as "seconds".

In other words, flicker occurs when the measured line voltage for a given phase is below a voltage threshold for at least a minimum sag time but less than a maximum sag time. The voltage threshold is preferably programmable for each service the meter can lock onto. Preferably, the threshold software accepts a voltage threshold percentage and the nominal service voltage. A preferred voltage threshold percentage is a value in the range between about 50% and about 80% of the nominal service voltage. Thus, the voltage threshold is the percentage value of the nominal service voltage. Preferably, a single set of minimum and maximum sag times apply to all services. The voltage threshold and sag times apply to all service phases. It is contemplated that for multiphase service, a different threshold value can be used for each phase.

Once flicker has been determined, a warning and a warning flag are produced at 1230 and 1232. These warnings are used to flash indicators 27, 29 and 31 on LCD (FIG. 1), depending on whether flicker is present on phase A, B, or C. Such warnings are also used to cause the voltages being displayed on display 30 to flash ON and OFF.

A flicker event log preferably stores the phase, date, and time of a predetermined number (e.g., the last 40) flicker events. The flicker event log is preferably stored in a memory, such as the EEPROM 35. Preferably, the time is stored to the nearest second, and multiple flickers occurring on a given phase in the same one second interval are reported as one flicker event. The flicker event log is preserved across power failures. Each flicker log record is either zeros indicating that the record is unused, or contains valid phase, date, and time data. The log is cleared by zeroing it out. In one embodiment, the date and time are in binary coded decimal (BCD), and codes 0, 1, and 2 refer to phases A, B, and C, respectively.

Table 7 shows exemplary meter formulae for use with the present invention.

TABLE 7

Watt formulae $-3\text{:Watts}=K_G(K_A V_{A_0} I_{A_0}+K_B V_{B_1} I_{B_1}+K_C V_{C_2} I_{C_2})$ $-2\text{:Watts}=K_G((K_A V_{A_0}-K_B V_{B_0})I_{A_0}+(K_C V_{C_2}-K_D V_{B_2})I_{C_2})$ $-8\text{:Watts}=K_G(K_A V_{A_0} I_{A_0}-(K_B V_{A_1} I_{B_1}+K_B V_{C_1} I_{B_1})+K_C V_{C_2} I_{C_2})$ $-7\text{:Watts}=K_G(K_A V_{A_0} I_{A_0}-K_B V_{A_0} I_{B_0}+K_C V_{C_2} I_{C_2})$ NOTE: Subscripts refer to the phase of the inputs. Sub-subscripts refer to the A/D cycle in which the sample is taken. Va for -7 applications is actually line to neutral.

VA Formulae $-3\text{:}VA = K_G[(K_A V_{A_0})_{rms} I_{A_0}{}^{rms}+(K_B V_{B_1})_{rms} I_{B_1}{}^{rms}+(K_C V_{C_2})_{rms} I_{C_2}{}^{rms}]$ $-2\text{:}VA = K_G((K_A V_{A_0}-K_B V_{B_0})_{rms} I_{A_0}{}^{rms}+(K_C V_{C_2}-K_D V_{B_2})_{rms} I_{C_2}{}^{rms})$ $-8\text{:}VA = K_G[K_A V_{A_0}{}^{rms} I_{A_0}{}^{rms}-K_B(V_{A_1}+V_{C_1})_{rms} I_{B_1}{}^{rms}+K_C V_{C_2}{}^{rms} I_{C_2}{}^{rms}]$ $-7\text{:}VA = K_G(K_A V_{A_0}{}^{rms} I_{A_0}{}^{rms}+K_B V_{A_0}{}^{rms} I_{B_0}{}^{rms}+K_C V_{C_2}{}^{rms} I_{C_2}{}^{rms})$ RMS measurements are made over one line cycle and preferably begin at the zero crossing of each voltage.

VAR Formula $$VAR = \sqrt{VA_A{}^2-Watt_A{}^2} + \sqrt{VA_B{}^2-Watt_B{}^2} + \sqrt{VA_C{}^2-Watt_C{}^2}$$

where the subscripts are associated with the I terms of Watts and VAs and the calculation is performed every cycle as shown below:

$$-3: VAR = K_G\left(K_A\sqrt{(V_{A_0\text{rms}} I_{A_0\text{rms}})^2 - \left(\sum_{zero}^{cycle} V_{A_0} I_{A_0}\right)^2} + \right.$$

$$K_B\sqrt{(V_{B_1\text{rms}} I_{B_1\text{rms}})^2 - \left(\sum_{zero}^{cycle} V_{B_1} I_{B_1}\right)^2} +$$

$$\left. K_C\sqrt{(V_{C_2\text{rms}} I_{C_2\text{rms}})^2 - \left(\sum_{zero}^{cycle} V_{C_2} I_{C_2}\right)^2}\right)$$

$$-2: VAR =$$

$$K_G\left(\sqrt{((K_A V_{A_0}-K_B V_{B_0})_{rms} I_{A_0\text{rms}})^2 - \left(\sum_{zero}^{cycle} (K_A V_{A_0}-K_B V_{B_0}) I_{A_0}\right)^2} + \right.$$

$$\left.\sqrt{((K_C V_{C_2}-K_D V_{B_2})_{rms} I_{C_2\text{rms}})^2 - \left(\sum_{zero}^{cycle} (K_C V_{C_2}-K_D V_{B_2}) I_{C_2}\right)^2}\right)$$

$$-8: VAR = K_G\left(K_A\sqrt{(V_{A_0\text{rms}} I_{A_0\text{rms}})^2 - \left(\sum_{zero}^{cycle} V_{A_0} I_{A_0}\right)^2} + \right.$$

$$\sqrt{\left(\frac{1}{2}(K_B V_{A_0\text{rms}} + K_D V_{C_2\text{rms}}) I_{B_0\text{rms}}\right)^2 - \left(\sum_{zero}^{cycle} (K_B V_{A_0} I_{B_0} + K_D V_{C_2} I_{B_2})\right)^2} +$$

$$\left. K_C\sqrt{(V_{C_2\text{rms}} I_{C_2\text{rms}})^2 - \left(\sum_{zero}^{cycle} V_{C_2} I_{C_2}\right)^2}\right)$$

$$-7: VAR = K_G\left(K_A\sqrt{(V_{A_0\text{rms}} I_{A_0\text{rms}})^2 - \left(\sum_{zero}^{cycle} V_{A_0} I_{A_0}\right)^2} + \right.$$

$$K_B\sqrt{(V_{A_0\text{rms}} I_{B_0\text{rms}})^2 - \left(\sum_{zero}^{cycle} V_{A_0} I_{B_0}\right)^2} +$$

$$\left. K_C\sqrt{(V_{C_2\text{rms}} I_{C_2\text{rms}})^2 - \left(\sum_{zero}^{cycle} V_{C_2} I_{C_2}\right)^2}\right)$$

For purposes of the above formulae, the following definitions apply:
- -2 means a 2 element in 3 wire delta application;
- -3 means a 3 element in 4 wire wye aplication;
- -8 means a 2½ element in 4 wire wye application;
- -5 means a 2 element in 3 wire delta application; and
- -7 is a 2½ element in 4 wire delta application.

While the invention has been described and illustrated with reference to specific embodiments, those skilled in the art will recognize that modification and variations may be made without departing from the principles of the invention as described hereinabove.

What is claimed is:

1. A system for detecting a flicker in electrical energy provided via a service type to an energy meter having at least one meter element, comprising:
   storage means for storing a respective voltage threshold for each of at least one service type;
   means for measuring a respective phase voltage for each of said meter elements; and
   means for retrieving said voltage threshold for the service type from said storage means and comparing said measured phase voltage to said voltage threshold to determine an occurrence of said flicker.

2. The system according to claim 1, further comprising memory means for recording a duration for said flicker.

3. The system according to claim 2, wherein said storage means and said memory means comprise an EEPROM.

4. The system according to claim 1, wherein said means for measuring comprises a digital signal processor (DSP).

5. The system according to claim 1, wherein said means for retrieving and comparing comprises a microcontroller.

6. The system according to claim 1, furter comprising an indicator and means for activating said indicator responsive to the occurrence of said flicker.

7. The system according to claim 1, further comprising display means for indicating the occurrence of said flicker.

8. The system according to claim 1, wherein said storage means is programmable to change said voltage thresholds.

9. The system according to claim 1, wherein each said voltage threshold is responsive to the service type.

10. The system according to claim 1, wherein the service type is one of single phase and multiphase.

11. The system according to claim 10, wherein said flicker is checked for each phase when the service type is multiphase.

12. The system according to claim 11, wherein each phase of said multiphase service type has a respective voltage threshold.

13. The system according to claim 1, further comprising means for determining a duration of said flicker.

14. The system according to claim 13, wherein said means for determining said duration comprises a counter for counting a number of consecutive clock cycle occurrences of said flicker.

15. The system according to claim 13, wherein when said duration is greater than a first predetermined number and less than a second predetermined number, it is determined that said flicker has occurred, and when said duration is one of not greater than said first predetermined number and not less than said second predetermined number, it is determined that said flicker has not occurred.

16. The system according to claim 15, further comprising a glitch counter that is incremented when it is determined that said flicker has occurred.

17. The system according to claim 15, firther comprising a flicker event log for storing flicker information of said flicker.

18. The system according to claim 17, wherein said information comprises a phase, a date, and a time when said flicker occurred.

19. An electronic processor-implemented process for detecting a flicker in electrical energy provided via a service type to an energy meter having at least one meter element, comprising the steps of:

storing in a first memory a respective voltage threshold for each of at least one service type;

measuring a respective phase voltage for each of said meter elements;

retrieving said voltage threshold for the service type from said memory; and comparing said measured phase voltage to said voltage threshold to determine an occurrence of said flicker.

20. The process according to claim 19, further comprising the step of recording in a second memory a duration for said flicker.

21. The process according to claim 20, wherein said first memory and said second memory comprise an EEPROM.

22. The process according to claim 19, firer comprising the step of activating an alarm responsive to the occurrence of said flicker.

23. The process according to claim 19, fuirther comprising the step of displaying an indication indicating the occurrence of said flicker.

24. The process according to claim 19, wherein the service type single phase.

25. The process according to claim 24, wherein the service type multiphase, and further comprising the step of checking each phase of a multiphase service type.

26. The process according to claim 25, wherein each phase of said multiphase service tppe has a respective voltage threshold.

27. The process according to claim 19, further comprising the step of determining a duration of said flicker.

28. The process according to claim 27, further comprising the steps of determining that said flicker has occurred when said duration is greater than a first predetermined number and less than a second predetermined number, and determining that said flicker has not occurred when said duration is one of not greater than said first predetermined number and not less than said second predetermined number.

29. The process according to claim 28, further comprising the step of incrementing a glitch counter when it is determined that said flicker has occurred.

30. The process according to claim 29, further comprising the step of storing flicker information in a flicker event log when it is determined that said flicker has occurred.

31. The process according to claim 27, wherein said step of determining said duration of said flicker comprises counting a number of consecutive clock cycle occurrences of said flicker.

32. The process according to claim 31, further comprising the steps of determining that said flicker has occurred when said number of consecutive clock cycle occurrences greater than a first predetermined number and less than a second predetermined number, and determining that said flicker has not occurred when said number is one of not greater than said first predetermined number and not less than said second predetermined number.

33. The process according to claim 32, further comprising the step of incrementing a glitch counter when it is determined that said flicker has occurred.

34. The process according to claim 33, further comprising the step of storing flicker information in a flicker event log when it is determined that said flicker has occurred.

* * * * *

UNITED STATES PATENT AND TRADEMARK OFFICE
CERTIFICATE OF CORRECTION

PATENT NO. : 6,269,316 B1
DATED : July 31, 2001
INVENTOR(S) : Vick A. Hubbard et al.

It is certified that error appears in the above-identified patent and that said Letters Patent is hereby corrected as shown below:

Column 4,
Line 42, "AID" should read -- A/D --

Column 11,
Line 60, "performiing" should read -- performing --

Column 35,
Line 4, "100 = 2500 = $05dc" should read -- 100 = 1500 = $05dc --

Column 37,
Line 2, "voltagetest" should read -- voltage_test --

Column 39,
Line 2, "miinimnum" should read -- minimum --

Column 42,
Line 50, "30" should be inserted before (FIG. 1) so that the text reads -- LCD 30 (FIG.1), --

Column 43,
Line 32, the equation should read:

$$-- VAR = \sqrt{VA_A^2 - Watt_A^2} + \sqrt{VA_B^2 - Watt_B^2} + \sqrt{VA_C^2 - Watt_C^2} \; --$$

Column 44,
Lines 1 through 15, each occurrence of $$\sum_{zero}^{cycle} \quad \text{should read} \quad \sum_{zero}^{cycle}$$

UNITED STATES PATENT AND TRADEMARK OFFICE
CERTIFICATE OF CORRECTION

PATENT NO. : 6,269,316 B1
DATED : July 31, 2001
INVENTOR(S) : Vick A. Hubbard et al.

It is certified that error appears in the above-identified patent and that said Letters Patent is hereby corrected as shown below:

<u>Column 46, claim 26,</u>
Line 7, "tppe" should read -- type --

Signed and Sealed this

Sixteenth Day of April, 2002

Attest:

JAMES E. ROGAN
*Director of the United States Patent and Trademark Office*

*Attesting Officer*